US012267836B2

(12) United States Patent
Kutz et al.

(10) Patent No.: US 12,267,836 B2
(45) Date of Patent: Apr. 1, 2025

(54) TECHNIQUES FOR BANDWIDTH-LIMITED ENVELOPE TRACKING USING DIGITAL POST DISTORTION

(71) Applicant: QUALCOMM Incorporated, San Diego, CA (US)

(72) Inventors: Gideon Shlomo Kutz, Ramat Hasharon (IL); Assaf Touboul, Netanya (IL); Yaron Laufer, Givat Shmuel (IL); Tal Oved, Modiin (IL); Elad Meir, Ramat Gan (IL)

(73) Assignee: QUALCOMM Incorporated, San Diego, CA (US)

( * ) Notice: Subject to any disclaimer, the term of this patent is extended or adjusted under 35 U.S.C. 154(b) by 762 days.

(21) Appl. No.: 17/479,694

(22) Filed: Sep. 20, 2021

(65) Prior Publication Data

US 2023/0091116 A1   Mar. 23, 2023

(51) Int. Cl.
*H04W 72/21* (2023.01)
(52) U.S. Cl.
CPC .................................. *H04W 72/21* (2023.01)
(58) Field of Classification Search
None
See application file for complete search history.

(56) References Cited

U.S. PATENT DOCUMENTS

| 10,128,798 | B2* | 11/2018 | Duncan | H03F 3/195 |
|---|---|---|---|---|
| 10,778,345 | B2* | 9/2020 | El-Hassan | H04L 5/001 |
| 11,909,358 | B1* | 2/2024 | Perreault | H03F 3/211 |
| 2005/0032472 | A1* | 2/2005 | Jiang | H04B 1/0475 |
| | | | | 455/13.4 |
| 2006/0209984 | A1* | 9/2006 | Kenington | H03F 1/0222 |
| | | | | 375/297 |
| 2009/0232510 | A1* | 9/2009 | Gupta | H04L 27/2096 |
| | | | | 375/296 |
| 2009/0252255 | A1* | 10/2009 | Lee | H04L 27/361 |
| | | | | 375/297 |
| 2011/0050337 | A1* | 3/2011 | Ito | H03G 3/004 |
| | | | | 330/127 |
| 2012/0269240 | A1* | 10/2012 | Balteanu | H03F 1/02 |
| | | | | 375/297 |

(Continued)

*Primary Examiner* — Michael J Moore, Jr.
*Assistant Examiner* — Gautam Sharma
(74) *Attorney, Agent, or Firm* — Holland & Hart LLP

(57) ABSTRACT

Methods, systems, and devices for wireless communications are described. A user equipment (UE) may transmit a capability message indicating a capability of the UE to perform bandwidth-limited envelope tracking or a capability of the UE to compensate for bandwidth-limited envelope tracking distortion. The UE may receive a request for the UE to activate bandwidth-limited envelope tracking or a request for the UE to compensate for bandwidth-limited envelope tracking distortion. In some examples, the UE may transmit an uplink message using a bandwidth-limited envelope tracking configuration. In other examples, the UE may receive a downlink message and use digital post distortion (DPoD) to correct bandwidth-limited envelope tracking distortions in the downlink message. Aspects of the present disclosure may enable the UE to use bandwidth-limited envelope tracking and DPoD for wideband signal transmissions, which may result in lower power consumption at the UE.

30 Claims, 22 Drawing Sheets

(56) References Cited

U.S. PATENT DOCUMENTS

| | | | |
|---|---|---|---|
| 2014/0155116 A1* | 6/2014 | Dakshinamurthy | ............................ H04W 52/0251 455/522 |
| 2014/0187182 A1* | 7/2014 | Yan | ....................... H03F 1/3247 455/115.1 |
| 2015/0049843 A1* | 2/2015 | Reuven | ................ H04B 1/0475 375/296 |
| 2016/0095055 A1 | 3/2016 | Sarrigeorgidis et al. | |
| 2016/0126903 A1* | 5/2016 | Abdelrahman | ............ H03F 3/19 330/149 |
| 2017/0141736 A1* | 5/2017 | Pratt | ......................... H03F 3/19 |
| 2018/0167091 A1* | 6/2018 | Pratt | .................... H04B 1/0483 |
| 2018/0316450 A1* | 11/2018 | Rico Alvarino | ..... H04J 11/0056 |
| 2018/0368065 A1* | 12/2018 | Sarkas | .............. H04W 52/0225 |
| 2019/0044481 A1* | 2/2019 | Scuderi | ...................... H03F 3/72 |
| 2019/0190552 A1* | 6/2019 | Sagi | .................... H04L 25/0226 |
| 2019/0238108 A1* | 8/2019 | Wong | .................... H03F 1/0211 |
| 2021/0175858 A1* | 6/2021 | Su | ......................... H04B 1/0475 |
| 2021/0235258 A1* | 7/2021 | Takeda | .................. H04W 72/53 |
| 2021/0344367 A1* | 11/2021 | Wolf | ....................... H04W 8/24 |

\* cited by examiner

TECHNIQUES FOR BANDWIDTH-LIMITED ENVELOPE TRACKING USING DIGITAL POST DISTORTION

FIELD OF TECHNOLOGY

The following relates to wireless communications, including techniques for bandwidth-limited envelope tracking using digital post distortion (DPoD).

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

In some wireless communications systems, a communication device (e.g., a UE or a base station) may use a power amplifier (PA) to amplify and transmit signals. The PA may consume a relatively large amount of power while amplifying and transmitting the signals. In some cases, the communication device may use envelope tracking to improve the power efficiency of the PA. However, conventional envelope tracking techniques may not be suitable for wideband signal transmissions.

SUMMARY

The described techniques relate to improved methods, systems, devices, and apparatuses that support techniques for bandwidth-limited envelope tracking using digital post distortion (DPoD). Generally, the described techniques provide for configuring a user equipment (UE) to use bandwidth-limited envelope tracking and DPoD for wideband signal transmissions. A UE may transmit a capability message indicating a capability of the UE to perform bandwidth-limited envelope tracking or a capability of the UE to compensate for bandwidth-limited envelope tracking distortion. The UE may receive a request for the UE to activate bandwidth-limited envelope tracking or a request for the UE to correct bandwidth-limited envelope tracking distortion. In some examples, the UE may transmit an uplink message using a bandwidth-limited envelope tracking configuration. In other examples, the UE may receive a downlink message and use DPoD to correct bandwidth-limited envelope tracking distortions in the downlink message. Aspects of the present disclosure may enable the UE to use bandwidth-limited envelope tracking and DPoD for wideband signal transmissions, which may result in lower power consumption at the UE.

A method for wireless communications at a UE is described. The method may include transmitting, to a base station, a capability message indicating a capability of the UE to perform envelope tracking, and further indicating an envelope tracking configuration to be used for transmission of an uplink message, receiving, from the base station and based on the capability message, a request for the UE to activate the envelope tracking, and transmitting, to the base station and based on the request, the uplink message in accordance with the envelope tracking configuration.

An apparatus for wireless communications at a UE is described. The apparatus may include a processor, memory coupled with the processor, and instructions stored in the memory. The instructions may be executable by the processor to cause the apparatus to transmit, to a base station, a capability message indicating a capability of the UE to perform envelope tracking, and further indicating an envelope tracking configuration to be used for transmission of an uplink message, receive, from the base station and based on the capability message, a request for the UE to activate the envelope tracking, and transmit, to the base station and based on the request, the uplink message in accordance with the envelope tracking configuration.

Another apparatus for wireless communications at a UE is described. The apparatus may include means for transmitting, to a base station, a capability message indicating a capability of the UE to perform envelope tracking, and further indicating an envelope tracking configuration to be used for transmission of an uplink message, means for receiving, from the base station and based on the capability message, a request for the UE to activate the envelope tracking, and means for transmitting, to the base station and based on the request, the uplink message in accordance with the envelope tracking configuration.

A non-transitory computer-readable medium storing code for wireless communications at a UE is described. Tc code may include instructions executable by a processor to transmit, to a base station, a capability message indicating a capability of the UE to perform envelope tracking, and further indicating an envelope tracking configuration to be used for transmission of an uplink message, receive, from the base station and based on the capability message, a request for the UE to activate the envelope tracking, and transmit, to the base station and based on the request, the uplink message in accordance with the envelope tracking configuration.

In some examples of the method, apparatuses, and non-transitory computer-readable medium described herein, transmitting the capability message may include operations, features, means, or instructions for transmitting the capability message indicating the capability of the UE to perform the envelope tracking that may be bandwidth-limited envelope tracking, and further indicating a capability of the UE to use an extended bandwidth that may be larger than a bandwidth supported for the bandwidth-limited envelope tracking.

In some examples of the method, apparatuses, and non-transitory computer-readable medium described herein, transmitting the capability message may include operations, features, means, or instructions for transmitting the capability message indicating the envelope tracking configuration that identifies a low pass filter (LPF) response, a backoff parameter, a power amplifier (PA) response, or a combination thereof.

Some examples of the method, apparatuses, and non-transitory computer-readable medium described herein may further include operations, features, means, or instructions for transmitting the capability message indicating the envelope tracking configuration that identifies a set of LPF responses, where the set of LPF responses may be preconfigured or associated with multiple bandwidths to be used for the envelope tracking, and receiving the request indicating a LPF response from the set of LPF responses to use for generation of the uplink message.

Some examples of the method, apparatuses, and non-transitory computer-readable medium described herein may further include operations, features, means, or instructions for receiving, from the base station, control signaling indicating an uplink resource allocation to be used for transmission of the uplink message, a modulation and coding scheme (MCS) to be used for transmission of the uplink message, or both, where transmitting the uplink message to the base station may be based on the control signaling.

Some examples of the method, apparatuses, and non-transitory computer-readable medium described herein may further include operations, features, means, or instructions for receiving control signaling indicating a backoff parameter per MCS and transmitting, based on the control signaling, the uplink message in accordance with the backoff parameter per MCS.

In some examples of the method, apparatuses, and non-transitory computer-readable medium described herein, transmitting the capability message may include operations, features, means, or instructions for transmitting the capability message indicating the envelope tracking configuration that identifies a PA response as a function of a LPF response and a backoff parameter.

Some examples of the method, apparatuses, and non-transitory computer-readable medium described herein may further include operations, features, means, or instructions for transmitting one or more reference signals to the base station in a same bandwidth as used for transmission of the uplink message.

Some examples of the method, apparatuses, and non-transitory computer-readable medium described herein may further include operations, features, means, or instructions for generating an input signal associated with the uplink message, filtering the input signal using a LPF, generating a filtered envelope response based on performing an envelope extraction procedure on the filtered input signal, and performing a power amplification procedure on a signal envelope of the input signal or on a combination of the filtered envelope response and a backoff parameter, where transmitting the uplink message may be based on performing the power amplification procedure.

A method for wireless communications at a base station is described. The method may include receiving, from a UE, a capability message indicating a capability of the UE to perform envelope tracking, and further indicating an envelope tracking configuration to be used for transmission of an uplink message, transmitting, to the UE and based on the capability message, a request for the UE to activate the envelope tracking, and receiving, from the UE and based on the request, the uplink message in accordance with the envelope tracking configuration.

An apparatus for wireless communications at a base station is described. The apparatus may include a processor, memory coupled with the processor, and instructions stored in the memory. The instructions may be executable by the processor to cause the apparatus to receive, from a UE, a capability message indicating a capability of the UE to perform envelope tracking, and further indicating an envelope tracking configuration to be used for transmission of an uplink message, transmit, to the UE and based on the capability message, a request for the UE to activate the envelope tracking, and receive, from the UE and based on the request, the uplink message in accordance with the envelope tracking configuration.

Another apparatus for wireless communications at a base station is described. The apparatus may include means for receiving, from a UE, a capability message indicating a capability of the UE to perform envelope tracking, and further indicating an envelope tracking configuration to be used for transmission of an uplink message, means for transmitting, to the UE and based on the capability message, a request for the UE to activate the envelope tracking, and means for receiving, from the UE and based on the request, the uplink message in accordance with the envelope tracking configuration.

A non-transitory computer-readable medium storing code for wireless communications at a base station is described. The code may include instructions executable by a processor to receive, from a UE, a capability message indicating a capability of the UE to perform envelope tracking, and further indicating an envelope tracking configuration to be used for transmission of an uplink message, transmit, to the UE and based on the capability message, a request for the UE to activate the envelope tracking, and receive, from the UE and based on the request, the uplink message in accordance with the envelope tracking configuration.

Some examples of the method, apparatuses, and non-transitory computer-readable medium described herein may further include operations, features, means, or instructions for decoding the uplink message using a distortion correcting algorithm that may be configured based on the envelope tracking configuration.

Some examples of the method, apparatuses, and non-transitory computer-readable medium described herein may further include operations, features, means, or instructions for receiving one or more reference signals from the UE, generating a PA model based on the one or more reference signals, and decoding the uplink message using the PA model.

Some examples of the method, apparatuses, and non-transitory computer-readable medium described herein may further include operations, features, means, or instructions for receiving an input signal that includes the uplink message, performing one or more of a fast Fourier transform (FFT), a cyclic prefix (CP) removal procedure, a slicing procedure, an inverse FFT (IFFT), or a CP addition procedure on the input signal, and generating a first distortion parameter and a second distortion parameter based on inputting the input signal to the PA model, where decoding the uplink message may be based on the first distortion parameter and the second distortion parameter.

A method for wireless communications at a UE is described. The method may include transmitting, to a base station, a capability message indicating a capability of the UE to compensate for envelope tracking distortion, receiving, from the base station and based on the capability message, control signaling indicating an envelope tracking configuration to be used for transmission of a downlink message, the envelope tracking configuration indicating multiplexing information associated with one or more other UEs, and receiving the downlink message from the base station in accordance with the envelope tracking configuration.

An apparatus for wireless communications at a UE is described. The apparatus may include a processor, memory coupled with the processor, and instructions stored in the memory. The instructions may be executable by the processor to cause the apparatus to transmit, to a base station, a capability message indicating a capability of the UE to compensate for envelope tracking distortion, receive, from the base station and based on the capability message, control signaling indicating an envelope tracking configuration to be used for transmission of a downlink message, the envelope tracking configuration indicating multiplexing information associated with one or more other UEs, and receive the downlink message from the base station in accordance with the envelope tracking configuration.

Another apparatus for wireless communications at a UE is described. The apparatus may include means for transmitting, to a base station, a capability message indicating a capability of the UE to compensate for envelope tracking distortion, means for receiving, from the base station and based on the capability message, control signaling indicating an envelope tracking configuration to be used for transmission of a downlink message, the envelope tracking configuration indicating multiplexing information associated with one or more other UEs, and means for receiving the downlink message from the base station in accordance with the envelope tracking configuration.

A non-transitory computer-readable medium storing code for wireless communications at a UE is described. The code may include instructions executable by a processor to transmit, to a base station, a capability message indicating a capability of the UE to compensate for envelope tracking distortion, receive, from the base station and based on the capability message, control signaling indicating an envelope tracking configuration to be used for transmission of a downlink message, the envelope tracking configuration indicating multiplexing information associated with one or more other UEs, and receive the downlink message from the base station in accordance with the envelope tracking configuration.

Some examples of the method, apparatuses, and non-transitory computer-readable medium described herein may further include operations, features, means, or instructions for receiving, from the base station and based on the capability message, a request for the UE to compensate for bandwidth-limited envelope tracking distortion.

In some examples of the method, apparatuses, and non-transitory computer-readable medium described herein, receiving the control signaling may include operations, features, means, or instructions for receiving, from the base station, the control signaling indicating a downlink resource allocation to be used for transmission of the downlink message, an MCS to be used for transmission of the downlink message, a bandwidth to be used for transmission of the downlink message, or a combination thereof, where receiving the downlink message from the base station may be based on the control signaling.

In some examples of the method, apparatuses, and non-transitory computer-readable medium described herein, receiving the control signaling may include operations, features, means, or instructions for receiving, from the base station, the control signaling indicating the envelope tracking configuration that identifies compensation to be applied for bandwidth-limited envelope tracking distortion for one or more MCSs, for one or more bandwidths, for one or more resource allocations, or any combination thereof.

Some examples of the method, apparatuses, and non-transitory computer-readable medium described herein may further include operations, features, means, or instructions for decoding the downlink message using a distortion correcting algorithm that may be configured based on the envelope tracking configuration.

Some examples of the method, apparatuses, and non-transitory computer-readable medium described herein may further include operations, features, means, or instructions for transmitting the capability message indicating the capability of the UE to compensate for the envelope tracking distortion using bandwidth-limited envelope tracking distortion resulting from transmission of the downlink message over an extended bandwidth, the capability message further indicating a set of backoff parameters, receiving, from the base station, the control signaling indicating a first request for the UE to compensate for the bandwidth-limited envelope tracking distortion resulting from transmission of the downlink message over the extended bandwidth, and a second request for the UE to compensate for the bandwidth-limited envelope tracking distortion using a backoff parameter from the set of backoff parameters, and decoding the downlink message received over the extended bandwidth in accordance with the control signaling.

Some examples of the method, apparatuses, and non-transitory computer-readable medium described herein may further include operations, features, means, or instructions for transmitting the capability message indicating a set of LPF responses, where the set of LPF responses may be preconfigured or associated with a set of multiple bandwidths to be used for transmission of the downlink message and receiving, from the base station, the control signaling indicating a LPF response from the set of LPF responses being used for generation of the downlink message.

In some examples of the method, apparatuses, and non-transitory computer-readable medium described herein, receiving the control signaling may include operations, features, means, or instructions for receiving the control signaling indicating the envelope tracking configuration that identifies a PA response as a function of a LPF response and a backoff parameter.

Some examples of the method, apparatuses, and non-transitory computer-readable medium described herein may further include operations, features, means, or instructions for receiving one or more reference signals from the base station, generating a PA model based on the one or more reference signals, and decoding the downlink message using the PA model.

Some examples of the method, apparatuses, and non-transitory computer-readable medium described herein may further include operations, features, means, or instructions for receiving an input signal that includes the downlink message, performing one or more of an FFT, a CP removal procedure, a slicing procedure for each UE of the one or more other UEs, an IFFT, or a CP addition procedure on the input signal, and generating a first distortion parameter and a second distortion parameter based on inputting the input signal to the PA model, where decoding the downlink message may be based on the first distortion parameter and the second distortion parameter.

Some examples of the method, apparatuses, and non-transitory computer-readable medium described herein may further include operations, features, means, or instructions for transmitting, to the base station and based on the capability of the UE to compensate for the envelope tracking distortion, a request that indicates a backoff parameter being used for transmission of the downlink message, a backoff parameter per MCS, or both, where receiving the downlink message may be based on the request.

A method for wireless communications at a base station is described. The method may include receiving, from a UE, a capability message indicating a capability of the UE to compensate for envelope tracking distortion, transmitting, to the UE and based on the capability message, control signaling indicating an envelope tracking configuration to be used for transmission of a downlink message, the envelope tracking configuration indicating multiplexing information associated with one or more other UEs, and transmitting the downlink message to the UE in accordance with the envelope tracking configuration.

An apparatus for wireless communications at a base station is described. The apparatus may include a processor, memory coupled with the processor, and instructions stored in the memory. The instructions may be executable by the processor to cause the apparatus to receive, from a UE, a capability message indicating a capability of the UE to compensate for envelope tracking distortion, transmit, to the UE and based on the capability message, control signaling indicating an envelope tracking configuration to be used for transmission of a downlink message, the envelope tracking configuration indicating multiplexing information associated with one or more other UEs, and transmit the downlink message to the UE in accordance with the envelope tracking configuration.

Another apparatus for wireless communications at a base station is described. The apparatus may include means for receiving, from a UE, a capability message indicating a capability of the UE to compensate for envelope tracking distortion, means for transmitting, to the UE and based on the capability message, control signaling indicating an envelope tracking configuration to be used for transmission of a downlink message, the envelope tracking configuration indicating multiplexing information associated with one or more other UEs, and means for transmitting the downlink message to the UE in accordance with the envelope tracking configuration.

A non-transitory computer-readable medium storing code for wireless communications at a base station is described. The code may include instructions executable by a processor to receive, from a UE, a capability message indicating a capability of the UE to compensate for envelope tracking distortion, transmit, to the UE and based on the capability message, control signaling indicating an envelope tracking configuration to be used for transmission of a downlink message, the envelope tracking configuration indicating multiplexing information associated with one or more other UEs, and transmit the downlink message to the UE in accordance with the envelope tracking configuration.

In some examples of the method, apparatuses, and non-transitory computer-readable medium described herein, transmitting the control signaling may include operations, features, means, or instructions for transmitting the control signaling indicating the envelope tracking configuration that identifies frequency division multiplexing (FDM) information associated with the one or more other UEs, a backoff parameter, a LPF response, a PA response, or a combination thereof.

In some examples of the method, apparatuses, and non-transitory computer-readable medium described herein, the frequency division multiplexing information indicates a frequency allocation for each UE of the one or more other UEs, an MCS for each UE of the one or more other UEs, reference signal information for each UE of the one or more other UEs, or a combination thereof.

Some examples of the method, apparatuses, and non-transitory computer-readable medium described herein may further include operations, features, means, or instructions for transmitting one or more downlink messages to the one or more other UEs in accordance with the FDM information, where the one or more downlink messages may be FDM-ed with the downlink message.

Some examples of the method, apparatuses, and non-transitory computer-readable medium described herein may further include operations, features, means, or instructions for generating an input signal based on FDM-ing the one or more downlink messages with the downlink message, filtering the input signal using a LPF, generating a filtered envelope response based on performing an envelope extraction procedure on the filtered input signal, and performing a power amplification procedure on an instantaneous signal envelope of the input signal or on a combination of the filtered envelope response and a backoff parameter, where transmitting the one or more downlink messages and the downlink message may be based on performing the power amplification procedure.

In some examples of the method, apparatuses, and non-transitory computer-readable medium described herein, transmitting the control signaling may include operations, features, means, or instructions for transmitting the control signaling indicating the envelope tracking configuration that identifies a backoff parameter corresponding to an MCS used for transmission of the one or more downlink messages or the downlink message, a weighted average backoff parameter corresponding to a bandwidth used for transmission of the one or more downlink messages or the downlink message, a backoff parameter that may be specific to an MCS of the UE, or a combination thereof.

DETAILED DESCRIPTION

Figure 1:
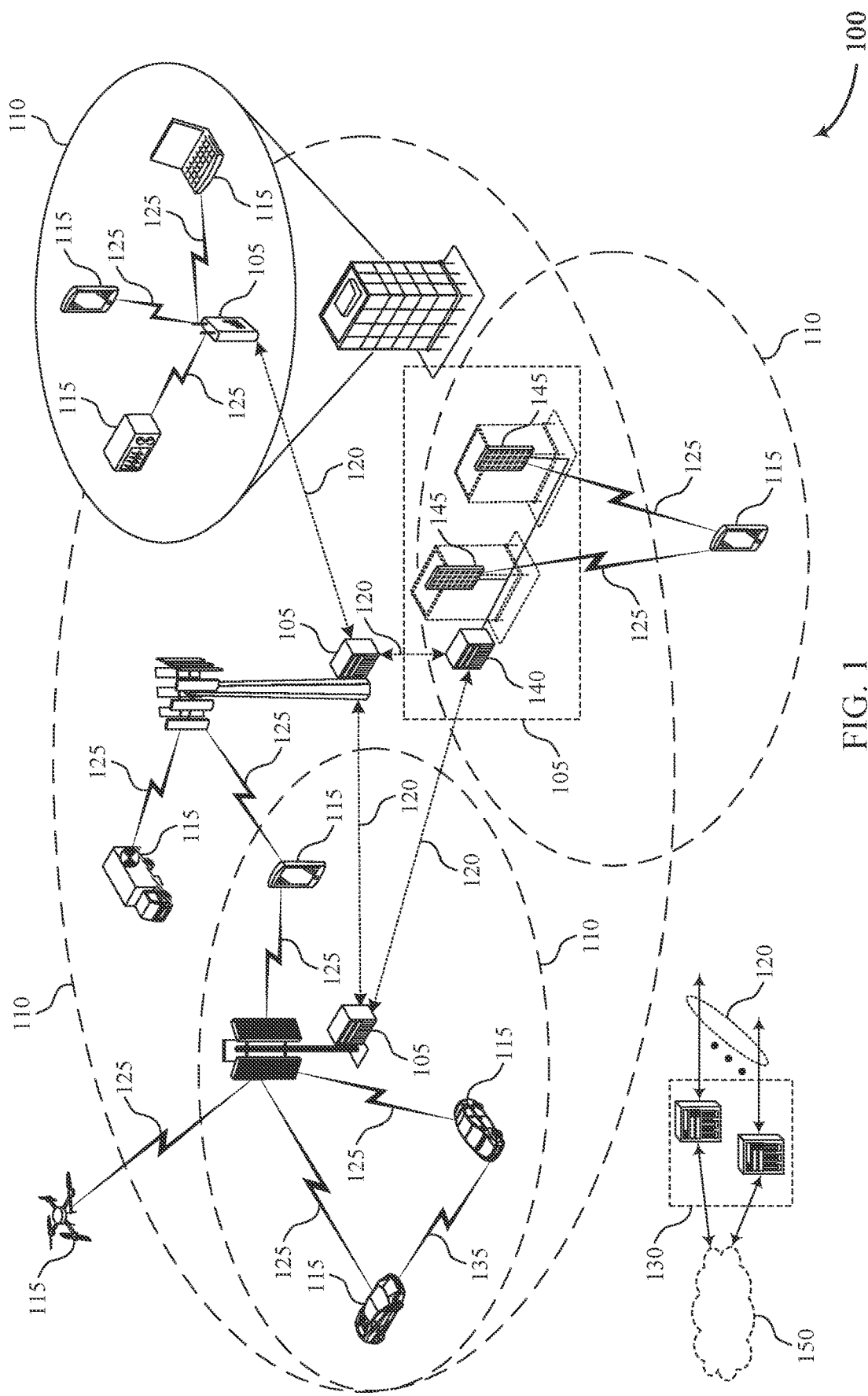
FIGS. 1 through 3 illustrate examples of wireless communications systems that support techniques for bandwidth-limited envelope tracking using digital post distortion (DPoD) in accordance with aspects of the present disclosure.

In some wireless communications systems, a communication device (e.g., a UE or a base station) may use a power amplifier (PA) to amplify and transmit signals. The PA may consume a relatively large amount of power while amplifying and transmitting the signals. In some cases, the communication device may use envelope tracking to improve the power efficiency of the PA. Envelope tracking may refer to a technique for dynamically adjusting the amount of power supplied to the PA based on a signal envelope (e.g., an instantaneous amplitude or magnitude of a signal). In comparison to supplying constant power to the PA during operations, envelope tracking may result in lower power consumption at the communication device.

In some cases, however, conventional envelope tracking techniques may be applicable to small bandwidth channels (e.g., due to hardware and circuitry limitations at the communication device). For larger bandwidth channels and wideband signal transmissions, envelope tracking may cause signal distortions, which may degrade communication reliability at the communication device. As such, conventional envelope tracking techniques may not be suitable for large bandwidth channels used in some wireless communications systems that support new radio (NR) technologies.

Aspects of the present disclosure may enable a communication device to use bandwidth-limited envelope tracking (e.g., envelope tracking within a constrained bandwidth) for wideband signal transmissions. Specifically, the described techniques may provide for using bandwidth-limited envelope tracking in combination with digital post distortion (DPoD). For example, if a first communication device (e.g., a base station or a UE) transmits a wideband signal using bandwidth-limited envelope tracking, a second communication device (e.g., a base station or a UE) may receive the wideband signal and use DPoD to correct any distortions caused by the bandwidth-limited envelope tracking.

The first communication device may use an envelope tracking configuration to perform the bandwidth-limited envelope tracking. This envelope tracking configuration may include a low pass filter (LPF) response, a PA response, and a backoff parameter, among other parameters. The first communication device may transmit an indication of the envelope tracking configuration to the second communication device such that the second communication device can use the envelope tracking configuration to perform DPoD. Specifically, the second communication device may use the envelope tracking configuration of the first communication device to generate an equivalent PA model, which may enable the second communication device to accurately reconstruct the wideband signal (e.g., correct any distortions caused by the bandwidth-limited envelope tracking).

If, for example, the first communication device is a base station, the indication of the envelope tracking communication may also include multiplexing information related to other communication devices (e.g., UEs). Specifically, if the first communication device multiplexes (e.g., using frequency division multiplexing (FDM)) the wideband signal with transmissions to other communication devices, the indication of the envelope tracking configuration may include multiplexing information related to the other communication devices. The second communication device may use this multiplexing information to accurately decode the wideband signal from the first communication device.

Aspects of the disclosure are initially described in the context of wireless communications systems, power amplification schemes, transmission schemes, reception schemes, and process flows. Aspects of the disclosure are further illustrated by and described with reference to diagrams and flowcharts that relate to techniques for bandwidth-limited envelope tracking using DPoD.

FIG. 1 illustrates an example of a wireless communications system 100 that supports techniques for bandwidth-limited envelope tracking using DPoD in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency (RF) spectrum resources having a defined physical layer structure for supporting the communication links 125. For example, a carrier used for a communication link 125 may include a portion of an RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the RF spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal FDM (OFDM) or discrete Fourier transform spread OFDM (DFT-S-OFDM)). In a system employing MCM techniques, a resource element may include one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of an RF spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix (CP). A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the CP prepended to each symbol period). In some wireless communications systems, a slot may further be divided into multiple mini-slots containing one or more symbols. Excluding the CP, each symbol period may contain one or more (e.g., $N_f$) sampling periods.

The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, FDM techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include one or more control plane entities that manages access and mobility (e.g., a mobility management entity (MME), an access and mobility management function (AMF)) and one or more user plane entities that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands in the range of 300 megahertz (MHz) to 300 gigahertz (GHz). The region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed RF spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

Some cellular networks may employ OFDMA. OFDMA has many advantages, such as enabling simple channel estimation at the receiver and flexibly utilizing available time and frequency resources, among other examples. However, OFDMA may be associated with high signal peak to average power ratio (PAPR) compared to single carrier techniques. Some wireless communications systems may support higher constellations (e.g., 256 quadrature amplitude modulation (QAM), 1024 QAM). The combination of high PAPR signals and high signal quality (e.g., low error vector magnitude (EVM)) associated with these higher modulations leads to inefficient utilization of PAs. This may result in high power consumption of PAs and lower power efficiency.

Figure 2:
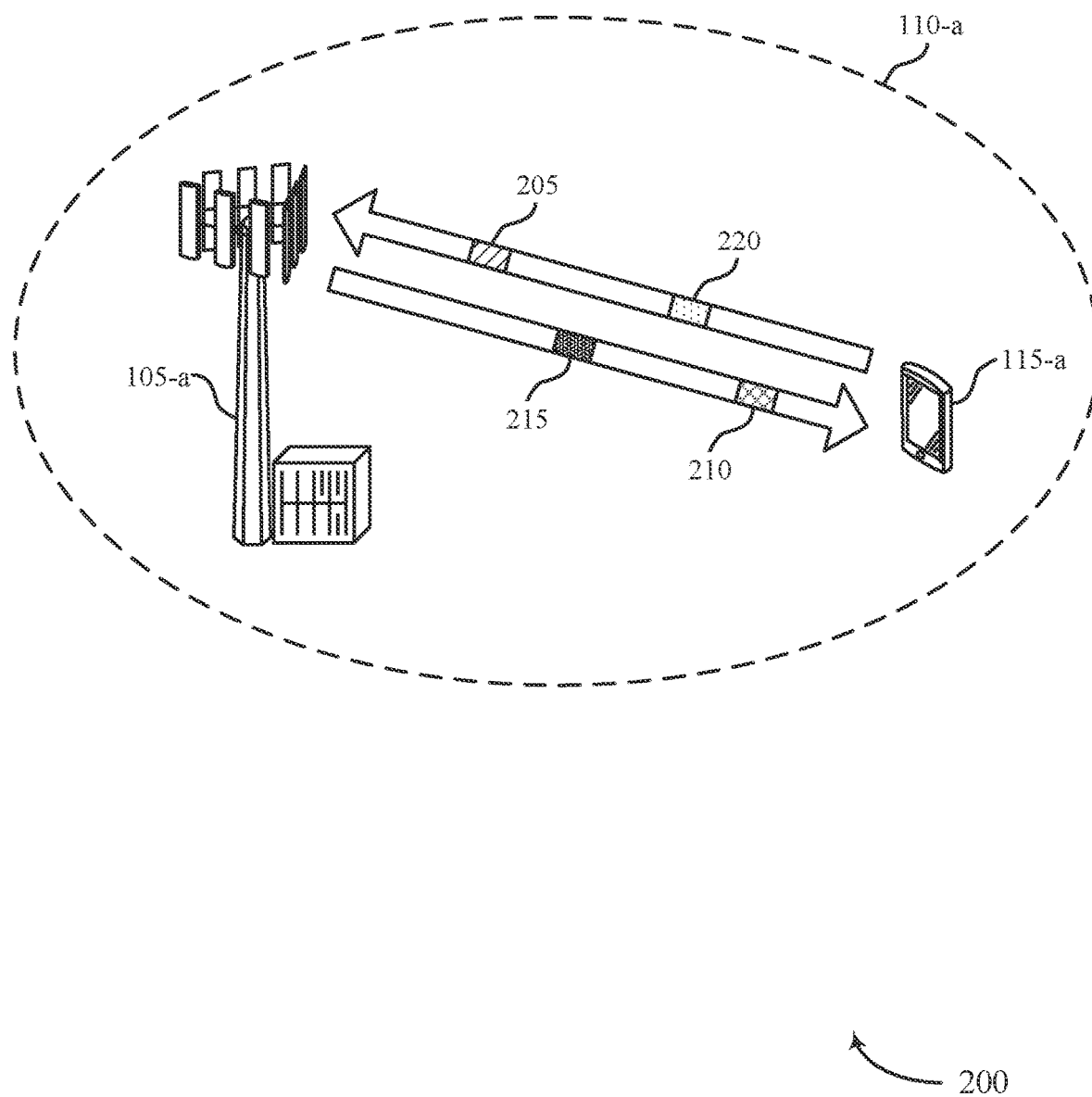

FIG. 2 illustrates an example of a wireless communications system 200 that supports techniques for bandwidth-limited envelope tracking using DPoD in accordance with aspects of the present disclosure. The wireless communications system 200 may implement or be implemented by aspects of the wireless communications system 100. For example, the wireless communications system 200 may include a UE 115-*a* and a base station 105-*a*, which may be examples of corresponding devices described with reference to FIG. 1. The UE 115-*a* and the base station 105-*a* may communicate within a geographic coverage area 110-*a*, which may be an example of a geographic coverage area 110 described with reference to FIG. 1. In the wireless communications system 200, the UE 115-*a* may transmit an uplink message 220 to the base station 105-*a* using a bandwidth-limited envelope tracking configuration.

In the example of FIG. 2, the UE 115-*a* may transmit a capability message 205 to the base station 105-*a*. The capability message 205 may indicate a capability of the UE 115-*a* to perform bandwidth-limited envelope tracking for wideband transmissions. The capability message 205 may also indicate a bandwidth-limited envelope tracking configuration to be used for transmission of an uplink message 220. The bandwidth-limited envelope tracking configuration may identify a LPF response, a backoff parameter (e.g., $ET_b$), a PA response, or a combination thereof. Additionally or alternatively, the capability message 205 may indicate a capability of the UE 115-*a* to use an extended bandwidth for the bandwidth-limited envelope tracking. The UE 115-*a* may transmit the capability message 205 via RRC signaling.

In response to the capability message 205, the base station 105-*a* may transmit a request 210 for the UE 115-*a* to activate uplink bandwidth-limited envelope tracking. The request 210 may indicate a backoff parameter for the UE 115-*a* to use when performing the uplink bandwidth-limited envelope tracking. In some examples, the backoff parameter indicated by the request 210 may be based on DPoD compensation capabilities of the base station 105-*a*. The base station 105-*a* may transmit the request via RRC signaling, a MAC-CE, or downlink control information (DCI).

The base station 105-*a* may also transmit control signaling 215 to the UE 115-*a*. The control signaling 215 may include a scheduling message that indicates one or more of an uplink resource allocation, a modulation and coding scheme (MCS), or a bandwidth to be used for transmission of the uplink message 220. The control signaling 215 may also indicate a backoff parameter per MCS, which the UE 115-*a* may use to determine a suitable backoff parameter for transmission of the uplink message.

Accordingly, the UE 115-*a* may transmit the uplink message 220 to the base station 105-*a* using the bandwidth-limited envelope tracking configuration. For example, the UE 115-*a* may generate an input signal that includes the uplink message 220, and may filter the input signal using an LPF. That is, the UE 115-*a* may actively filter the input signal (e.g., with the LPF) before performing envelope tracking on the input signal, which may enable the UE 115-*a* to attain a more controllable filtering response. Alternatively, the input signal may be filtered (e.g., without the UE 115-*a* actively filtering the input signal) as a result of the envelope tracking (e.g., due to physical constraints of envelope tracking circuitry at the UE 115-*a*). After the input signal is filtered (e.g., actively or as a result of the envelope tracking), the UE 115-*a* may perform an envelope extraction procedure on the filtered input signal, add a backoff parameter to the filtered input signal, and amplify either the filtered input signal with the added backoff parameter or the instantaneous signal envelope of the input signal. The amplified signal (e.g., the output of the PA) may correspond to the uplink message 220 that is transmitted to the base station 105-*a*.

Upon receiving the uplink message 220, the base station 105-*a* may use DPoD to compensate for (e.g., correct) bandwidth-limited envelope tracking distortions in the uplink message 220. Specifically, the base station 105-*a* may generate an equivalent PA model based on the bandwidth-limited envelope tracking configuration of the UE 115-*a*, and may use this equivalent PA model to decode the uplink message 220. The equivalent PA model may include an LPF, a PA, and an envelope extraction component, among other components. The base station 105-*a* may use the equivalent PA model to determine a first distortion coefficient (e.g., a) and a second distortion coefficient (e.g., d), and may compensate the uplink message 220 based on the first distortion coefficient and the second distortion coefficient.

The signaling mechanisms described in the wireless communications system 200 may enable the UE 115-*a* to perform uplink bandwidth-limited envelope tracking in accordance with aspects of the present disclosure. For example, the capability message 205 may signal a capability of the UE 115-*a* to apply bandwidth-limited envelope tracking to the base station 105-*a* in accordance with the transmission scheme 500 described with reference to FIG. 5. The capability message 205 may also indicate a possible bandwidth expansion (e.g., if the UE 115-*a* is capable of extending envelope tracking bandwidth from 20 MHz up to 40 MHz, or from 20 MHz to 60 MHz). The UE 115-*a* may also indicate an envelope tracking LPF response to enable the base station 105-*a* to generate an equivalent PA model. The LPF response may be predefined, or may be dependent on a signal bandwidth. As such, multiple LPF responses may be signaled by the UE 115-*a*.

The base station 105-*a* may signal to the UE 115-*a* which backoff parameter (e.g., $ET_b$) to use based on DPoD correction capabilities of the base station 105-*a*. This signaling may include sending a backoff parameter per MCS as part of an RRC message. The backoff parameter per MCS may correspond to a target EVM (e.g., a threshold signal quality per MCS) for the uplink message 220. That is, different MCSs may be associated with different target EVMs and backoff parameters. For example, the base station 105-*a* may indicate a first backoff parameter (e.g., 0 dB) for a first MCS (e.g., quadrature phase shift keying (QPSK)), a second backoff parameter (e.g., 1.8 dB to attain an EVM of 25 dB) for a second MCS (e.g., 16 QAM), a third backoff parameter (e.g., 3.8 dB to attain an EVM of 31 dB) for a third MCS (e.g., 64 QAM), and a fourth backoff parameter (e.g., 6.1 dB to attain an EVM of 37 dB) for a fourth MCS (e.g., 256 QAM). A suitable backoff parameter may then be dynamically determined by the UE 115-*a* based on the MCS used in each uplink allocation (e.g., for the uplink message 220) and a target EVM for the uplink message 220. A backoff parameter may also signaled dynamically per uplink allocation (e.g., via DCI) or changed semi-statically. A PA response may also be signaled as a function of a filtered input signal (e.g., $x_{LPF}$) a backoff parameter (e.g., $ET_b$), and an input signal (e.g., x). That is, instead of signaling a PA response as y=PA(x), the PA response may be signaled using Equation 1:

$$y=PA(x,x_{LPF},ET_b) \quad (1)$$

where x is the input signal, $x_{LPF}$ is the filtered input signal, and $ET_b$ is the backoff parameter. Alternatively, the PA response may be estimated on the receiver side (e.g., at the base station 105-*a*) by sending dedicated reference signals that can be used for evaluating (e.g., generating) the equivalent PA. The bandwidth used for transmission of these reference signals may correspond to a bandwidth used for transmission of the uplink message 220. The signaling mechanisms described in the wireless communications system 200 may provide for reduced power consumption at the UE 115-*a* and greater communication reliability at the base station 105-*a*, among other benefits.

Figure 3:
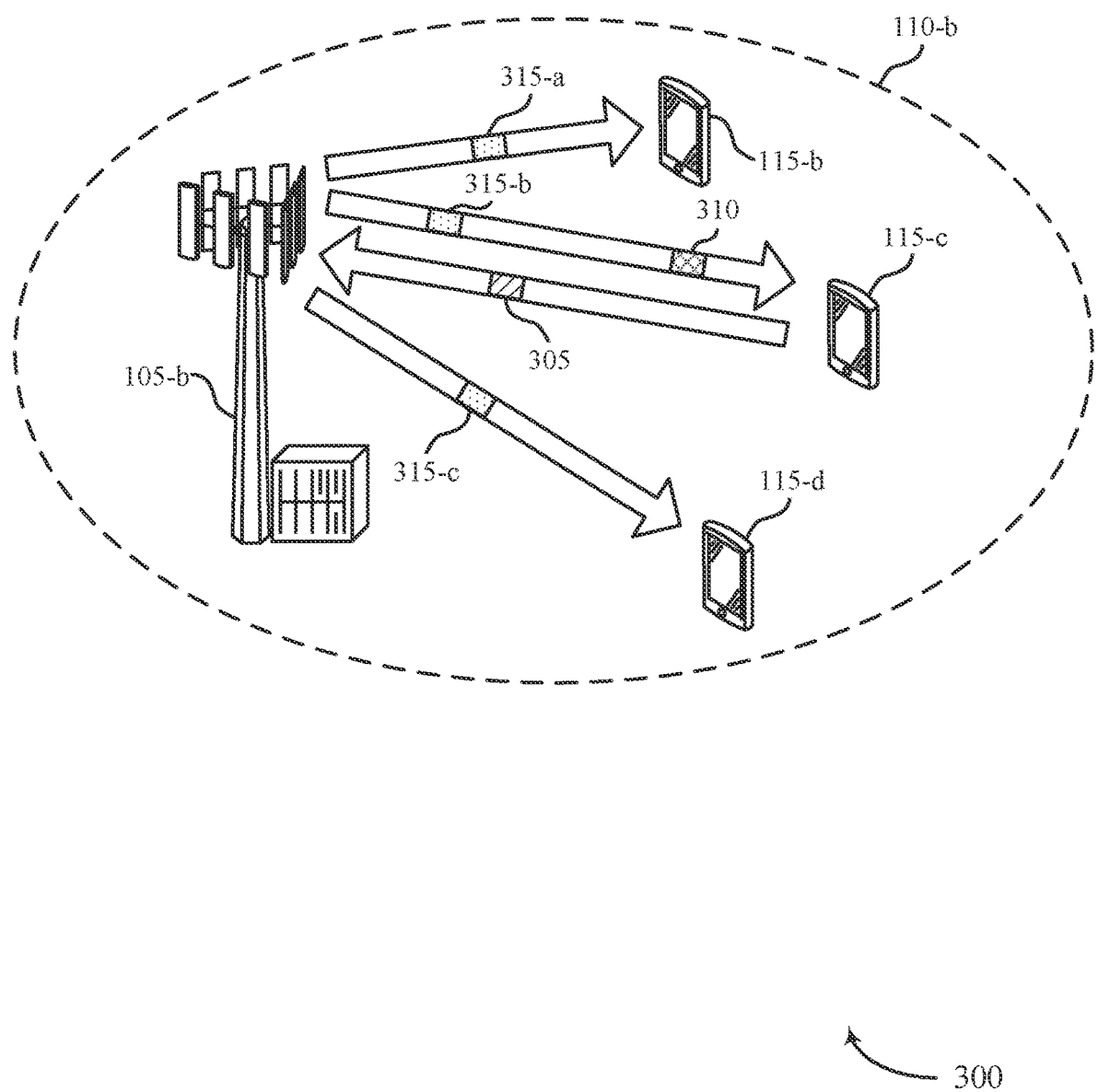

FIG. 3 illustrates an example of a wireless communications system 300 that supports techniques for bandwidth-limited envelope tracking using DPoD in accordance with aspects of the present disclosure. The wireless communications system 300 may implement or be implemented by aspects of the wireless communications system 100 or the wireless communications system 200. For example, the wireless communications system 300 may include a UE 115-*b*, a UE 115-*e*, a UE 115-*d*, and a base station 105-*b*, which may be examples of corresponding devices described with reference to FIGS. 1 and 2. The UEs 115 and the base station 105-*b* may communicate within a geographic coverage area 110-*b*, which may be an example of a geographic coverage area 110 or a geographic coverage area 110-*a* described with reference to FIGS. 1 and 2. In the wireless communications system 300, the base station 105-*b* may transmit downlink messages 315 to the UEs 115 using a bandwidth-limited envelope tracking configuration.

In the example of FIG. 3, the UE 115-*e* may transmit a capability message 305 to the base station 105-*b*. The capability message 305 may indicate a capability of the UE 115-*e* to compensate for bandwidth-limited envelope tracking distortion. The capability message 305 may also indicate a requested backoff parameter (e.g., $ET_b$) or a set of minimum backoff parameters for the UE 115-*e*. Additionally or alternatively, the capability message 305 may indicate a capability of the UE 115-*e* to compensate for bandwidth-limited envelope tracking distortion over an extended bandwidth. In some examples, the UE 115-*e* may transmit the capability message 305 via RRC signaling.

In response to the capability message 305, the base station 105-*b* may transmit control signaling 310 to the UE 115-*e*. The control signaling 310 may include one or more of an RRC message, a MAC-CE, or DCI. In some examples, the control signaling 310 may include a scheduling message that indicates one or more of a downlink resource allocation, an MCS, or a bandwidth to be used for transmission of a downlink message 315-*b*. The control signaling 310 may also include a request for the UE 115-*e* to activate DPoD (e.g., downlink bandwidth-limited envelope tracking compensation). In addition, the control signaling 310 may indicate a downlink bandwidth-limited envelope tracking configuration of the base station 105-*b*. The downlink bandwidth-limited envelope tracking configuration may identify one or more of an LPF response, a PA response, or a backoff parameter to be used for transmission of the downlink message 315-*b*. In some examples, the PA response identified by the downlink bandwidth-limited envelope tracking configuration of the base station 105-*b* may be a function of an input signal (e.g., x), a filtered input signal (e.g., $x_{LPF}$), and a backoff parameter (e.g., $ET_b$).

The downlink bandwidth-limited envelope tracking configuration of the base station 105-*b* may indicate FDM information associated with the UE 115-*b* and the UE 115-*d*. For example, if the base station 105-*b* FDMs the downlink message 315-*b* (e.g., for the UE 115-*e*) with a downlink message 315-*a* (e.g., for the UE 115-*b*) or a downlink message 315-*c* (e.g., for the UE 115-*d*), the base station 105-*b* may indicate one or more of a frequency allocation, an MCS, or reference signal information for the UE 115-*b* and the UE 115-*d*. This FDM information may enable the UE 115-*e* to successfully decode the downlink message 315-*b*.

Accordingly, the base station 105-*b* may transmit the downlink messages 315 to the UEs 115 using the indicated downlink bandwidth-limited envelope tracking configuration. For example, the base station 105-*b* may generate an input signal that includes one or more of the downlink message 315-*a*, the downlink message 315-*b*, or the downlink message 315-*c* (e.g., the base station 105-*b* may multiplex the downlink messages 315), and may filter the resulting input signal using an LPF. That is, the base station 105-*b* may actively filter the input signal (e.g., with the LPF) before performing envelope tracking on the input signal, which may enable the base station 105-*b* to attain a more controllable filtering response. Alternatively, the input signal may be filtered (e.g., without the base station 105-*b* actively filtering the input signal) as a result of the envelope tracking (e.g., due to physical constraints of envelope tracking circuitry at the base station 105-*b*). After the input signal is filtered (e.g., actively or as a result of the envelope tracking), the base station 105-*b* may perform an envelope extraction procedure on the filtered input signal, add a backoff parameter to the filtered input signal, and amplify (e.g., using a PA) either the filtered input signal with the added backoff parameter or the instantaneous signal envelope of the input signal. The amplified signal (e.g., an output of the PA) may be transmitted to some or all of the UEs 115.

Upon receiving the downlink message 315-*b*, the UE 115-*e* may use DPoD to compensate for (e.g., correct) bandwidth-limited envelope tracking distortions in the downlink message 315-*b*. Specifically, the UE 115-*e* may generate an equivalent PA model based on the downlink bandwidth-limited envelope tracking configuration of the base station 105-*b*, and may use this equivalent PA model to decode the downlink message 315-*b*. The equivalent PA model may include an LPF, a PA, and an envelope extraction component, among other components. The UE 115-*e* may use the equivalent PA model to determine a first distortion coefficient (e.g., a) and a second distortion coefficient (e.g., d), and may compensate the downlink message 315-*b* based on the first distortion coefficient and the second distortion coefficient. If the downlink message 315-*b* is multiplexed with other downlink messages 315, the UE 115-*e* may perform one or more slicing procedures (e.g., hard slicer or no slicer) on the downlink message 315-*b* based on the FDM information provided by the base station 105-*b*.

The wireless communications system 300 may support signaling mechanisms that enable the base station 105-*b* to perform downlink bandwidth-limited envelope tracking in accordance with the described techniques. The capability message 305 may signal a capability of the UE 115-*e* to apply bandwidth-limited envelope tracking DPoD correction using the reception scheme 800 described with reference to FIG. 8. The capability message 305 may also indicate a possible bandwidth expansion (e.g. if the UE 115-*e* is capable of extending an envelope tracking bandwidth from 20 MHz up to 40 MHz, or from 20 MHz to 60 MHz). Additionally, the capability message 305 may indicate minimal backoff parameter values for the UE 115-*e*. In some examples, the base station 105-*b* may request that the UE 115-*e* apply (e.g., activate) bandwidth-limited envelope tracking DPoD correction. This can be requested per downlink resource allocation (e.g., via DCI).

In some examples, DPoD may not be applicable for some downlink resource allocations. For example, if the base station 105-*b* space division multiplexes (SDMs) different users (e.g., UEs 115) using beamforming techniques and beamformed signals (e.g., the downlink messages 315) do not reach the UE 115-*e* but impact an envelope at the UE 115-*e*, the UE 115-*e* may be unable to identify and correct distortions using DPoD. In such examples, the base station 105-*b* may not request compensation for these specific downlink resource allocations. In some examples, the base station 105-*b* may turn on or off DPoD correction at the UE 115-*e* semi-statically. In other examples, the UE 115-*e* may determine whether to activate DPoD correction based on predefined rules (e.g., transmission bandwidth, MCS) signaled in an RRC message. The base station 105-*b* may also indicate an envelope tracking LPF response to enable the UE 115-*e* to generate an equivalent PA model, as described with reference to FIG. 8. The LPF response may indicate on one or more parameters, such as a passband frequency (e.g., 0 to 10 MHz), a stopband frequency (e.g., 14 MHz), a passband ripple (e.g., 0.1 dB), a stopband attenuation (e.g., 3-dB), or the like, or any combination thereof. The LPF response may be predefined, or may be dependent on signal bandwidth. As such, there may be multiple LPF responses signaled by the base station 105-*b*.

The base station 105-*b* may also signal a PA response as a function of an input signal (e.g., x), a filtered input signal (e.g., $x_{LPF}$), and a backoff parameter (e.g., $ET_b$), as shown in Equation 1. Alternatively, this could be estimated on the receiver side (e.g., the UE 115-*e*) by the base station 105-*b* sending dedicated pilot reference signals to the UE 115-*e*. The UE 115-*e* may use these reference signals to generate an equivalent PA model for the base station 105-*b* (e.g., y=PA (x, $x_{LPF}$, $ET_b$)). The bandwidth used for transmission of these reference signals may correspond to a bandwidth used for transmission of the downlink message 315-*b*.

The base station 105-*b* may also signal FDM user information to the UE 115-*e*. Specifically, to implement a multiuser DPoD correction algorithm based on slicing, the base station 105-*b* may inform the UE 115-*e* about other users (e.g., the UE 115-*b* and the UE 115-*d*) that are FDM-ed in the same time-domain signal. This FDM information may include a frequency allocation, an MCS per user, or reference signal information per user, among other examples. The UE 115-*e* may also request the base station 105-*b* which backoff parameter to use based on DPoD correction capabilities of the UE 115-e. This signaling could be per MCS (e.g. as part of an RRC message), in which case a suitable backoff parameter may be dynamically determined by the base station 105-b based on an MCS used in each downlink allocation (e.g., for the downlink message 315-b).

The base station 105-b may signal to the UE 115-e the selected backoff parameter. This parameter could be also signaled dynamically per downlink allocation (e.g., via DCI) or changed semi-statically. If scheduled downlink messages include users (e.g., UEs 115) with different MCSs that are FDM-ed, the base station 105-b may use a backoff value corresponding to a highest MCS of the FDM-ed users, a weighted average of backoff parameters based on respective bandwidths of the FDM-ed users, or a backoff parameter corresponding to a specific MCS of a user (e.g., the UE 115-e), in which case the base station 105-b may signal to the UE 115-e to apply a no-slicing option for other FDM-ed users. The signaling mechanisms illustrated in the wireless communications system 300 may provide for reduced power consumption at the base station 105-b and improved communication reliability at the UE 115-e, among other benefits.

Figure 4A:
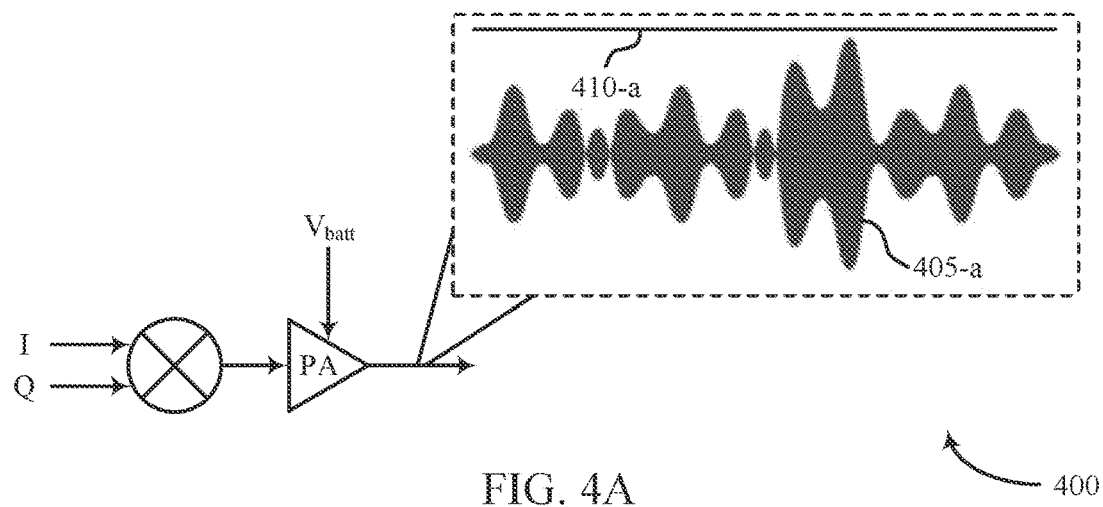
FIGS. 4A, 4B, and 4C illustrate examples of power amplification schemes that supports techniques for bandwidth-limited envelope tracking using DPoD in accordance with aspects of the present disclosure.
Figure 4B:
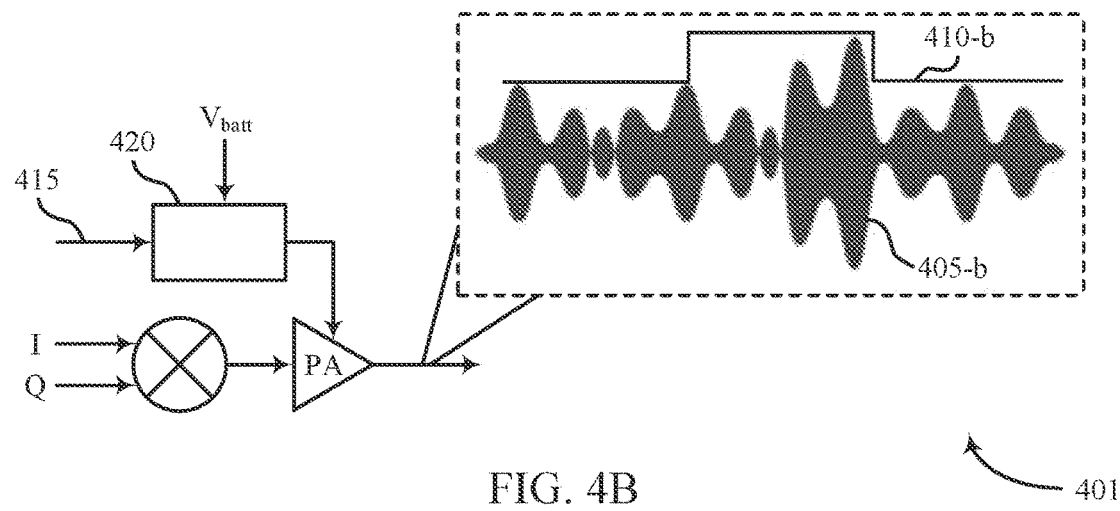
Figure 4C:
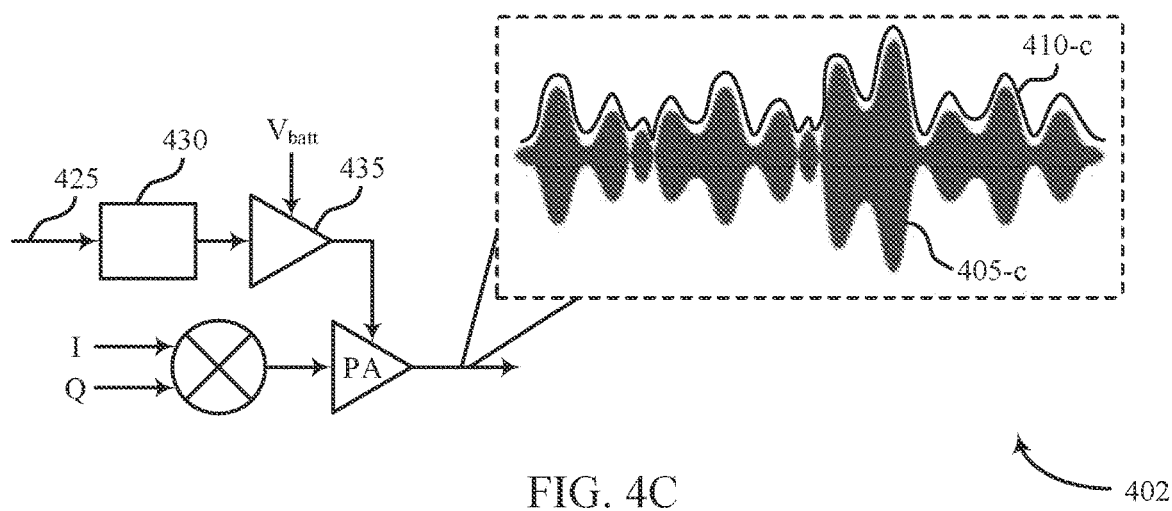

FIGS. 4A, 4B, and 4C illustrate examples of a power amplification scheme 400, a power amplification scheme 401, and a power amplification scheme 402. The power amplification scheme 400, the power amplification scheme 401, and the power amplification scheme 402 may implement or be implemented by aspects of the wireless communications system 100, the wireless communications system 200, or the wireless communications system 300. For example, the power amplification scheme 400, the power amplification scheme 401, or the power amplification scheme 402 may implement or be implemented by a UE or a base station, which may be examples of corresponding devices described with reference to FIGS. 1 through 3.

In some wireless communications systems, PAs may account for a large portion of overall power consumption at communication devices (e.g., UEs and base stations). In order to save power and enable more power efficient operating modes, various PA power supply adaptation modes can be used. These PA power savings modes may include direct battery (e.g., in which constant power is supplied to a PA), power tracking (e.g., on a slot or subframe basis) with digital pre-distortion (EPT) or without digital pre-distortion (APT), and envelope tracking (e.g., power supplied to a PA closely follows an envelope of an instantaneous signal). FIG. 4A may illustrate an example of direct battery, FIG. 4B may illustrate an example of APT or EPT, and FIG. 4C may illustrate an example of an envelope tracking. In comparison to direct battery, APT, and EPT, envelope tracking may be associated with higher power efficiency. However, envelope tracking may be specific to smaller bandwidth channels due to abilities of envelope tracking circuitry to follow fast changing signal envelopes. As such, conventional envelope tracking techniques may not be appropriate for larger bandwidth signals used in wireless communications systems that support NR.

In the example of FIG. 4A, a communication device (e.g., a UE or a base station) may receive an input signal, which may include an in-phase component (e.g., I) and a quadrature component (e.g., Q). The quadrature component of the input signal may have a 90° phase offset with respect to the in-phase component of the input signal. A PA of the communication device (e.g., a class AB PA) may be connected to a power supply of the communication device (e.g., $V_{batt}$), and may output a signal 405-a (e.g., RF Out). The PA may output the signal 405-a using an output voltage 410-a (e.g., $V_{cc}$). In the power amplification scheme 400 (e.g., battery direct), the output voltage 410-a may have a constant value.

In the example of FIG. 4B, the communication device may receive an input signal, which may include an in-phase component (e.g., I) and a quadrature component (e.g., Q). The quadrature component of the input signal may have a 90° phase offset with respect to the in-phase component of the input signal. A PA of the communication device (e.g., a class AB PA) may receive the input signal along with a voltage 410-b from a switching component 420. The switching component 420 may be connected to a power supply of the communication device (e.g., $V_{batt}$), and may output the voltage 410-b to the PA based on receiving a power control input signal 415. Accordingly, the PA may output a signal 405-b using the voltage 410-b. In the power amplification scheme 400, which may be an example of EPT or APT, the voltage 410-b may vary on the basis of time (e.g., every slot or subframe).

In the example of FIG. 4C, the communication device may receive an input signal, which may include an in-phase component (e.g., I) and a quadrature component (e.g., Q). The quadrature component of the input signal may have a 90° phase offset with respect to the in-phase component of the input signal. A PA of the communication device (e.g., a class AB PA) may receive the input signal along with a voltage 410-c from an envelope tracking power component 435, which may be connected to a power supply of the communication device. The envelope tracking power component 435 may receive a first signal from an envelope tracking detrough component 430. The envelope tracking detrough component 430 may output the first signal based on receiving a second signal 425 that corresponds to a magnitude of the in-phase component and the quadrature component of the input signal. Upon receiving the voltage 410-c and the input signal, the PA may output a signal 405-c using the voltage 410-c. In the power amplification scheme 402, which may be an example of envelope tracking, the voltage 410-c may track an instantaneous envelope of the signal 405-c. The power amplification scheme 402 may illustrate envelope tracking without distortions. Aspects of the present disclosure may provide for performing bandwidth-limited envelope tracking, which may involve augmenting the power amplification scheme 402 with an LPF, among other components.

Figure 5:
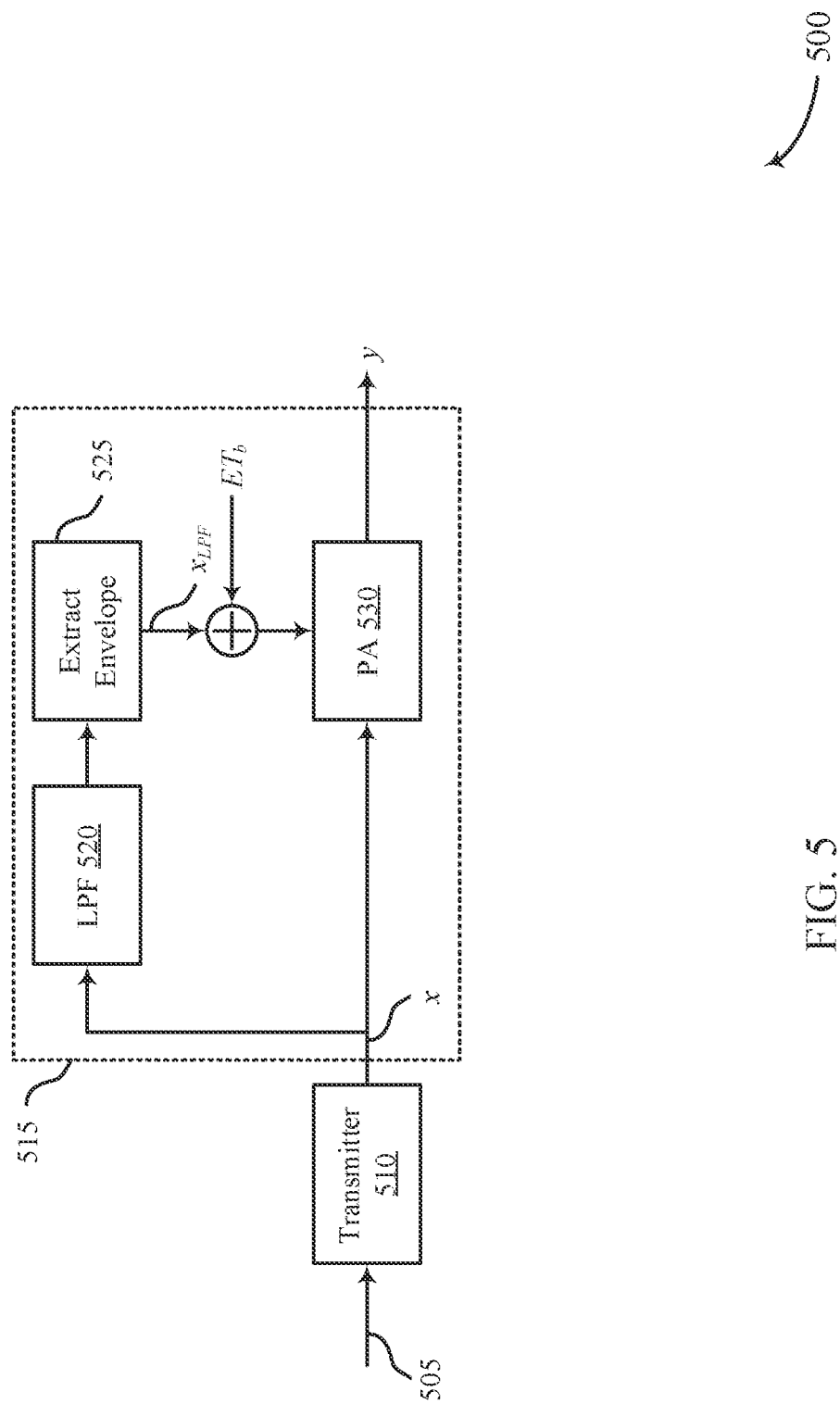
FIG. 5 illustrates an example of a transmission scheme that supports techniques for bandwidth-limited envelope tracking using DPoD in accordance with aspects of the present disclosure.

FIG. 5 illustrates an example of a transmission scheme 500 that supports techniques for bandwidth-limited envelope tracking using DPoD in accordance with aspects of the present disclosure. The transmission scheme 500 may implement or be implemented by aspects of the wireless communications system 100, the wireless communications system 200, or the wireless communications system 300. For example, the transmission scheme 500 may implement or be implemented by a UE, which may be an example of a UE 115 described with reference to FIGS. 1 through 3. The transmission scheme 500 may illustrate an example of a bandwidth-limited envelope tracking configuration used for transmission of an uplink message.

In the example of FIG. 5, a communication device (e.g., a UE) may receive an input signal 505 (e.g., x) at a transmitter 510 of the communication device. The transmitter 510 may output the input signal 505 to an LPF 520 (e.g., a 20 MHz LPF) and a PA 530. The LPF 520 may filter the input signal 505 and output a filtered signal (e.g., $x_{LPF}$) to an envelope extraction component 525 of the communication device, which may generate a filtered envelope response associated with the filtered signal. Alternatively, the input signal 505 may be filtered (e.g., due to envelope tracking circuitry limitations) while passing through the envelope extraction component 525. The LPF 520, the PA 530, and the envelope extraction component 525 may collectively form an equivalent PA model 515 of the communication device.

Upon generating the filtered envelope response, a backoff parameter (e.g., ET b) may be added to the filtered envelope response, which may be outputted to the PA 530. The PA 530 may amplify an instantaneous signal envelope of the input signal 505 or the filtered envelope response with the added backoff parameter. An output signal of the PA 530 (e.g., y) may be modeled using a hard clipper formula shown in Equation 2:

$$y=\min(|x|,|x_{LPF}*ET_{b_{lin}}|)\exp(i\angle(x)) \qquad (2)$$

where x is an input signal, $x_{LPF}$ is a filtered input signal, $ET_{b_{lin}}$ is a backoff parameter in the linear domain, i is a complex value, and $\angle(x)$ is the angle of the input signal with respect to real and imaginary axes. In some examples, Equation 2 may be an example of Equation 1, as described with reference to FIG. 2. Although described in the context of a hard clipper formula, it is to be understood that other formulas may also be used for modeling output signals from the PA 530.

The communication device may use the transmission scheme 500 to perform limited bandwidth envelope tracking for wideband signals. Accordingly, the reception scheme 600 described with reference to FIG. 6 may be used by a second communication device (e.g., a receiver) to compensate for resulting distortions (e.g., due to limited bandwidth envelope tracking) using DPoD. Using the transmission scheme 500 in combination with the reception scheme 600, envelope tracking can be extended to larger bandwidth signals, which may improve transmit power efficiency for larger bandwidth operations. The transmission scheme 500 may be used for uplink wideband transmissions, where a UE can improve power consumption using envelope tracking, and DPoD correction may occur at a receiving base station. The application of DPoD for correcting distortions created by limited bandwidth envelope tracking may involve specific signaling mechanisms and DPoD algorithm modifications, as described with reference to FIG. 2.

In the transmission scheme 500, the input signal 505 may be transmitted through a PA with a power supply that is modulated by envelope tracking circuitry. As the response of the envelope tracking is bandwidth-limited, the envelope tracker input may be filtered by an LPF that corresponds to an envelope tracking LPF response. That is, the input signal may be actively filtered (e.g., with the LPF) before envelope tracking is performed on the input signal, which may provide a more controllable filtering response. Alternatively, the input signal may be filtered (e.g., without actively filtering the input signal) as a result of the envelope tracking (e.g., due to physical constraints of envelope tracking circuitry). After the input signal is filtered (e.g., actively or as a result of the envelope tracking), an additional backoff parameter (e.g., $ET_b$ (dB)) can be added to the envelope tracker output to reduce distortions. The PA can be modeled as a hard clipper function, as shown in Equation 2. If the filtered envelope response plus the added backoff is larger than the instantaneous signal envelope, no distortion occurs. Otherwise, the signal may be hard clipped to the filtered envelope response plus backoff. The transmission scheme 500 may enable a communication device to transmit wideband signals with reduced power consumption, among other benefits.

Figure 6:
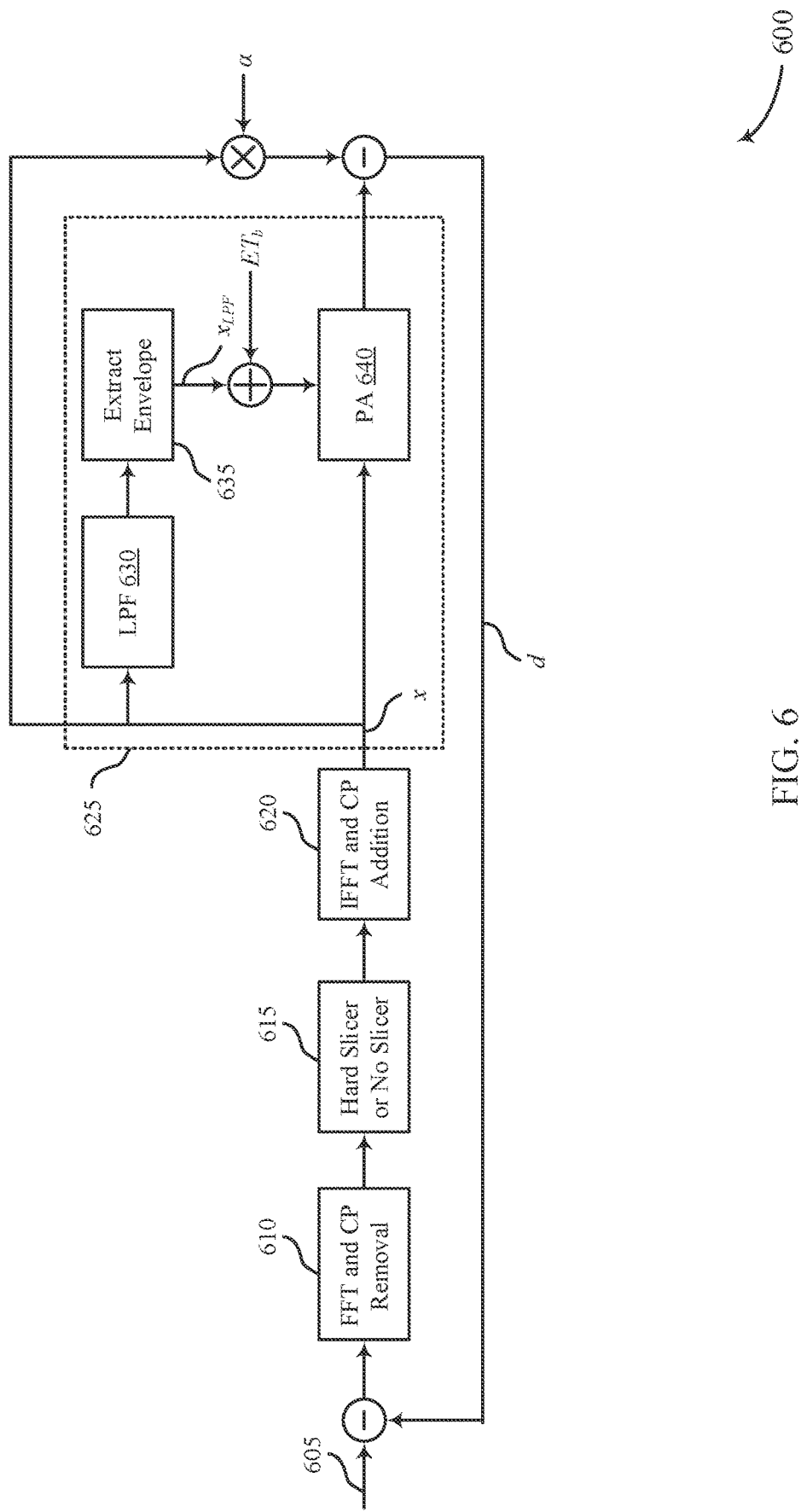
FIG. 6 illustrates an example of a reception scheme that supports techniques for bandwidth-limited envelope tracking using DPoD in accordance with aspects of the present disclosure.

FIG. 6 illustrates an example of a reception scheme 600 that supports techniques for bandwidth-limited envelope tracking using DPoD in accordance with aspects of the present disclosure. The reception scheme 600 may implement or be implemented by aspects of the wireless communications system 100, the wireless communications system 200, or the wireless communications system 300. For example, the reception scheme 600 may be implemented by a base station, which may be an example of a base station 105 described with reference to FIGS. 1 through 3. The reception scheme 600 may illustrate an example of a DPoD configuration used to correct (e.g., compensate for) bandwidth-limited envelope tracking distortion.

In the example of FIG. 6, a communication device (e.g., a base station) may receive an input signal 605. At 610, the communication device may perform a fast Fourier transform (FFT) on the input signal 605 and remove a CP from the input signal 605 (e.g., if the input signal 605 is an example of an OFDM signal used in NR communications). At 615, the communication device may perform a slicing procedure (e.g., hard slicer or no slicer) on the input signal 605. After the slicing procedure, the communication device may perform an inverse fast Fourier transform (IFFT) on the input signal 605 and add a CP to the input signal 605. Accordingly, the communication device may output the input signal 605 (e.g., x) to an LPF 630 and a PA 640. The LPF 630 may filter the input signal 605 and output the filtered signal to an envelope extraction component 635. That is, the LPF 630 may actively filter the input signal 605. Alternatively, the input signal 605 may be filtered (e.g., due to hardware constraints of the communication device) while passing through the envelope extraction component 635. The envelope extraction component 635 may generate a filtered envelope response for the filtered signal. The LPF 630, the PA 640, and the envelope extraction component 635 may collectively form an equivalent PA model 625 of the communication device.

Upon generating the filtered envelope response, a backoff parameter may be added to the filtered envelope response. The filtered envelope response with the added backoff parameter may be inputted to the equivalent PA model 625. The input signal 605 may be used to determine a first distortion parameter (e.g., a) and an output signal from the equivalent PA model 625 may be used to determine a second distortion parameter (e.g., d). The communication device may subtract the second distortion parameter from the input signal 605 to compensate for distortions in the input signal 605 caused by bandwidth-limited envelope tracking.

The reception scheme 600 (e.g., a receive-side DPoD correction algorithm) may follow Bussgang decompositions. Unlike other models, however, the equivalent PA model that needs to be incorporated in the algorithm as shown below. The equivalent PA model 625 may include other components to be signaled from the communication device via control information. These components may include an LPF response, a backoff parameter (e.g., $ET_b$ (dB)), and a PA response as a function of x and $x_{LPF}$. The reception scheme 600 may illustrate an example of a hard clipper PA model with a signal bandwidth of 40 MHz and an envelope tracking bandwidth of 20 MHz. DPoD Bussgang-based iterations used to estimate x and d may be derived from Equations 3 through 7:

$$y(x) = \alpha x + d \qquad (3)$$

$$y_{corrected} = y - \hat{d} \qquad (4)$$

-continued $$\hat{x} = \textit{ifft}\left(\text{argmin}|FFT(y_{corrected}) - FFT(\alpha x)|^2\right) \text{ or } \hat{x} = \frac{y_{corrected}}{\alpha} \quad (5)$$

$$\hat{d} = \text{equivalent\_PA\_model}(\hat{x}) - \alpha x \quad (6)$$

$$y - \hat{d} \quad (7)$$

where y is an output of the PA 640, x is the input signal 605, $\hat{d}$ is the second distortion parameter, $\alpha$ is the first distortion parameter, $y_{corrected}$ is a compensated output signal, and equivalent_PA_model(x) corresponds to the equivalent PA model 625. The reception scheme 600 may offer improvements in comparison to other backoff schemes used with corresponding MCSs. Thus, large improvements in envelope tracking bandwidths can be attained using the DPoD algorithms described herein.

Figure 7:
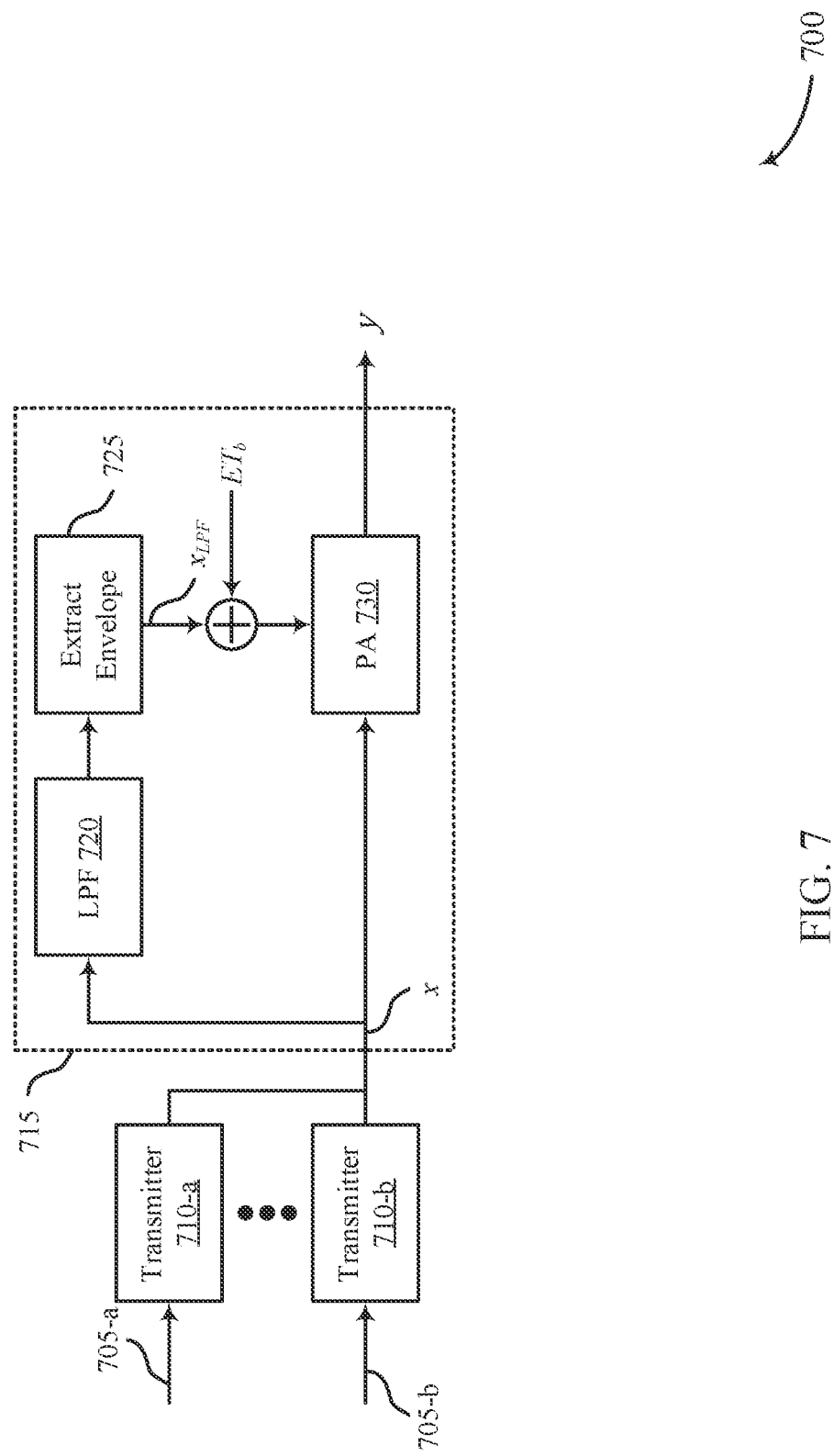
FIG. 7 illustrates an example of a transmission scheme that supports techniques for bandwidth-limited envelope tracking using DPoD in accordance with aspects of the present disclosure.

FIG. 7 illustrates an example of a transmission scheme 700 that supports techniques for bandwidth-limited envelope tracking using DPoD in accordance with aspects of the present disclosure. The transmission scheme 700 may implement or be implemented by aspects of the wireless communications system 100, the wireless communications system 200, or the wireless communications system 300. For example, the transmission scheme 700 may implement or be implemented by a base station, which may be an example of a base station 105 described with reference to FIGS. 1 through 3. The transmission scheme 700 may illustrate an example of a bandwidth-limited envelope tracking configuration used for transmission of a downlink message.

In the example of FIG. 7, a communication device (e.g., a base station) may receive an input signal 705-a at a transmitter 710-a (e.g., Tx 1), and may receive an input signal 705-b at a transmitter 710-b (e.g., Tx N). The input signal 705-a may correspond to a first user, and the input signal 705-b may correspond to an Nib user. A composite signal (e.g., x) may correspond to a summation of all the input signals 705 from respective transmitters 710. The composite signal may be outputted to an LPF 720 and a PA 730. The LPF 720 may filter the composite signal and output a filtered signal (e.g., $x_{LPF}$) to an envelope extraction component 725 of the communication device, which may generate a filtered envelope response associated with the filtered signal. In some examples, the composite signal may be filtered while passing through the envelope extraction component 725 (e.g., without using the LPF 720 to actively filter the composite signal). The LPF 720, the PA 730, and the envelope extraction component 725 may collectively form an equivalent PA model 715 of the communication device. Upon generating the filtered envelope response, a backoff parameter (e.g., $ET_b$) may be added to the filtered envelope response, which may be outputted to the PA 730. The PA 730 may amplify an instantaneous signal envelope of the composite signal or the filtered envelope response with the added backoff parameter. An output signal of the PA 730 (e.g., y) may be modeled using Equation 2.

In the transmission scheme 700, the communication device may apply limited bandwidth envelope tracking for a wideband signal transmission, and a second communication device (e.g., a receiver) may compensate for resulting distortions (e.g., due to limited bandwidth envelope tracking) using receive-side DPoD, as described with reference to FIG. 8. Using this scheme, envelope tracking techniques can be extended to larger bandwidth signals, which may improve the power efficiency of transmissions from the communication device when such transmissions are performed over a larger bandwidth. The transmission scheme 700 may represent a downlink transmission scheme that can improve power consumption at a base station. A receiving UE may correct distortions caused by the transmission scheme 700 using the reception scheme 800 described with reference to FIG. 8. For downlink transmissions, a base station may FDM several users (e.g., UEs). Thus, a DPoD algorithm used by a receiving UE may be based on information related to the FDM-ed users and an MCS corresponding to each of these users.

In the transmission scheme 700, the communication device may multiplex (e.g. FDM) N different users (e.g., UEs). The composite signal (e.g., a summation of all the FDM-ed users) may be transmitted through the PA 730, which may have a power supply modulated by envelope tracking circuitry. As the response of the envelope tracking is bandwidth limited, the envelope tracker input may be filtered by the LPF 720, which may correspond to (e.g., mimic) an envelope tracker LPF response of a receiving device. To limit distortions created by the transmission scheme 700, an additional backoff (e.g., $ET_b$ (dB)) may be added to the envelope tracker output, as shown in Equation 2. If the filtered envelope response plus the added backoff is larger than the instantaneous signal envelope, no distortion occurs. Otherwise, the signal may be hard clipped to the filtered envelope response plus the backoff. The transmission scheme 700 may reduce power consumption at the communication device by enabling the communication device to use envelope tracking over larger bandwidths (e.g., in comparison to other transmission schemes).

Figure 8:
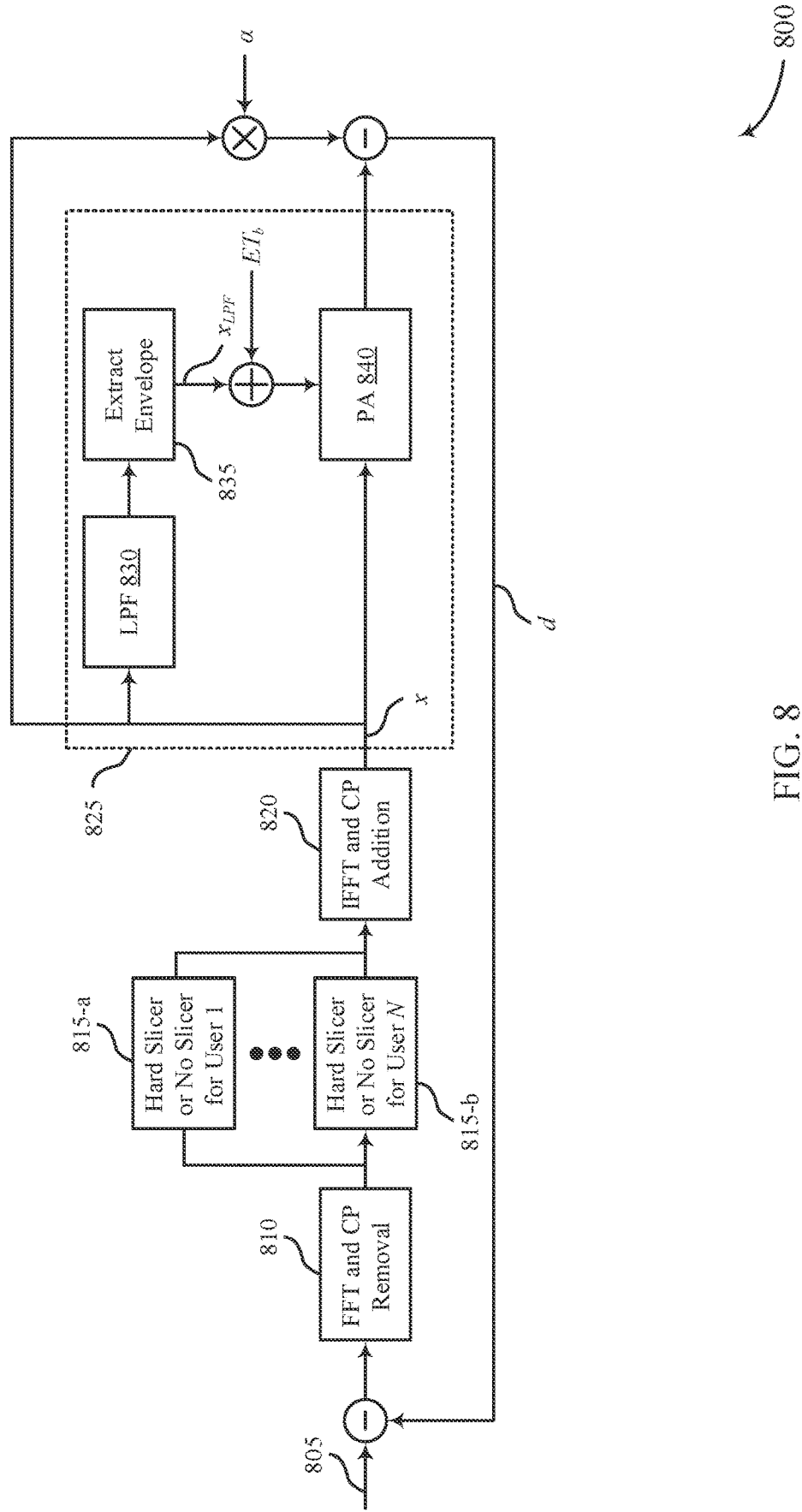
FIG. 8 illustrates an example of a reception scheme that supports techniques for bandwidth-limited envelope tracking using DPoD in accordance with aspects of the present disclosure.

FIG. 8 illustrates an example of a reception scheme 800 that supports techniques for bandwidth-limited envelope tracking using DPoD in accordance with aspects of the present disclosure. The reception scheme 800 may implement or be implemented by aspects of the wireless communications system 100, the wireless communications system 200, or the wireless communications system 300. For example, the reception scheme 800 may be implemented by a UE, which may be an example of a UE 115 described with reference to FIGS. 1 through 3. The reception scheme 800 may illustrate an example of a DPoD configuration used to correct (e.g., compensate for) bandwidth-limited envelope tracking distortion.

In the example of FIG. 8, a first communication device (e.g., a UE) may receive an input signal 805. The input signal 805 may include a first downlink message for the first communication device. In some examples, the input signal 805 may also include one or more other downlink messages that are FDM-ed with the first downlink message. At 810, the first communication device may perform an FFT on the input signal 805 and remove a CP from the input signal 805. At 815-a, the first communication device may perform a first slicing procedure (e.g., hard slicer or no slicer) associated with a second communication device. For example, if the first downlink message (e.g., for the first communication device) is FDM-ed with a second downlink message (e.g., for the second communication device), the first communication device may perform a hard slicer procedure on the input signal 805 based on FDM information (e.g., frequency allocation, MCS, reference signal information) associated with the second communication device. If the first downlink message is FDM-ed with other downlink messages, the first communication device may perform slicing procedures for these downlink messages as well. For example, the first communication device may perform an $N_{th}$ slicing procedure associated with an $N_{th}$ communication device at 815-b.

After performing these slicing procedures, the first communication device may perform an IFFT on the input signal

805 and add a CP to the input signal 805. Accordingly, the first communication device may output the input signal 805 (e.g., x) to an LPF 830 and a PA 840. The LPF 830 may filter the input signal 805 and output the filtered signal to an envelope extraction component 835. Alternatively, the input signal 805 may be filtered by the envelope extraction component 835 (e.g., due to envelope tracking circuitry constraints of the first communication device). The envelope extraction component 835 may generate a filtered envelope response for the filtered signal. The LPF 830, the PA 840, and the envelope extraction component 835 may collectively form an equivalent PA model 825 of the communication device.

Upon generating the filtered envelope response, a backoff parameter may be added to the filtered envelope response. The filtered envelope response with the added backoff parameter may be inputted to the PA 840. The input signal 805 may be used to determine a first distortion parameter (e.g., $\alpha$) and an output signal from the PA 840 may be used to determine a second distortion parameter (e.g., d). The first communication device may subtract the second distortion parameter from the input signal 805 to compensate for distortions in the input signal 805 caused by bandwidth-limited envelope tracking.

The reception scheme 800 (e.g., a DPoD correction algorithm) may include a slicer stage per FDM-ed user. As such, a transmitting device (e.g., a base station) may signal to the communication device (e.g., a UE) MCSs, resource allocations, and pilot structures corresponding to each FDM-ed user. Alternatively, the DPoD algorithm can include a no-slicing option. This option may be associated with lower complexity (e.g., for a downlink algorithm) as this option may not involve FDM-ed user information. In addition, this option could be a time-domain option, which may enable the communication device to skip the IFFT and FFT operations described in the reception scheme 800. A combination of slicing for some FDM-ed users with time-domain iterations for other FDM-ed users may also be supported. The reception scheme 800 may illustrate an example of a hard clipper PA model with a signal bandwidth of 40 MHz and an envelope tracking bandwidth of 20 MHz. The reception scheme 800 may utilize DPoD Bussgang-based iterations for estimating x and d, as shown in Equations 3 through 7. The reception scheme 800 may enable the communication device to correct bandwidth-limited envelope tracking distortions with greater reliability, among other benefits.

Figure 9:
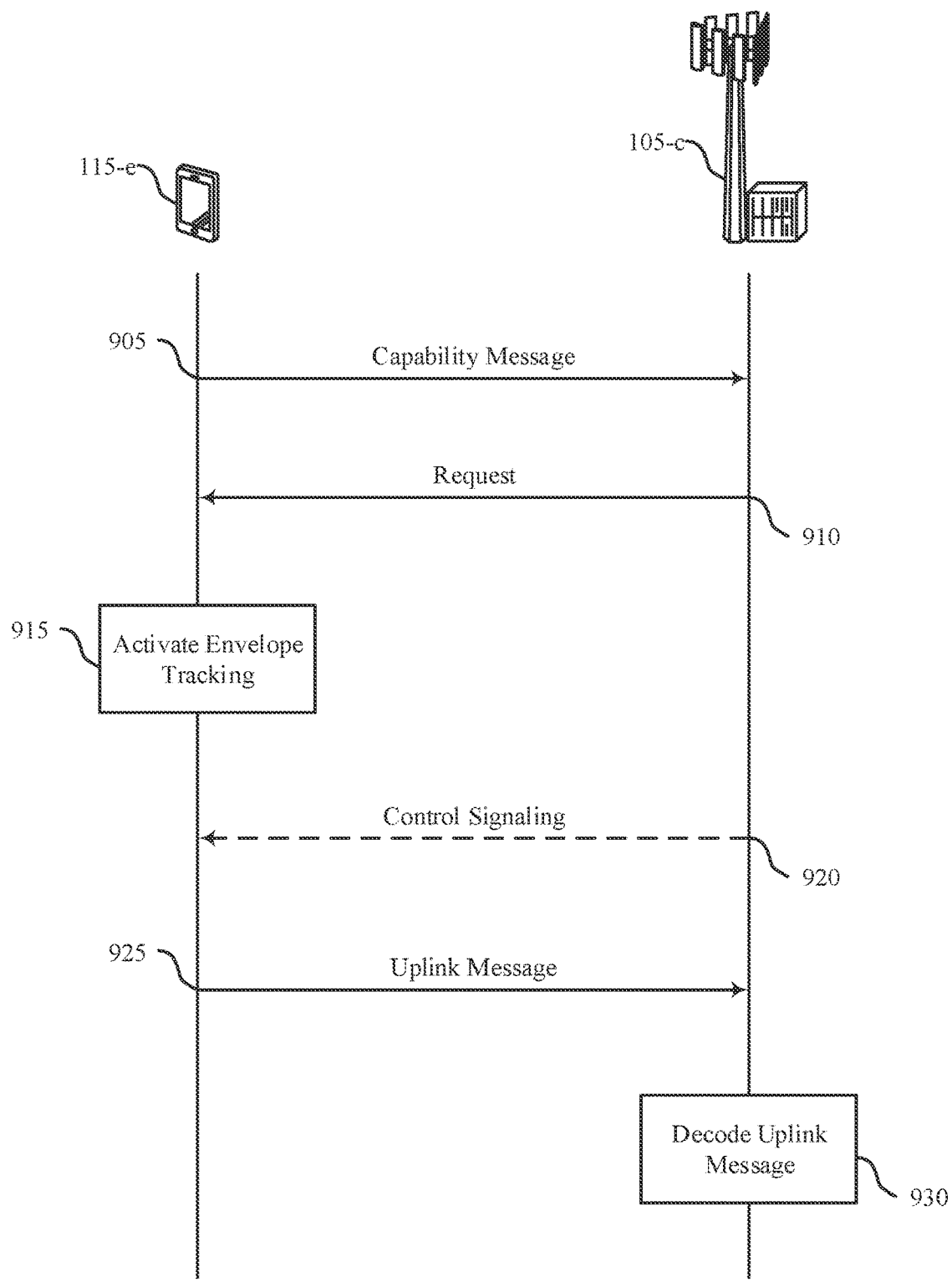
FIGS. 9 and 10 illustrate examples of process flows that support techniques for bandwidth-limited envelope tracking using DPoD in accordance with aspects of the present disclosure.

FIG. 9 illustrates an example of a process flow 900 that supports techniques for bandwidth-limited envelope tracking using DPoD in accordance with aspects of the present disclosure. The process flow 900 may implement or be implemented by aspects of the wireless communications system 100, the wireless communications system 200, or the wireless communications system 300. For example, the process flow 900 may include a UE 115-*e* and a base station 105-*c*, which may be examples of corresponding devices described with reference to FIGS. 1 through 3. In the following description of the process flow 900, operations between the UE 115-*e* and the base station 105-*c* may be performed in a different order or at a different time than as shown. Additionally or alternatively, some operations may be omitted from the process flow 900, and other operations may be added to the process flow 900. In the process flow 900, the UE 115-*e* may transmit an uplink message to the base station 105-*c* using a bandwidth-limited envelope tracking configuration.

At 905, the UE 115-*e* may transmit a capability message to the base station 105-*c*. The capability message may indicate a capability of the UE 115-*e* to perform bandwidth-limited envelope tracking as well as an envelope tracking configuration to be used for transmission of an uplink message. The envelope tracking configuration may identify one or more of a LPF response, a backoff parameter (e.g., $ET_b$), or a PA response. In some examples, the envelope tracking configuration may identify a set of LPF responses corresponding to a set of bandwidths used for the bandwidth-limited envelope tracking. In other examples, the envelope tracking configuration may identify the PA response as a function of the LPF response and the backoff parameter. The capability message may also indicate a capability of the UE 115-*v* to perform the bandwidth-limited envelope tracking using an extended bandwidth. In some examples, the UE 115-*e* may transmit the capability message via RRC signaling.

At 910, the base station 105-*c* may transmit a request for the UE 115-*e* to activate uplink bandwidth-limited envelope tracking. The base station 105-*c* may transmit the request based on the capability message from the UE 115-*v*. In some examples, the base station 105-*c* may transmit the request via RRC signaling, a MAC-CE, or DCI. At 915, the UE 115-*e* may activate uplink bandwidth-limited envelope tracking in accordance with the request. At 920, the base station 105-*c* may transmit control signaling to the UE 115-*e*. The control signaling may include a scheduling message that indicates an uplink resource allocation and an MCS to be used for transmission of the uplink message. The control signaling may also indicate a backoff parameter per MCS, which the UE 115-*e* may use to identify a suitable backoff parameter for transmission of the uplink message.

At 925, the UE 115-*e* may transmit an uplink message to the base station 105-*c* (e.g., a wideband signal transmission) using the bandwidth-limited envelope tracking configuration. Specifically, the UE 115-*e* may generate an input signal corresponding to the uplink message, and may filter the input signal using an LPF. Alternatively, the input signal may be filtered without using the LPF (e.g., due to physical constraints of envelope tracking components at the UE 115-*e*). Accordingly, the UE 115-*e* may generate a filtered envelope response based on performing an envelope extraction procedure on the filtered input signal. Upon generating the filtered envelope response, the UE 115-*e* may amplify a signal envelope of the input signal or a combination of the filtered envelope response and a backoff parameter. For example, if the signal envelope of the input signal is less than the combination of the filtered envelope response and the backoff parameter, the UE 115-*e* may amplify the signal envelope of the input signal. In contrast, if the combination of the filtered envelope response and the backoff parameter is less than the signal envelope of the input signal, the UE 115-*e* may amplify the combination of the filtered envelope response and the backoff parameter.

At 930, the base station 105-*c* may decode the uplink message from the UE 115-*e* using a distortion correcting algorithm (e.g., DPoD), which may be based on the bandwidth-limited envelope tracking configuration of the UE 115-*e*. In some examples, the base station 105-*c* may receive one or more reference signals from the UE 115-*e*, and may adjust or otherwise configure a set of DPoD parameters (e.g., an equivalent PA model) based on the one or more reference signals. To decode the uplink message, the base station 105-*c* may receive an input signal that includes the uplink message, and may perform one or more of an FFT, a CP removal procedure, a slicing procedure (e.g., hard slicer or no slicer), an IFFT, or a CP addition procedure on the received input signal. Accordingly, the base station 105-*c* may generate a first distortion parameter (e.g., a) and a second distortion parameter (e.g., d) based on the received input signal and an equivalent PA model that is configured based on the bandwidth-limited envelope tracking configuration of the UE 115-*e*.

The process flow 900 may support techniques for reduced power consumption at the UE 115-*e* and improved communication reliability at the base station 105-*c*. For example, the techniques and operations described in the process flow 900 may enable the UE 115-*e* to transmit an uplink message (e.g., a wideband signal) to the base station 105-*c* using a bandwidth-limited envelope tracking configuration, which may reduce an amount of power consumed by a PA of the UE 115-*e* during transmission of the uplink message. In addition, the techniques and operations described in the process flow 900 may enable the base station 105-*c* to compensate for bandwidth-limited envelope tracking distortions in the uplink message, which may increase the likelihood of the base station 105-*c* successfully receiving the uplink message, among other benefits.

Figure 10:
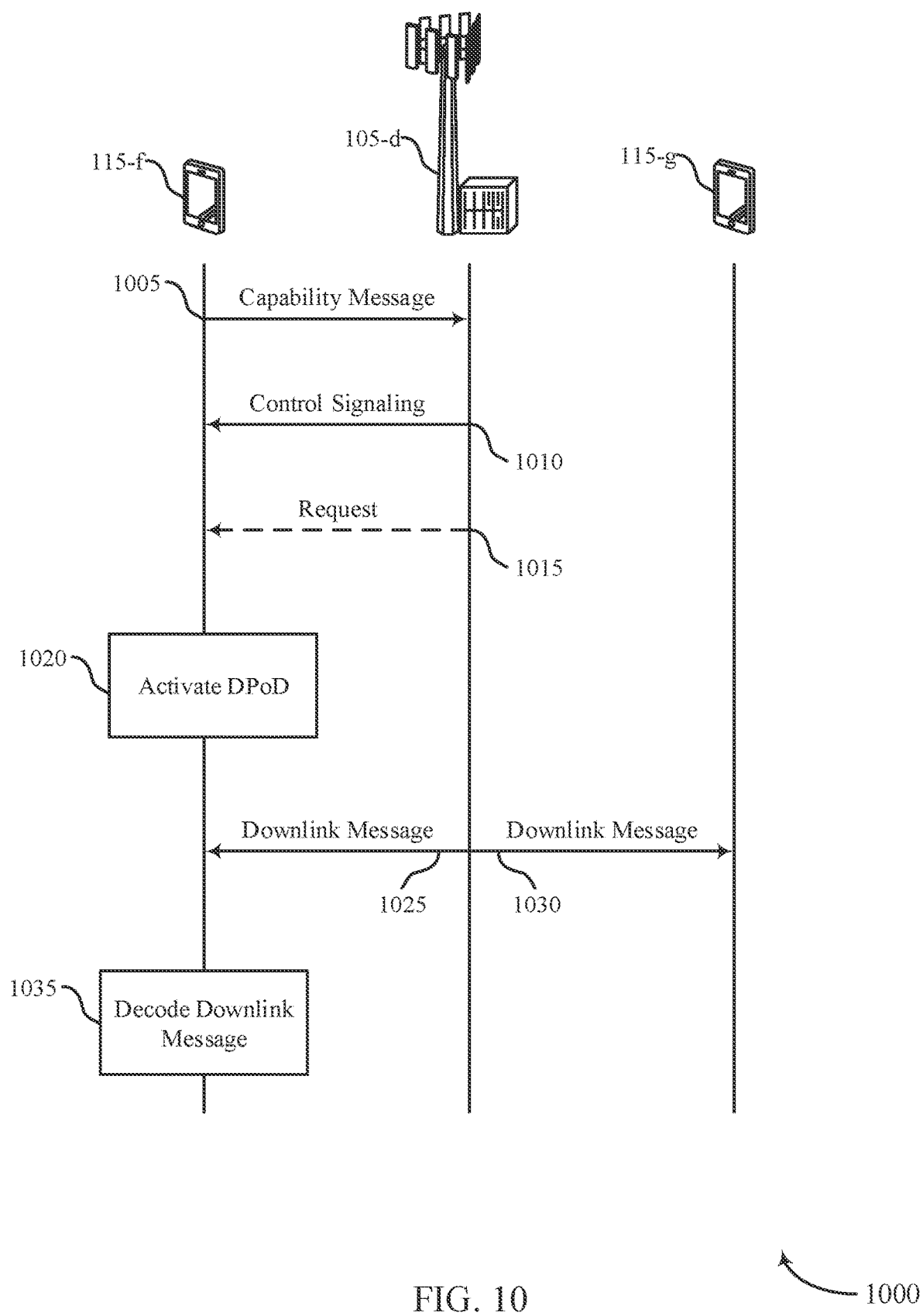

FIG. 10 illustrates an example of a process flow 1000 that supports techniques for bandwidth-limited envelope tracking using DPoD in accordance with aspects of the present disclosure. The process flow 1000 may implement or be implemented by aspects of the wireless communications system 100, the wireless communications system 200, or the wireless communications system 300. For example, the process flow 1000 may include a UE 115-*f*, a UE 115-*g*, and a base station 105-*d*, which may be examples of corresponding devices described with reference to FIGS. 1 through 3. In the following description of the process flow 1000, operations between the UE 115-*f*, the UE 115-*g*, and the base station 105-*d* may be performed in a different order or at a different time than as shown. Additionally or alternatively, some operations may be omitted from the process flow 1000, and other operations may be added to the process flow 1000. In the process flow 1000, the base station 105-*d* may transmit downlink messages to the UEs 115 using a bandwidth-limited envelope tracking configuration.

At 1005, the UE 115-*f* may transmit a capability message to the base station 105-*d*. The capability message may indicate a capability of the UE 115-*f* to compensate for bandwidth-limited envelope tracking distortions using DPoD. The capability message may also indicate a set of backoff parameters supported by the UE 115-*f*, a preferred backoff parameter of the UE 115-*f*, a backoff parameter per MCS, a set of LPF responses supported by the UE 115-*f*, or a combination thereof. Additionally or alternatively, the capability message may indicate a capability of the UE 115-*f* to compensate for bandwidth-limited envelope tracking distortions over an extended bandwidth. In some examples, the UE 115-*f* may transmit the capability message via RRC signaling.

At 1010, the base station 105-*d* may transmit control signaling to the UE 115-*f* based on receiving the capability message. The control signaling may indicate a bandwidth-limited envelope tracking configuration to be used for transmission of a first downlink message. In some examples, the control signaling may include a scheduling message that indicates a downlink resource allocation, an MCS, or a bandwidth to be used for transmission of the first downlink message. The bandwidth-limited envelope tracking configuration may identify a backoff parameter, an LPF response, or a PA response for the UE 115-*f* to use when compensating for bandwidth-limited envelope tracking distortion. In some examples, the backoff parameter, the LPF response, or the PA response may be indicated per resource allocation, per MCS, or per bandwidth. Additionally or alternatively, the PA response may be indicated as a function of the LPF response and the backoff parameter. In some examples, the control signaling may include one or more of an RRC message, a MAC-CE, or DCI, among other examples.

The bandwidth-limited envelope tracking configuration may also indicate multiplexing information related to the UE 115-*g* and various other UEs (not shown). For example, the bandwidth-limited envelope tracking configuration may indicate one or more of a frequency allocation, an MCS, or reference signal information corresponding to the UE 115-*g*. The UE 115-*f* may use this multiplexing information to perform a slicing operation (e.g., hard slicer or no slicer) on the first downlink message (e.g., if the first downlink message is multiplexed with other downlink messages).

At 1015, the base station 105-*d* may transmit a request for the UE 115-*f* to compensate for downlink bandwidth-limited envelop tracking distortion using DPoD. The request may indicate one or more of an LPF response, a backoff parameter, or a PA response for the UE 115-*f* to use when performing bandwidth-limited envelope tracking DPoD. In some examples, the base station 105-*d* may transmit the request via DCI. At 1020, the UE 115-*f* may activate downlink bandwidth-limited envelope tracking DPoD based on receiving the request. Specifically, the UE 115-*f* may configure a PA model based on the request, and may use the PA model to perform downlink bandwidth-limited envelope tracking DPoD.

At 1025, the base station 105-*d* may transmit the first downlink message (e.g., a wideband signal) to the UE 115-*f* using bandwidth-limited envelope tracking. In some examples, the base station 105-*d* may transmit the first downlink message over an extended bandwidth based on a capability of the UE 115-*f* to perform bandwidth-limited envelope tracking DPoD over an extended bandwidth. At 1030, the base station 105-*d* may transmit a second downlink message to the UE 115-*g*. In some examples, the first downlink message to the UE 115-*f* may be FDM-ed with the second downlink message to the UE 115-*g*. Specifically, the base station 105-*d* may multiplex the first downlink message with the second downlink message (e.g., and other downlink messages) in accordance with the multiplexing information (e.g., frequency allocation, MCS, reference signal information) indicated by the control signaling.

For example, the base station 105-*d* may generate an input signal that includes both the first downlink message and the second downlink message, and may filter the input signal using an LPF. Alternatively, the input signal may be filtered without using an LPF (e.g., due to hardware or circuitry constraints of the base station 105-*d*). Accordingly, the base station 105-*d* may generate a filtered envelope response based on performing an envelope extraction procedure on the filtered input signal. Upon generating the filtered envelope response, the base station 105-*d* may amplify (e.g., using a PA) an instantaneous signal envelope of the input signal or a combination of the filtered envelope response and a backoff parameter. For example, if the instantaneous signal envelope of the input signal is less than the combination of the filtered envelope response and the backoff parameter, the base station 105-*d* may amplify the instantaneous signal envelope of the input signal. In contrast, if the combination of the filtered envelope response and the backoff parameter is less than the instantaneous signal envelope of the input signal, the base station 105-*d* may amplify the combination of the filtered envelope response and the backoff parameter.

At 1030, the UE 115-*f* may decode the first downlink message using a distortion correcting algorithm (e.g., DPoD) that is configured based on the envelope tracking configuration of the base station 105-*d*. In some examples, the UE 115-*f* may configure the distortion correcting algorithm based on receiving one or more reference signals from the base station 105-*d*. Specifically, the UE 115-*f* may generate a PA model based on the received reference signals, and may use the PA model to perform DPoD. To decode the first downlink message, the UE 115-*f* may receive an input signal that includes the first downlink message, and may perform one or more of an FFT, a CP removal procedure, a slicing procedure (e.g., hard slicer or no slicer), an IFFT, or a CP addition procedure on the received input signal. Accordingly, the UE 115-*f* may generate a first distortion parameter (e.g., α) and a second distortion parameter (e.g., d) based on inputting the received input signal to the PA model, and may use the first distortion parameter as well as the second distortion parameter to decode the first downlink message.

The process flow 1000 may support techniques for reduced power consumption at the base station 105-*d* and improved communication reliability at the UE 115-*f*. For example, the techniques and operations described in the process flow 1000 may enable the base station 105-*d* to transmit a downlink message (e.g., a wideband signal) to the UE 115-*f* using a bandwidth-limited envelope tracking configuration, which may reduce an amount of power consumed by a PA of the base station 105-*d* during transmission of the downlink message. In addition, the techniques and operations described in the process flow 1000 may enable the UE 115-*f* to compensate for bandwidth-limited envelope tracking distortions in the downlink message, which may increase the likelihood of the UE 115-*f* successfully receiving the downlink message, among other benefits.

Figure 11:
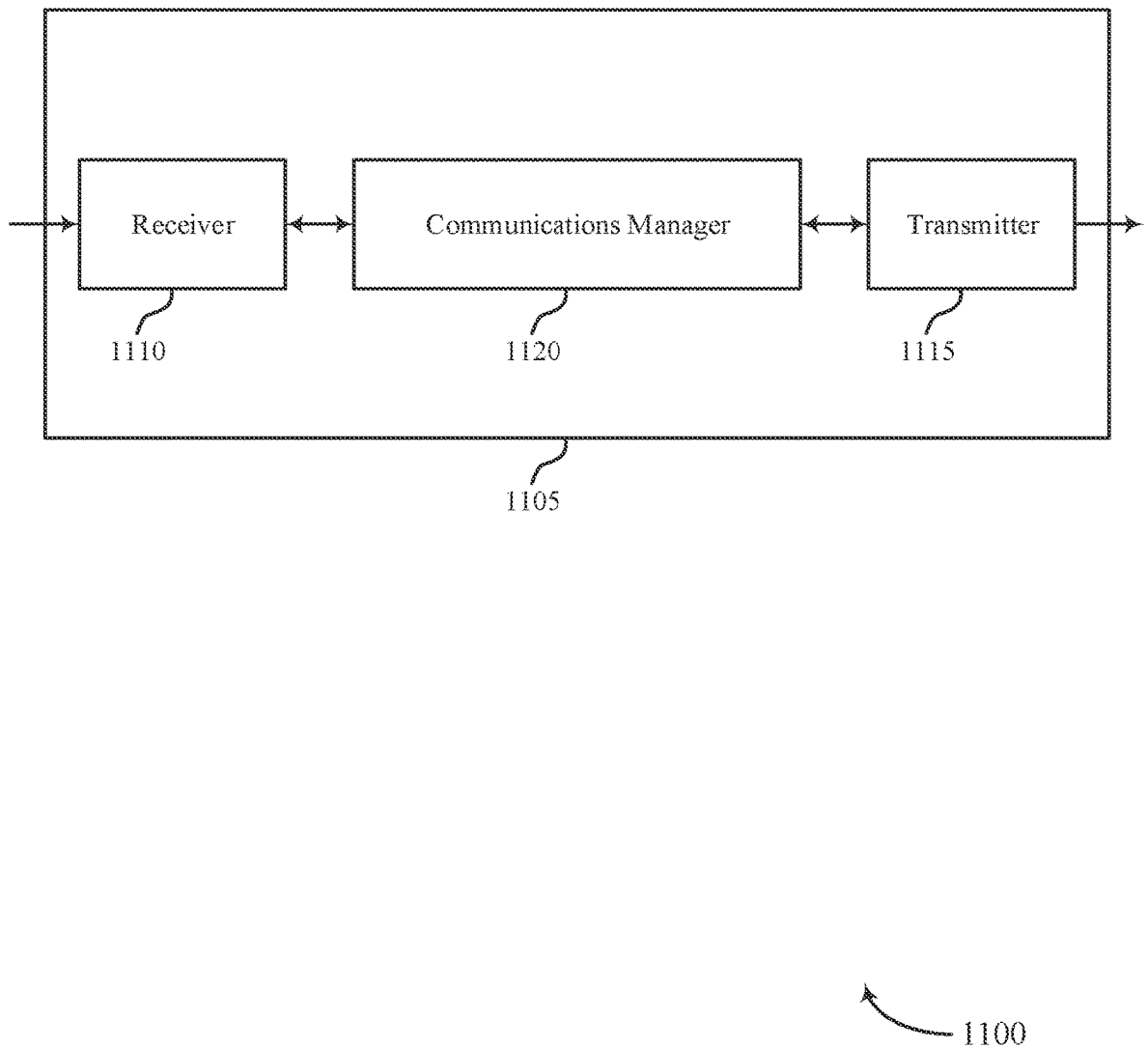
FIGS. 11 and 12 show diagrams of devices that support techniques for bandwidth-limited envelope tracking using DPoD in accordance with aspects of the present disclosure.

FIG. 11 shows a diagram 1100 of a device 1105 that supports techniques for bandwidth-limited envelope tracking using DPoD in accordance with aspects of the present disclosure. The device 1105 may be an example of aspects of a UE 115 as described herein. The device 1105 may include a receiver 1110, a transmitter 1115, and a communications manager 1120. The device 1105 may also include a processor. Each of these components may be in communication with one another (e.g., via one or more buses).

The receiver 1110 may provide a means for receiving information such as packets, user data, control information, or any combination thereof associated with various information channels (e.g., control channels, data channels, information channels related to techniques for bandwidth-limited envelope tracking using DPoD). Information may be passed on to other components of the device 1105. The receiver 1110 may utilize a single antenna or a multiple antennas.

The transmitter 1115 may provide a means for transmitting signals generated by other components of the device 1105. For example, the transmitter 1115 may transmit information such as packets, user data, control information, or any combination thereof associated with various information channels (e.g., control channels, data channels, information channels related to techniques for bandwidth-limited envelope tracking using DPoD). In some examples, the transmitter 1115 may be co-located with a receiver 1110 in a transceiver module. The transmitter 1115 may utilize a single antenna or a multiple antennas.

The communications manager 1120, the receiver 1110, the transmitter 1115, or various combinations thereof or various components thereof may be examples of means for performing various aspects of techniques for bandwidth-limited envelope tracking using DPoD as described herein. For example, the communications manager 1120, the receiver 1110, the transmitter 1115, or various combinations or components thereof may support a method for performing one or more of the functions described herein.

In some examples, the communications manager 1120, the receiver 1110, the transmitter 1115, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 1120, the receiver 1110, the transmitter 1115, or various combinations or components thereof may be implemented in code (e.g., as communications management software or firmware) executed by a processor. If implemented in code executed by a processor, the functions of the communications manager 1120, the receiver 1110, the transmitter 1115, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 1120 may be configured to perform various operations (e.g., receiving, monitoring, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to receive information, transmit information, or perform various other operations as described herein.

The communications manager 1120 may support wireless communications at the device 1105 in accordance with examples as disclosed herein. For example, the communications manager 1120 may be configured as or otherwise support a means for transmitting, to a base station, a capability message indicating a capability of the device 1105 to perform envelope tracking, and further indicating an envelope tracking configuration to be used for transmission of an uplink message. The communications manager 1120 may be configured as or otherwise support a means for receiving, from the base station and based on the capability message, a request for the device 1105 to activate the envelope tracking. The communications manager 1120 may be configured as or otherwise support a means for transmitting, to the base station and based on the request, the uplink message in accordance with the envelope tracking configuration.

Additionally or alternatively, the communications manager 1120 may support wireless communications at the device 1105 in accordance with other examples as disclosed herein. For example, the communications manager 1120 may be configured as or otherwise support a means for transmitting, to a base station, a capability message indicating a capability of the device 1105 to compensate for envelope tracking distortion. The communications manager 1120 may be configured as or otherwise support a means for receiving, from the base station and based on the capability message, control signaling indicating an envelope tracking configuration to be used for transmission of a downlink message, the envelope tracking configuration indicating multiplexing information associated with one or more other UEs. The communications manager 1120 may be configured as or otherwise support a means for receiving the downlink message from the base station in accordance with the envelope tracking configuration.

By including or configuring the communications manager 1120 in accordance with examples as described herein, the device 1105 (e.g., a processor controlling or otherwise coupled to the receiver 1110, the transmitter 1115, the communications manager 1120, or a combination thereof) may support techniques for reduced power consumption based on using bandwidth-limited envelope tracking for wideband signal transmissions. For example, configuring the device 1105 to use bandwidth-limited envelope tracking in accordance with the described techniques may enable a PA of the device 1105 to amplify wideband signals with greater power efficiency, among other benefits.

Figure 12:
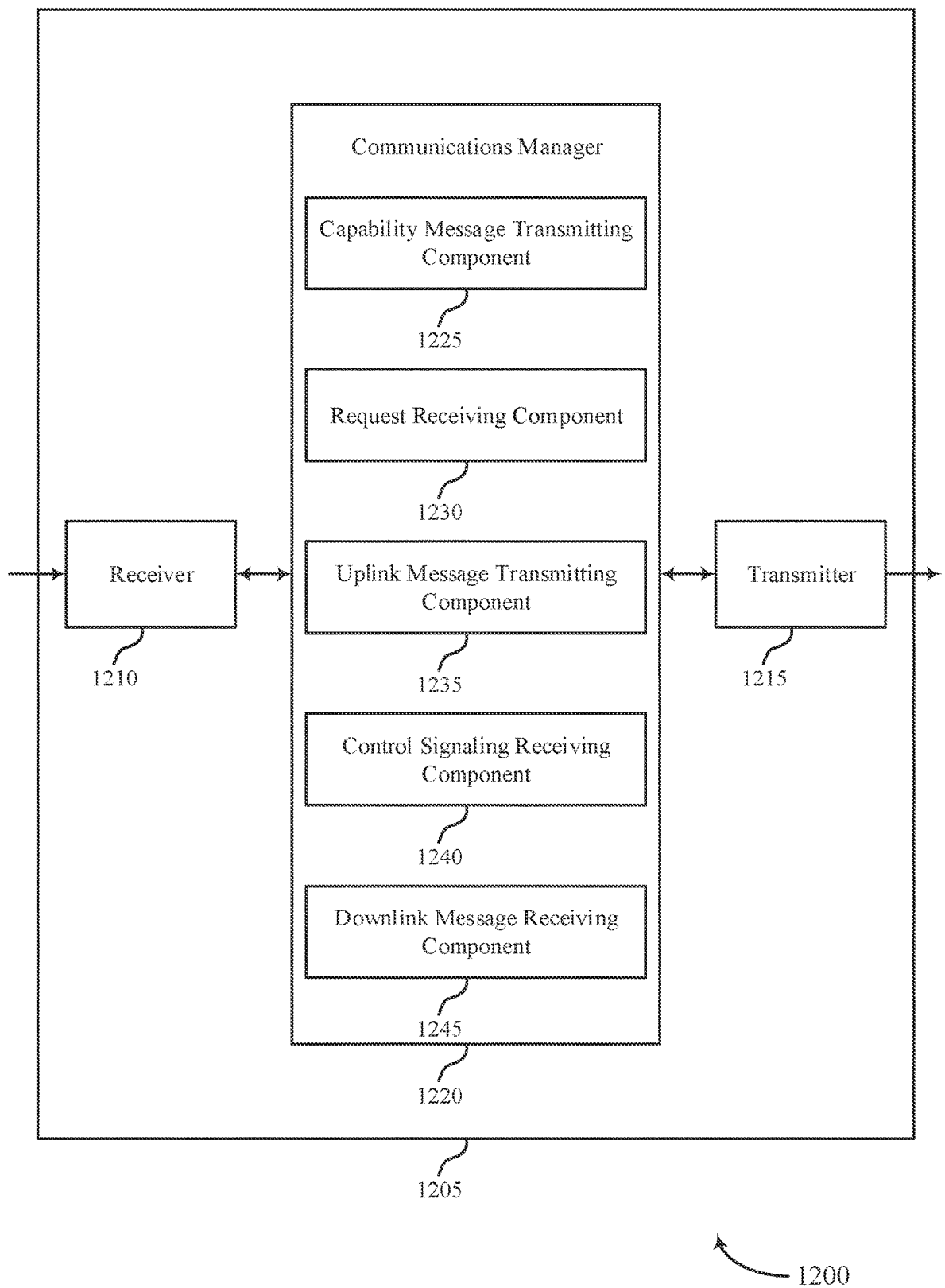

FIG. 12 shows a diagram 1200 of a device 1205 that supports techniques for bandwidth-limited envelope tracking using DPoD in accordance with aspects of the present disclosure. The device 1205 may be an example of aspects of a device 1105 or a UE 115 as described herein. The device 1205 may include a receiver 1210, a transmitter 1215, and a communications manager 1220. The device 1205 may also include a processor. Each of these components may be in communication with one another (e.g., via one or more buses).

The receiver 1210 may provide a means for receiving information such as packets, user data, control information, or any combination thereof associated with various information channels (e.g., control channels, data channels, information channels related to techniques for bandwidth-limited envelope tracking using DPoD). Information may be passed on to other components of the device 1205. The receiver 1210 may utilize a single antenna or a multiple antennas.

The transmitter 1215 may provide a means for transmitting signals generated by other components of the device 1205. For example, the transmitter 1215 may transmit information such as packets, user data, control information, or any combination thereof associated with various information channels (e.g., control channels, data channels, information channels related to techniques for bandwidth-limited envelope tracking using DPoD). In some examples, the transmitter 1215 may be co-located with a receiver 1210 in a transceiver module. The transmitter 1215 may utilize a single antenna or a multiple antennas.

The device 1205, or various components thereof, may be an example of means for performing various aspects of techniques for bandwidth-limited envelope tracking using DPoD as described herein. For example, the communications manager 1220 may include a capability message transmitting component 1225, a request receiving component 1230, an uplink message transmitting component 1235, a control signaling receiving component 1240, a downlink message receiving component 1245, or any combination thereof. The communications manager 1220 may be an example of aspects of a communications manager 1120 as described herein. In some examples, the communications manager 1220, or various components thereof, may be configured to perform various operations (e.g., receiving, monitoring, transmitting) using or otherwise in cooperation with the receiver 1210, the transmitter 1215, or both. For example, the communications manager 1220 may receive information from the receiver 1210, send information to the transmitter 1215, or be integrated in combination with the receiver 1210, the transmitter 1215, or both to receive information, transmit information, or perform various other operations as described herein.

The communications manager 1220 may support wireless communications at the device 1205 in accordance with examples as disclosed herein. The capability message transmitting component 1225 may be configured as or otherwise support a means for transmitting, to a base station, a capability message indicating a capability of the device 1205 to perform envelope tracking, and further indicating an envelope tracking configuration to be used for transmission of an uplink message. The request receiving component 1230 may be configured as or otherwise support a means for receiving, from the base station and based on the capability message, a request for the device 1205 to activate the envelope tracking. The uplink message transmitting component 1235 may be configured as or otherwise support a means for transmitting, to the base station and based on the request, the uplink message in accordance with the envelope tracking configuration.

Additionally or alternatively, the communications manager 1220 may support wireless communications at the device 1205 in accordance with other examples as disclosed herein. The capability message transmitting component 1225 may be configured as or otherwise support a means for transmitting, to a base station, a capability message indicating a capability of the device 1205 to compensate for envelope tracking distortion. The control signaling receiving component 1240 may be configured as or otherwise support a means for receiving, from the base station and based on the capability message, control signaling indicating an envelope tracking configuration to be used for transmission of a downlink message, the envelope tracking configuration indicating multiplexing information associated with one or more other UEs. The downlink message receiving component 1245 may be configured as or otherwise support a means for receiving the downlink message from the base station in accordance with the envelope tracking configuration.

Figure 13:
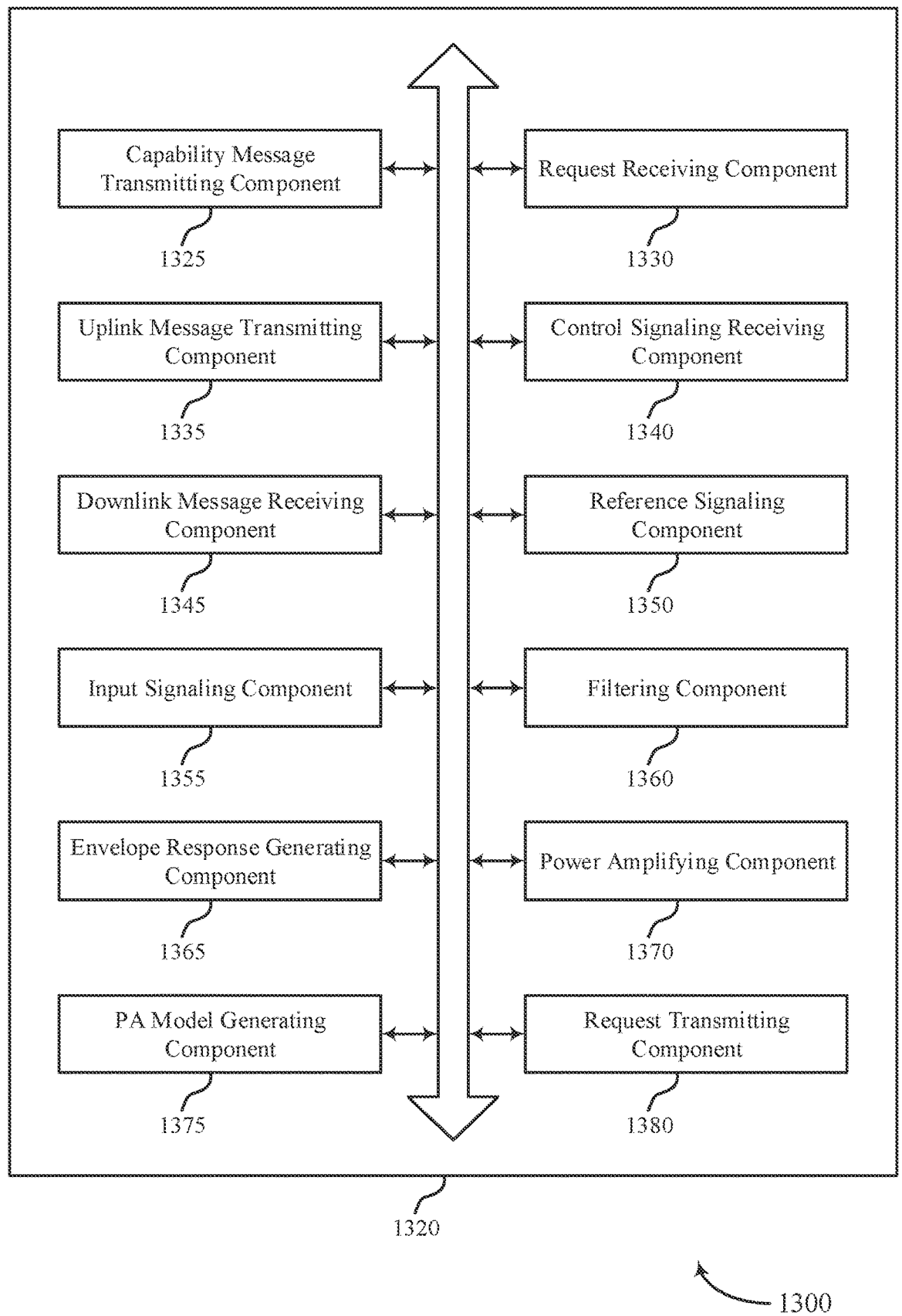
FIG. 13 shows a diagram of a communications manager that supports techniques for bandwidth-limited envelope tracking using DPoD in accordance with aspects of the present disclosure.

FIG. 13 shows a diagram 1300 of a communications manager 1320 that supports techniques for bandwidth-limited envelope tracking using DPoD in accordance with aspects of the present disclosure. The communications manager 1320 may be an example of aspects of a communications manager 1120, a communications manager 1220, or both, as described herein. The communications manager 1320, or various components thereof, may be an example of means for performing various aspects of techniques for bandwidth-limited envelope tracking using DPoD as described herein. For example, the communications manager 1320 may include a capability message transmitting component 1325, a request receiving component 1330, an uplink message transmitting component 1335, a control signaling receiving component 1340, a downlink message receiving component 1345, a reference signaling component 1350, an input signaling component 1355, a filtering component 1360, an envelope response generating component 1365, a power amplifying component 1370, a PA model generating component 1375, a request transmitting component 1380, or any combination thereof. Each of these components may communicate, directly or indirectly, with one another (e.g., via one or more buses).

The communications manager 1320 may support wireless communications at the device 1305 in accordance with examples as disclosed herein. The capability message transmitting component 1325 may be configured as or otherwise support a means for transmitting, to a base station, a capability message indicating a capability of the device 1305 to perform envelope tracking, and further indicating an envelope tracking configuration to be used for transmission of an uplink message. The request receiving component 1330 may be configured as or otherwise support a means for receiving, from the base station and based on the capability message, a request for the device 1305 to activate the envelope tracking. The uplink message transmitting component 1335 may be configured as or otherwise support a means for transmitting, to the base station and based on the request, the uplink message in accordance with the envelope tracking configuration.

In some examples, to support transmitting the capability message, the capability message transmitting component 1325 may be configured as or otherwise support a means for transmitting the capability message indicating the capability of the device 1305 to perform the envelope tracking that is bandwidth-limited envelope tracking, and further indicating a capability of the device 1305 to use an extended bandwidth that is larger than a bandwidth supported for the bandwidth-limited envelope tracking.

In some examples, to support transmitting the capability message, the capability message transmitting component 1325 may be configured as or otherwise support a means for transmitting the capability message indicating the envelope tracking configuration that identifies a LPF response, a backoff parameter, a PA response, or a combination thereof.

In some examples, the capability message transmitting component 1325 may be configured as or otherwise support a means for transmitting the capability message indicating the envelope tracking configuration that identifies a set of LPF responses, where the set of LPF responses is preconfigured or associated with multiple bandwidths to be used for the envelope tracking. In some examples, the request receiving component 1330 may be configured as or otherwise support a means for receiving the request indicating a LPF response from the set of LPF responses to use for generation of the uplink message.

In some examples, the control signaling receiving component 1340 may be configured as or otherwise support a means for receiving, from the base station, control signaling indicating an uplink resource allocation to be used for transmission of the uplink message, an MCS to be used for transmission of the uplink message, or both, where transmitting the uplink message to the base station is based on the control signaling.

In some examples, the control signaling receiving component 1340 may be configured as or otherwise support a means for receiving control signaling indicating a backoff parameter per MCS. In some examples, the uplink message transmitting component 1335 may be configured as or otherwise support a means for transmitting, based on the control signaling, the uplink message in accordance with the backoff parameter per MCS.

In some examples, to support transmitting the capability message, the capability message transmitting component 1325 may be configured as or otherwise support a means for transmitting the capability message indicating the envelope tracking configuration that identifies a PA response as a function of a LPF response and a backoff parameter.

In some examples, the reference signaling component 1350 may be configured as or otherwise support a means for transmitting one or more reference signals to the base station in a same bandwidth as used for transmission of the uplink message.

In some examples, the input signaling component 1355 may be configured as or otherwise support a means for generating an input signal associated with the uplink message. In some examples, the filtering component 1360 may be configured as or otherwise support a means for filtering the input signal using a LPF. In some examples, the envelope response generating component 1365 may be configured as or otherwise support a means for generating a filtered envelope response based on performing an envelope extraction procedure on the filtered input signal. In some examples, the power amplifying component 1370 may be configured as or otherwise support a means for performing a power amplification procedure on a signal envelope of the input signal or on a combination of the filtered envelope response and a backoff parameter, where transmitting the uplink message is based on performing the power amplification procedure.

Additionally or alternatively, the communications manager 1320 may support wireless communications at the device 1305 in accordance with other examples as disclosed herein. In some examples, the capability message transmitting component 1325 may be configured as or otherwise support a means for transmitting, to a base station, a capability message indicating a capability of the device 1305 to compensate for envelope tracking distortion. The control signaling receiving component 1340 may be configured as or otherwise support a means for receiving, from the base station and based on the capability message, control signaling indicating an envelope tracking configuration to be used for transmission of a downlink message, the envelope tracking configuration indicating multiplexing information associated with one or more other UEs. The downlink message receiving component 1345 may be configured as or otherwise support a means for receiving the downlink message from the base station in accordance with the envelope tracking configuration.

In some examples, the request receiving component 1330 may be configured as or otherwise support a means for receiving, from the base station and based on the capability message, a request for the device 1305 to compensate for bandwidth-limited envelope tracking distortion.

In some examples, to support receiving the control signaling, the control signaling receiving component 1340 may be configured as or otherwise support a means for receiving, from the base station, the control signaling indicating a downlink resource allocation to be used for transmission of the downlink message, an MCS to be used for transmission of the downlink message, a bandwidth to be used for transmission of the downlink message, or a combination thereof, where receiving the downlink message from the base station is based on the control signaling.

In some examples, to support receiving the control signaling, the control signaling receiving component 1340 may be configured as or otherwise support a means for receiving, from the base station, the control signaling indicating the envelope tracking configuration that identifies compensation to be applied for bandwidth-limited envelope tracking distortion for one or more MCSs, for one or more bandwidths, for one or more resource allocations, or any combination thereof.

In some examples, the downlink message receiving component 1345 may be configured as or otherwise support a means for decoding the downlink message using a distortion correcting algorithm that is configured based on the envelope tracking configuration.

In some examples, the capability message transmitting component 1325 may be configured as or otherwise support a means for transmitting the capability message indicating the capability of the device 1305 to compensate for the envelope tracking distortion using bandwidth-limited envelope tracking distortion resulting from transmission of the downlink message over an extended bandwidth, the capability message further indicating a set of backoff parameters. In some examples, the control signaling receiving component 1340 may be configured as or otherwise support a means for receiving, from the base station, the control signaling indicating a first request for the device 1305 to compensate for the bandwidth-limited envelope tracking distortion resulting from transmission of the downlink message over the extended bandwidth, and a second request for the device 1305 to compensate for the bandwidth-limited envelope tracking distortion using a backoff parameter from the set of backoff parameters. In some examples, the downlink message receiving component 1345 may be configured as or otherwise support a means for decoding the downlink message received over the extended bandwidth in accordance with the control signaling.

In some examples, the capability message transmitting component 1325 may be configured as or otherwise support a means for transmitting the capability message indicating a set of LPF responses, where the set of LPF responses is preconfigured or associated with multiple bandwidths to be used for transmission of the downlink message. In some examples, the control signaling receiving component 1340 may be configured as or otherwise support a means for receiving, from the base station, the control signaling indicating a LPF response from the set of LPF responses being used for generation of the downlink message.

In some examples, to support receiving the control signaling, the control signaling receiving component 1340 may be configured as or otherwise support a means for receiving the control signaling indicating the envelope tracking configuration that identifies a PA response as a function of a LPF response and a backoff parameter.

In some examples, the reference signaling component 1350 may be configured as or otherwise support a means for receiving one or more reference signals from the base station. In some examples, the PA model generating component 1375 may be configured as or otherwise support a means for generating a PA model based on the one or more reference signals. In some examples, the downlink message receiving component 1345 may be configured as or otherwise support a means for decoding the downlink message using the PA model.

In some examples, the input signaling component 1355 may be configured as or otherwise support a means for receiving an input signal that includes the downlink message. In some examples, the input signaling component 1355 may be configured as or otherwise support a means for performing one or more of an FFT, a CP removal procedure, a slicing procedure for each UE of the one or more other UEs, an IFFT, or a CP addition procedure on the input signal. In some examples, the PA model generating component 1375 may be configured as or otherwise support a means for generating a first distortion parameter and a second distortion parameter based on inputting the input signal to the PA model, where decoding the downlink message is based on the first distortion parameter and the second distortion parameter.

In some examples, the request transmitting component 1380 may be configured as or otherwise support a means for transmitting, to the base station and based on the capability of the device 1305 to compensate for the envelope tracking distortion, a request that indicates a backoff parameter being used for transmission of the downlink message, a backoff parameter per MCS, or both, where receiving the downlink message is based on the request.

Figure 14:
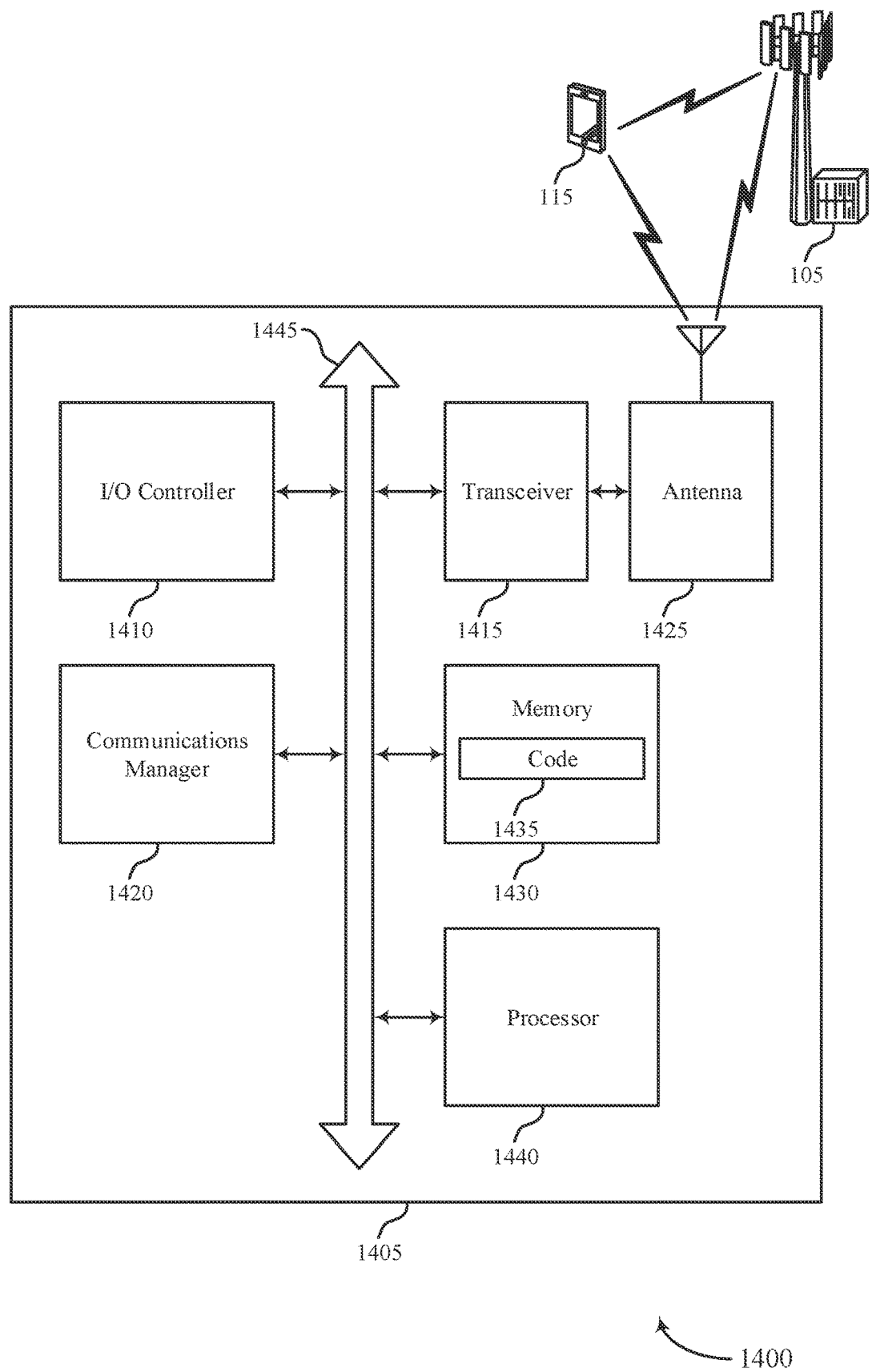
FIG. 14 shows a diagram of a system including a device that supports techniques for bandwidth-limited envelope tracking using DPoD in accordance with aspects of the present disclosure.

FIG. 14 shows a diagram of a system 1400 including a device 1405 that supports techniques for bandwidth-limited envelope tracking using DPoD in accordance with aspects of the present disclosure. The device 1405 may be an example of or include the components of a device 1105, a device 1205, or a UE 115 as described herein. The device 1405 may communicate wirelessly with one or more base stations 105, UEs 115, or any combination thereof. The device 1405 may include components for bi-directional voice and data communications including components for transmitting and receiving communications, such as a communications manager 1420, an input/output (I/O) controller 1410, a transceiver 1415, an antenna 1425, a memory 1430, code 1435, and a processor 1440. These components may be in electronic communication or otherwise coupled (e.g., operatively, communicatively, functionally, electronically, electrically) via one or more buses (e.g., a bus 1445).

The I/O controller 1410 may manage input and output signals for the device 1405. The I/O controller 1410 may also manage peripherals not integrated into the device 1405. In some cases, the I/O controller 1410 may represent a physical connection or port to an external peripheral. In some cases, the I/O controller 1410 may utilize an operating system such as iOS®, ANDROID®, MS-DOS®, MS-WINDOWS®, OS/2®, UNIX®, LINUX®, or another known operating system. Additionally or alternatively, the I/O controller 1410 may represent or interact with a modem, a keyboard, a mouse, a touchscreen, or a similar device. In some cases, the I/O controller 1410 may be implemented as part of a processor, such as the processor 1440. In some cases, a user may interact with the device 1405 via the I/O controller 1410 or via hardware components controlled by the I/O controller 1410.

In some cases, the device 1405 may include a single antenna 1425. However, in some other cases, the device 1405 may have more than one antenna 1425, which may be capable of concurrently transmitting or receiving multiple wireless transmissions. The transceiver 1415 may communicate bi-directionally, via the one or more antennas 1425, wired, or wireless links as described herein. For example, the transceiver 1415 may represent a wireless transceiver and may communicate bi-directionally with another wireless transceiver. The transceiver 1415 may also include a modem to modulate the packets, to provide the modulated packets to one or more antennas 1425 for transmission, and to demodulate packets received from the one or more antennas 1425. The transceiver 1415, or the transceiver 1415 and one or more antennas 1425, may be an example of a transmitter 1115, a transmitter 1215, a receiver 1110, a receiver 1210, or any combination thereof or component thereof, as described herein.

The memory 1430 may include random access memory (RAM) and read-only memory (ROM). The memory 1430 may store computer-readable, computer-executable code 1435 including instructions that, when executed by the processor 1440, cause the device 1405 to perform various functions described herein. The code 1435 may be stored in a non-transitory computer-readable medium such as system memory or another type of memory. In some cases, the code 1435 may not be directly executable by the processor 1440 but may cause a computer (e.g., when compiled and executed) to perform functions described herein. In some cases, the memory 1430 may contain, among other things, a basic I/O system (BIOS) which may control basic hardware or software operation such as the interaction with peripheral components or devices.

The processor 1440 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1440 may be configured to operate a memory array using a memory controller. In some other cases, a memory controller may be integrated into the processor 1440. The processor 1440 may be configured to execute computer-readable instructions stored in a memory (e.g., the memory 1430) to cause the device 1405 to perform various functions (e.g., functions or tasks supporting techniques for bandwidth-limited envelope tracking using DPoD). For example, the device 1405 or a component of the device 1405 may include a processor 1440 and memory 1430 coupled to the processor 1440, the processor 1440 and memory 1430 configured to perform various functions described herein.

The communications manager 1420 may support wireless communications at the device 1405 in accordance with examples as disclosed herein. For example, the communications manager 1420 may be configured as or otherwise support a means for transmitting, to a base station, a capability message indicating a capability of the device 1405 to perform envelope tracking, and further indicating an envelope tracking configuration to be used for transmission of an uplink message. The communications manager 1420 may be configured as or otherwise support a means for receiving, from the base station and based on the capability message, a request for the device 1405 to activate the envelope tracking. The communications manager 1420 may be configured as or otherwise support a means for transmitting, to the base station and based on the request, the uplink message in accordance with the envelope tracking configuration.

Additionally or alternatively, the communications manager 1420 may support wireless communications at the device 1405 in accordance with other examples as disclosed herein. For example, the communications manager 1420 may be configured as or otherwise support a means for transmitting, to a base station, a capability message indicating a capability of the device 1405 to compensate for envelope tracking distortion. The communications manager 1420 may be configured as or otherwise support a means for receiving, from the base station and based on the capability message, control signaling indicating an envelope tracking configuration to be used for transmission of a downlink message, the envelope tracking configuration indicating multiplexing information associated with one or more other UEs. The communications manager 1420 may be configured as or otherwise support a means for receiving the downlink message from the base station in accordance with the envelope tracking configuration.

By including or configuring the communications manager 1420 in accordance with examples as described herein, the device 1405 may support techniques for improved communication reliability based on using DPoD to correct distortions caused by bandwidth-limited envelope tracking. Configuring the device 1405 to compensate for bandwidth-limited envelope tracking distortions in accordance with the described techniques may enable the device 1405 to receive wideband signal transmissions with greater reliability, among other benefits.

In some examples, the communications manager 1420 may be configured to perform various operations (e.g., receiving, monitoring, transmitting) using or otherwise in cooperation with the transceiver 1415, the one or more antennas 1425, or any combination thereof. Although the communications manager 1420 is illustrated as a separate component, in some examples, one or more functions described with reference to the communications manager 1420 may be supported by or performed by the processor 1440, the memory 1430, the code 1435, or any combination thereof. For example, the code 1435 may include instructions executable by the processor 1440 to cause the device 1405 to perform various aspects of techniques for bandwidth-limited envelope tracking using DPoD as described herein, or the processor 1440 and the memory 1430 may be otherwise configured to perform or support such operations.

Figure 15:
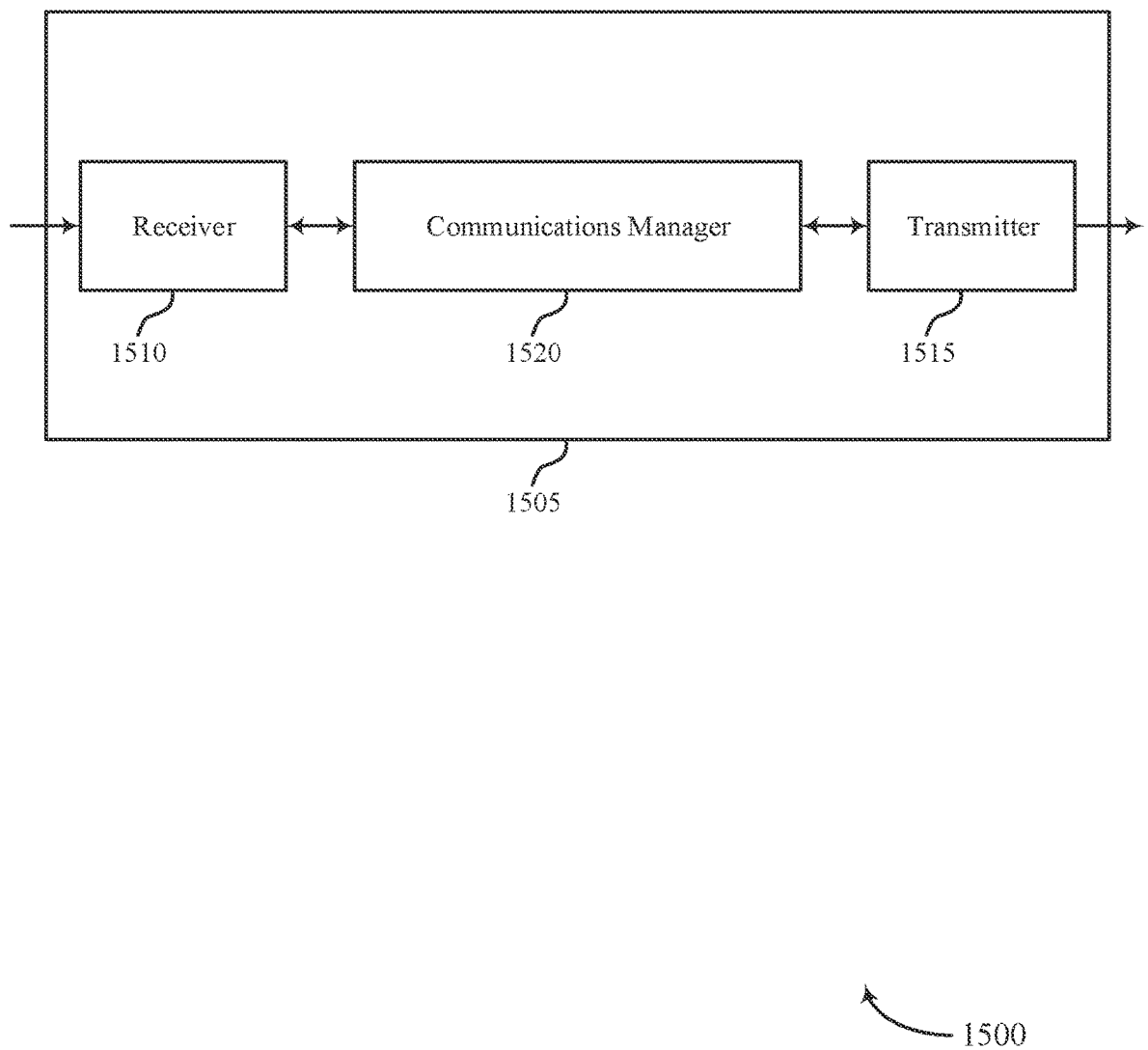
FIGS. 15 and 16 show diagrams of devices that support techniques for bandwidth-limited envelope tracking using DPoD in accordance with aspects of the present disclosure.

FIG. 15 shows a diagram 1500 of a device 1505 that supports techniques for bandwidth-limited envelope tracking using DPoD in accordance with aspects of the present disclosure. The device 1505 may be an example of aspects of a base station 105 as described herein. The device 1505 may include a receiver 1510, a transmitter 1515, and a communications manager 1520. The device 1505 may also include a processor. Each of these components may be in communication with one another (e.g., via one or more buses).

The receiver 1510 may provide a means for receiving information such as packets, user data, control information, or any combination thereof associated with various information channels (e.g., control channels, data channels, information channels related to techniques for bandwidth-limited envelope tracking using DPoD). Information may be passed on to other components of the device 1505. The receiver 1510 may utilize a single antenna or a multiple antennas.

The transmitter 1515 may provide a means for transmitting signals generated by other components of the device 1505. For example, the transmitter 1515 may transmit information such as packets, user data, control information, or any combination thereof associated with various information channels (e.g., control channels, data channels, information channels related to techniques for bandwidth-limited envelope tracking using DPoD). In some examples, the transmitter 1515 may be co-located with a receiver 1510 in a transceiver module. The transmitter 1515 may utilize a single antenna or a multiple antennas.

The communications manager 1520, the receiver 1510, the transmitter 1515, or various combinations thereof or various components thereof may be examples of means for performing various aspects of techniques for bandwidth-limited envelope tracking using DPoD as described herein. For example, the communications manager 1520, the receiver 1510, the transmitter 1515, or various combinations or components thereof may support a method for performing one or more of the functions described herein.

In some examples, the communications manager 1520, the receiver 1510, the transmitter 1515, or various combinations or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 1520, the receiver 1510, the transmitter 1515, or various combinations or components thereof may be implemented in code (e.g., as communications management software or firmware) executed by a processor. If implemented in code executed by a processor, the functions of the communications manager 1520, the receiver 1510, the transmitter 1515, or various combinations or components thereof may be performed by a general-purpose processor, a DSP, a CPU, an A SIC, an FPGA, or any combination of these or other programmable logic devices (e.g., configured as or otherwise supporting a means for performing the functions described in the present disclosure).

In some examples, the communications manager 1520 may be configured to perform various operations (e.g., receiving, monitoring, transmitting) using or otherwise in cooperation with the receiver 1510, the transmitter 1515, or both. For example, the communications manager 1520 may receive information from the receiver 1510, send information to the transmitter 1515, or be integrated in combination with the receiver 1510, the transmitter 1515, or both to receive information, transmit information, or perform various other operations as described herein.

The communications manager 1520 may support wireless communications at the device 1505 in accordance with examples as disclosed herein. For example, the communications manager 1520 may be configured as or otherwise support a means for receiving, from a UE (e.g., a UE 115), a capability message indicating a capability of the UE to perform envelope tracking, and further indicating an envelope tracking configuration to be used for transmission of an uplink message. The communications manager 1520 may be configured as or otherwise support a means for transmitting, to the UE and based on the capability message, a request for the UE to activate the envelope tracking. The communications manager 1520 may be configured as or otherwise support a means for receiving, from the UE and based on the request, the uplink message in accordance with the envelope tracking configuration.

Additionally or alternatively, the communications manager 1520 may support wireless communications at the device 1505 in accordance with other examples as disclosed herein. For example, the communications manager 1520 may be configured as or otherwise support a means for receiving, from a UE (e.g., a UE 115), a capability message indicating a capability of the UE to compensate for envelope tracking distortion. The communications manager 1520 may be configured as or otherwise support a means for transmitting, to the UE and based on the capability message, control signaling indicating an envelope tracking configuration to be used for transmission of a downlink message, the envelope tracking configuration indicating multiplexing information associated with one or more other UEs. The communications manager 1520 may be configured as or otherwise support a means for transmitting the downlink message to the UE in accordance with the envelope tracking configuration.

By including or configuring the communications manager 1520 in accordance with examples as described herein, the device 1505 (e.g., a processor controlling or otherwise coupled to the receiver 1510, the transmitter 1515, the communications manager 1520, or a combination thereof) may support techniques for reduced power consumption based on using bandwidth-limited envelope tracking to transmit wideband signals. Specifically, using bandwidth-limited envelope tracking for wideband signal transmissions may enable a PA of the device 1505 to amplify wideband signals with greater power efficiency, among other benefits.

Figure 16:
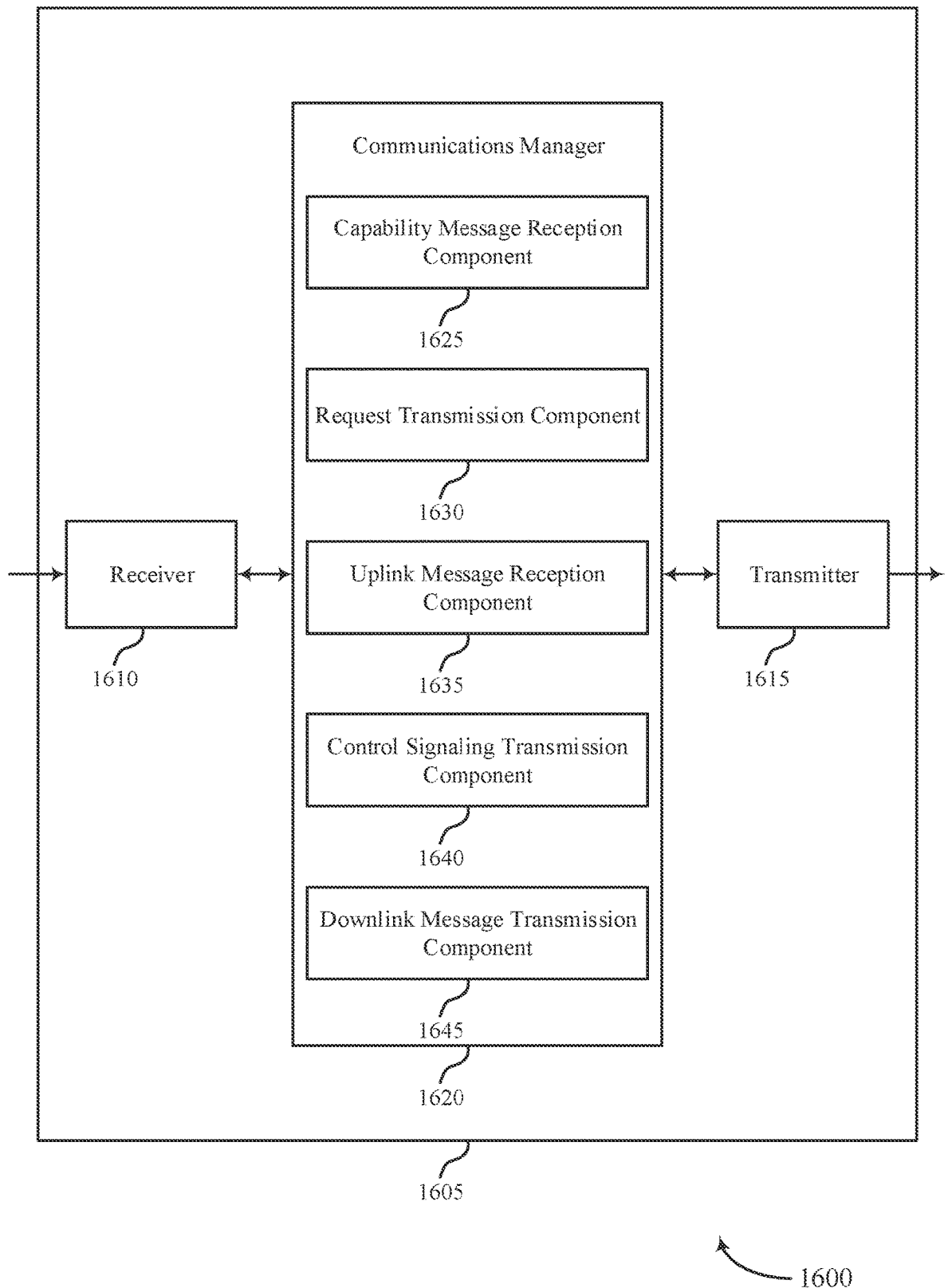

FIG. 16 shows a diagram 1600 of a device 1605 that supports techniques for bandwidth-limited envelope tracking using DPoD in accordance with aspects of the present disclosure. The device 1605 may be an example of aspects of a device 1505 or a base station 105 as described herein. The device 1605 may include a receiver 1610, a transmitter 1615, and a communications manager 1620. The device 1605 may also include a processor. Each of these components may be in communication with one another (e.g., via one or more buses).

The receiver 1610 may provide a means for receiving information such as packets, user data, control information, or any combination thereof associated with various information channels (e.g., control channels, data channels, information channels related to techniques for bandwidth-limited envelope tracking using DPoD). Information may be passed on to other components of the device 1605. The receiver 1610 may utilize a single antenna or a multiple antennas.

The transmitter 1615 may provide a means for transmitting signals generated by other components of the device 1605. For example, the transmitter 1615 may transmit information such as packets, user data, control information, or any combination thereof associated with various information channels (e.g., control channels, data channels, information channels related to techniques for bandwidth-limited envelope tracking using DPoD). In some examples, the transmitter 1615 may be co-located with a receiver 1610 in a transceiver module. The transmitter 1615 may utilize a single antenna or a multiple antennas.

The device 1605, or various components thereof, may be an example of means for performing various aspects of techniques for bandwidth-limited envelope tracking using DPoD as described herein. For example, the communications manager 1620 may include a capability message reception component 1625, a request transmission component 1630, an uplink message reception component 1635, a control signaling transmission component 1640, a downlink message transmission component 1645, or any combination thereof. The communications manager 1620 may be an example of aspects of a communications manager 1520 as described herein. In some examples, the communications manager 1620, or various components thereof, may be configured to perform various operations (e.g., receiving, monitoring, transmitting) using or otherwise in cooperation with the receiver 1610, the transmitter 1615, or both. For example, the communications manager 1620 may receive information from the receiver 1610, send information to the transmitter 1615, or be integrated in combination with the receiver 1610, the transmitter 1615, or both to receive information, transmit information, or perform various other operations as described herein.

The communications manager 1620 may support wireless communications at the device 1605 in accordance with examples as disclosed herein. The capability message reception component 1625 may be configured as or otherwise support a means for receiving, from a UE (e.g., a UE 115), a capability message indicating a capability of the UE to perform envelope tracking, and further indicating an envelope tracking configuration to be used for transmission of an uplink message. The request transmission component 1630 may be configured as or otherwise support a means for transmitting, to the UE and based on the capability message, a request for the UE to activate the envelope tracking. The uplink message reception component 1635 may be configured as or otherwise support a means for receiving, from the UE and based on the request, the uplink message in accordance with the envelope tracking configuration.

Additionally or alternatively, the communications manager 1620 may support wireless communications at the device 1605 in accordance with other examples as disclosed herein. The capability message reception component 1625 may be configured as or otherwise support a means for receiving, from a UE (e.g., a UE 115), a capability message indicating a capability of the UE to compensate for envelope tracking distortion. The control signaling transmission component 1640 may be configured as or otherwise support a means for transmitting, to the UE and based on the capability message, control signaling indicating an envelope tracking configuration to be used for transmission of a downlink message, the envelope tracking configuration indicating multiplexing information associated with one or more other UEs. The downlink message transmission component 1645 may be configured as or otherwise support a means for transmitting the downlink message to the UE in accordance with the envelope tracking configuration.

Figure 17:
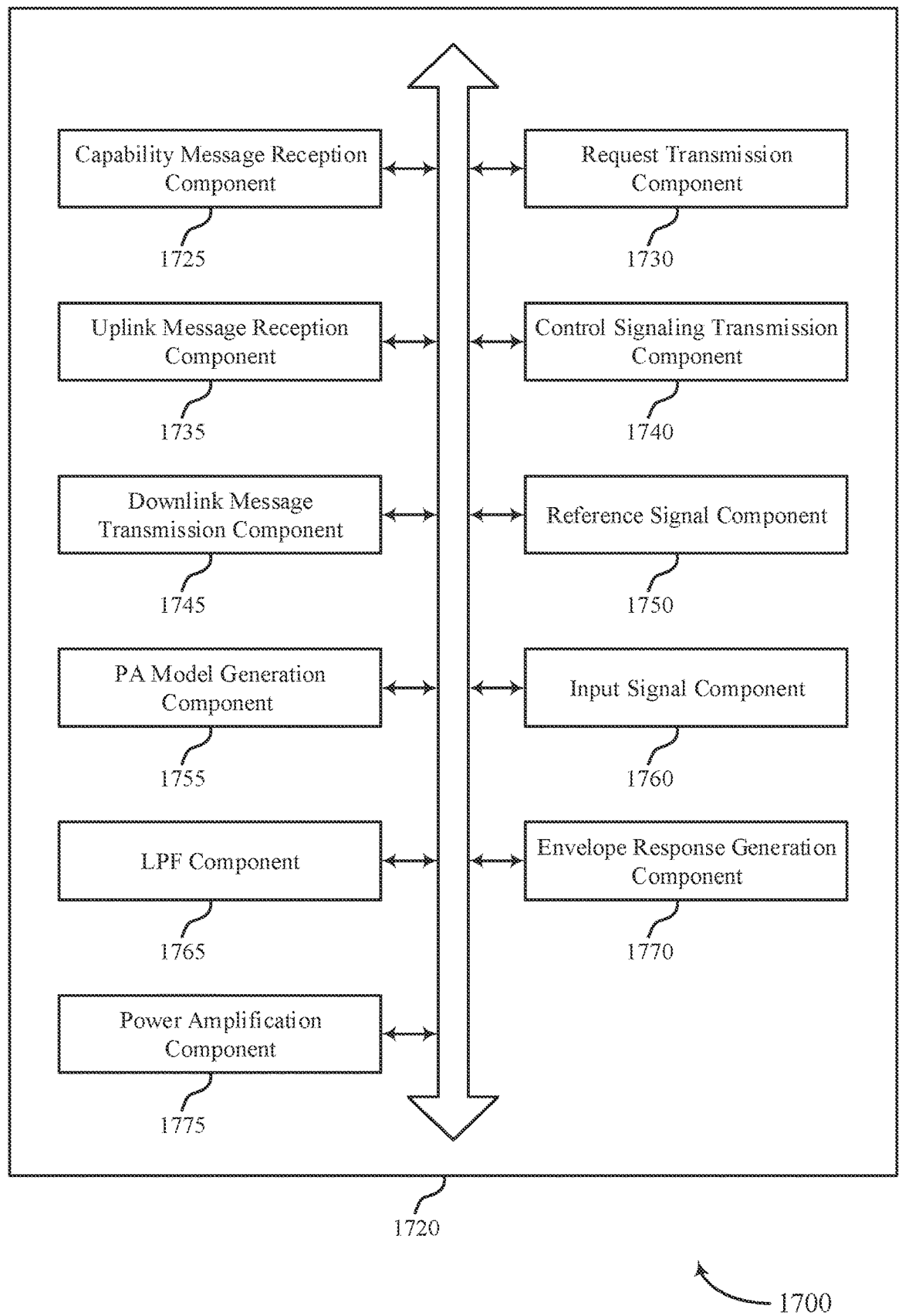
FIG. 17 shows a diagram of a communications manager that supports techniques for bandwidth-limited envelope tracking using DPoD in accordance with aspects of the present disclosure.

FIG. 17 shows a diagram 1700 of a communications manager 1720 that supports techniques for bandwidth-limited envelope tracking using DPoD in accordance with aspects of the present disclosure. The communications manager 1720 may be an example of aspects of a communications manager 1520, a communications manager 1620, or both, as described herein. The communications manager 1720, or various components thereof, may be an example of means for performing various aspects of techniques for bandwidth-limited envelope tracking using DPoD as described herein. For example, the communications manager 1720 may include a capability message reception component 1725, a request transmission component 1730, an uplink message reception component 1735, a control signaling transmission component 1740, a downlink message transmission component 1745, a reference signal component 1750, a PA model generation component 1755, an input signal component 1760, an LPF component 1765, an envelope response generation component 1770, a power amplification component 1775, or any combination thereof. Each of these components may communicate, directly or indirectly, with one another (e.g., via one or more buses).

The communications manager 1720 may support wireless communications at the device 1705 in accordance with examples as disclosed herein. The capability message reception component 1725 may be configured as or otherwise support a means for receiving, from a UE (e.g., a UE 115), a capability message indicating a capability of the UE to perform envelope tracking, and further indicating an envelope tracking configuration to be used for transmission of an uplink message. The request transmission component 1730 may be configured as or otherwise support a means for transmitting, to the UE and based on the capability message, a request for the UE to activate the envelope tracking. The uplink message reception component 1735 may be configured as or otherwise support a means for receiving, from the UE and based on the request, the uplink message in accordance with the envelope tracking configuration.

In some examples, the uplink message reception component 1735 may be configured as or otherwise support a means for decoding the uplink message using a distortion correcting algorithm that is configured based on the envelope tracking configuration.

In some examples, the reference signal component 1750 may be configured as or otherwise support a means for receiving one or more reference signals from the UE. In some examples, the PA model generation component 1755 may be configured as or otherwise support a means for generating a PA model based on the one or more reference signals. In some examples, the uplink message reception component 1735 may be configured as or otherwise support a means for decoding the uplink message using the PA model.

In some examples, the input signal component 1760 may be configured as or otherwise support a means for receiving an input signal that includes the uplink message. In some examples, the input signal component 1760 may be configured as or otherwise support a means for performing one or more of an FFT, a CP removal procedure, a slicing procedure, an IFFT, or a CP addition procedure on the input signal. In some examples, the PA model generation component 1755 may be configured as or otherwise support a means for generating a first distortion parameter and a second distortion parameter based on inputting the input signal to the PA model, where decoding the uplink message is based on the first distortion parameter and the second distortion parameter.

Additionally or alternatively, the communications manager 1720 may support wireless communications at the device 1705 in accordance with other examples as disclosed herein. In some examples, the capability message reception component 1725 may be configured as or otherwise support a means for receiving, from a UE, a capability message indicating a capability of the UE to compensate for envelope tracking distortion. The control signaling transmission component 1740 may be configured as or otherwise support a means for transmitting, to the UE and based on the capability message, control signaling indicating an envelope tracking configuration to be used for transmission of a downlink message, the envelope tracking configuration indicating multiplexing information associated with one or more other UEs. The downlink message transmission component 1745 may be configured as or otherwise support a means for transmitting the downlink message to the UE in accordance with the envelope tracking configuration.

In some examples, to support transmitting the control signaling, the control signaling transmission component 1740 may be configured as or otherwise support a means for transmitting the control signaling indicating the envelope tracking configuration that identifies FDM information associated with the one or more other UEs, a backoff parameter, a LPF response, a PA response, or a combination thereof. In some examples, the FDM information indicates a frequency allocation for each UE of the one or more other UEs, an MCS for each UE of the one or more other UEs, reference signal information for each UE of the one or more other UEs, or a combination thereof.

In some examples, the downlink message transmission component 1745 may be configured as or otherwise support a means for transmitting one or more downlink messages to the one or more other UEs in accordance with the FDM, where the one or more downlink messages are FDM-ed with the downlink message.

In some examples, the input signal component 1760 may be configured as or otherwise support a means for generating an input signal based on FDM-ing the one or more downlink messages with the downlink message. In some examples, the LPF component 1765 may be configured as or otherwise support a means for filtering the input signal using a LPF. In some examples, the envelope response generation component 1770 may be configured as or otherwise support a means for generating a filtered envelope response based on performing an envelope extraction procedure on the filtered input signal. In some examples, the power amplification component 1775 may be configured as or otherwise support a means for performing a power amplification procedure on an instantaneous signal envelope of the input signal or on a combination of the filtered envelope response and a backoff parameter, where transmitting the one or more downlink messages and the downlink message is based on performing the power amplification procedure.

In some examples, to support transmitting the control signaling, the control signaling transmission component 1740 may be configured as or otherwise support a means for transmitting the control signaling indicating the envelope tracking configuration that identifies a backoff parameter corresponding to an MCS used for transmission of the one or more downlink messages or the downlink message, a weighted average backoff parameter corresponding to a bandwidth used for transmission of the one or more downlink messages or the downlink message, a backoff parameter that is specific to an MCS of the UE, or a combination thereof.

Figure 18:
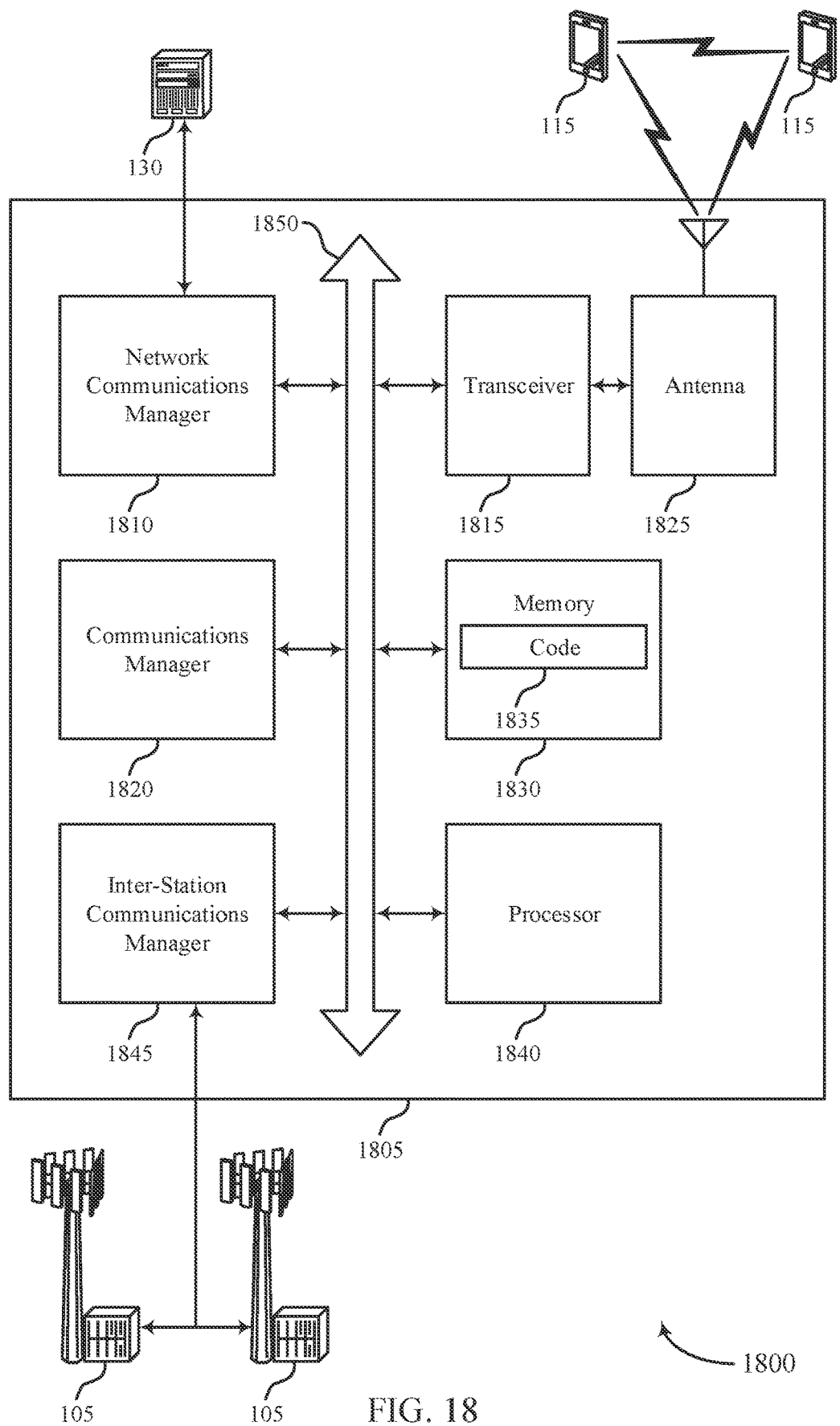
FIG. 18 shows a diagram of a system including a device that supports techniques for bandwidth-limited envelope tracking using DPoD in accordance with aspects of the present disclosure.

FIG. 18 shows a diagram of a system 1800 including a device 1805 that supports techniques for bandwidth-limited envelope tracking using DPoD in accordance with aspects of the present disclosure. The device 1805 may be an example of or include the components of a device 1505, a device 1605, or a base station 105 as described herein. The device 1805 may communicate wirelessly with one or more base stations 105, UEs 115, or any combination thereof. The device 1805 may include components for bi-directional voice and data communications including components for transmitting and receiving communications, such as a communications manager 1820, a network communications manager 1810, a transceiver 1815, an antenna 1825, a memory 1830, code 1835, a processor 1840, and an inter-station communications manager 1845. These components may be in electronic communication or otherwise coupled (e.g., operatively, communicatively, functionally, electronically, electrically) via one or more buses (e.g., a bus 1850).

The network communications manager 1810 may manage communications with a core network 130 (e.g., via one or more wired backhaul links). For example, the network communications manager 1810 may manage the transfer of data communications for client devices, such as one or more UEs 115.

In some cases, the device 1805 may include a single antenna 1825. However, in some other cases the device 1805 may have more than one antenna 1825, which may be capable of concurrently transmitting or receiving multiple wireless transmissions. The transceiver 1815 may communicate bi-directionally, via the one or more antennas 1825, wired, or wireless links as described herein. For example, the transceiver 1815 may represent a wireless transceiver and may communicate bi-directionally with another wireless transceiver. The transceiver 1815 may also include a modem to modulate the packets, to provide the modulated packets to one or more antennas 1825 for transmission, and to demodulate packets received from the one or more antennas 1825. The transceiver 1815, or the transceiver 1815 and one or more antennas 1825, may be an example of a transmitter 1515, a transmitter 1615, a receiver 1510, a receiver 1610, or any combination thereof or component thereof, as described herein.

The memory 1830 may include RAM and ROM. The memory 1830 may store computer-readable, computer-executable code 1835 including instructions that, when executed by the processor 1840, cause the device 1805 to perform various functions described herein. The code 1835 may be stored in a non-transitory computer-readable medium such as system memory or another type of memory. In some cases, the code 1835 may not be directly executable by the processor 1840 but may cause a computer (e.g., when compiled and executed) to perform functions described herein. In some cases, the memory 1830 may contain, among other things, a BIOS which may control basic hardware or software operation such as the interaction with peripheral components or devices.

The processor 1840 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1840 may be configured to operate a memory array using a memory controller. In some other cases, a memory controller may be integrated into the processor 1840. The processor 1840 may be configured to execute computer-readable instructions stored in a memory (e.g., the memory 1830) to cause the device 1805 to perform various functions (e.g., functions or tasks supporting techniques for bandwidth-limited envelope tracking using DPoD). For example, the device 1805 or a component of the device 1805 may include a processor 1840 and memory 1830 coupled to the processor 1840, the processor 1840 and memory 1830 configured to perform various functions described herein.

The inter-station communications manager 1845 may manage communications with other base stations 105, and may include a controller or scheduler for controlling communications with UEs 115 in cooperation with other base stations 105. For example, the inter-station communications manager 1845 may coordinate scheduling for transmissions to UEs 115 for various interference mitigation techniques such as beamforming or joint transmission. In some examples, the inter-station communications manager 1845 may provide an X2 interface within an LTE/LTE-A wireless communications network technology to provide communication between base stations 105.

The communications manager 1820 may support wireless communications at the device 1805 in accordance with examples as disclosed herein. For example, the communications manager 1820 may be configured as or otherwise support a means for receiving, from a UE (e.g., a UE 115), a capability message indicating a capability of the UE to perform envelope tracking, and further indicating an envelope tracking configuration to be used for transmission of an uplink message. The communications manager 1820 may be configured as or otherwise support a means for transmitting, to the UE and based on the capability message, a request for the UE to activate the envelope tracking. The communications manager 1820 may be configured as or otherwise support a means for receiving, from the UE and based on the request, the uplink message in accordance with the envelope tracking configuration.

Additionally or alternatively, the communications manager 1820 may support wireless communications at the device 1805 in accordance with other examples as disclosed herein. For example, the communications manager 1820 may be configured as or otherwise support a means for receiving, from a UE (e.g., a UE 115), a capability message indicating a capability of the UE to compensate for envelope tracking distortion. The communications manager 1820 may be configured as or otherwise support a means for transmitting, to the UE and based on the capability message, control signaling indicating an envelope tracking configuration to be used for transmission of a downlink message, the envelope tracking configuration indicating multiplexing information associated with one or more other UEs. The communications manager 1820 may be configured as or otherwise support a means for transmitting the downlink message to the UE in accordance with the envelope tracking configuration.

By including or configuring the communications manager 1820 in accordance with examples as described herein, the device 1805 may support techniques for improved communication reliability based on using DPoD to compensate for bandwidth-limited envelope tracking distortions in wideband signal transmissions. Using DPoD to compensate for distortions caused by bandwidth-limited envelope tracking may increase the likelihood of the device 1805 successfully receiving and decoding wideband signal transmissions, among other benefits.

In some examples, the communications manager 1820 may be configured to perform various operations (e.g., receiving, monitoring, transmitting) using or otherwise in cooperation with the transceiver 1815, the one or more antennas 1825, or any combination thereof. Although the communications manager 1820 is illustrated as a separate component, in some examples, one or more functions described with reference to the communications manager 1820 may be supported by or performed by the processor 1840, the memory 1830, the code 1835, or any combination thereof. For example, the code 1835 may include instructions executable by the processor 1840 to cause the device 1805 to perform various aspects of techniques for bandwidth-limited envelope tracking using DPoD as described herein, or the processor 1840 and the memory 1830 may be otherwise configured to perform or support such operations.

Figure 19:
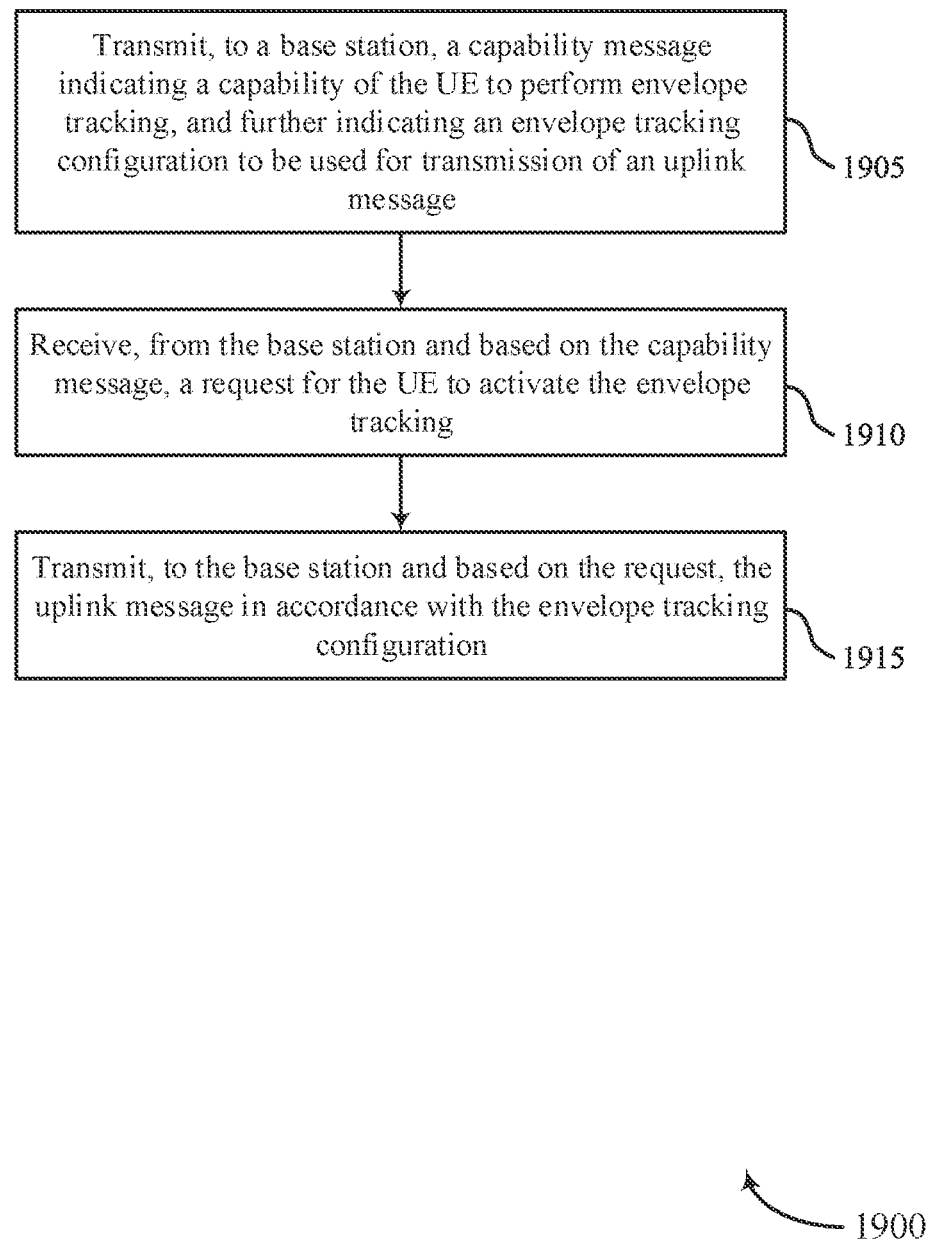
FIGS. 19 through 22 show flowcharts illustrating methods that support techniques for bandwidth-limited envelope tracking using DPoD in accordance with aspects of the present disclosure.

FIG. 19 shows a flowchart illustrating a method 1900 that supports techniques for bandwidth-limited envelope tracking using DPoD in accordance with aspects of the present disclosure. The operations of the method 1900 may be implemented by a UE or its components as described herein. For example, the operations of the method 1900 may be performed by a UE 115 as described with reference to FIGS. 1 through 14. In some examples, a UE may execute a set of instructions to control the functional elements of the UE to perform the described functions. Additionally or alternatively, the UE may perform aspects of the described functions using special-purpose hardware.

At 1905, the method may include transmitting, to a base station, a capability message indicating a capability of the UE to perform envelope tracking, and further indicating an envelope tracking configuration to be used for transmission of an uplink message. The operations of 1905 may be performed in accordance with examples as disclosed herein. In some examples, aspects of the operations of 1905 may be performed by a capability message transmitting component 1325 as described with reference to FIG. 13.

At 1910, the method may include receiving, from the base station and based on the capability message, a request for the UE to activate the envelope tracking. The operations of 1910 may be performed in accordance with examples as disclosed herein. In some examples, aspects of the operations of 1910 may be performed by a request receiving component 1330 as described with reference to FIG. 13.

At 1915, the method may include transmitting, to the base station and based on the request, the uplink message in accordance with the envelope tracking configuration. The operations of 1915 may be performed in accordance with examples as disclosed herein. In some examples, aspects of the operations of 1915 may be performed by an uplink message transmitting component 1335 as described with reference to FIG. 13.

Figure 20:
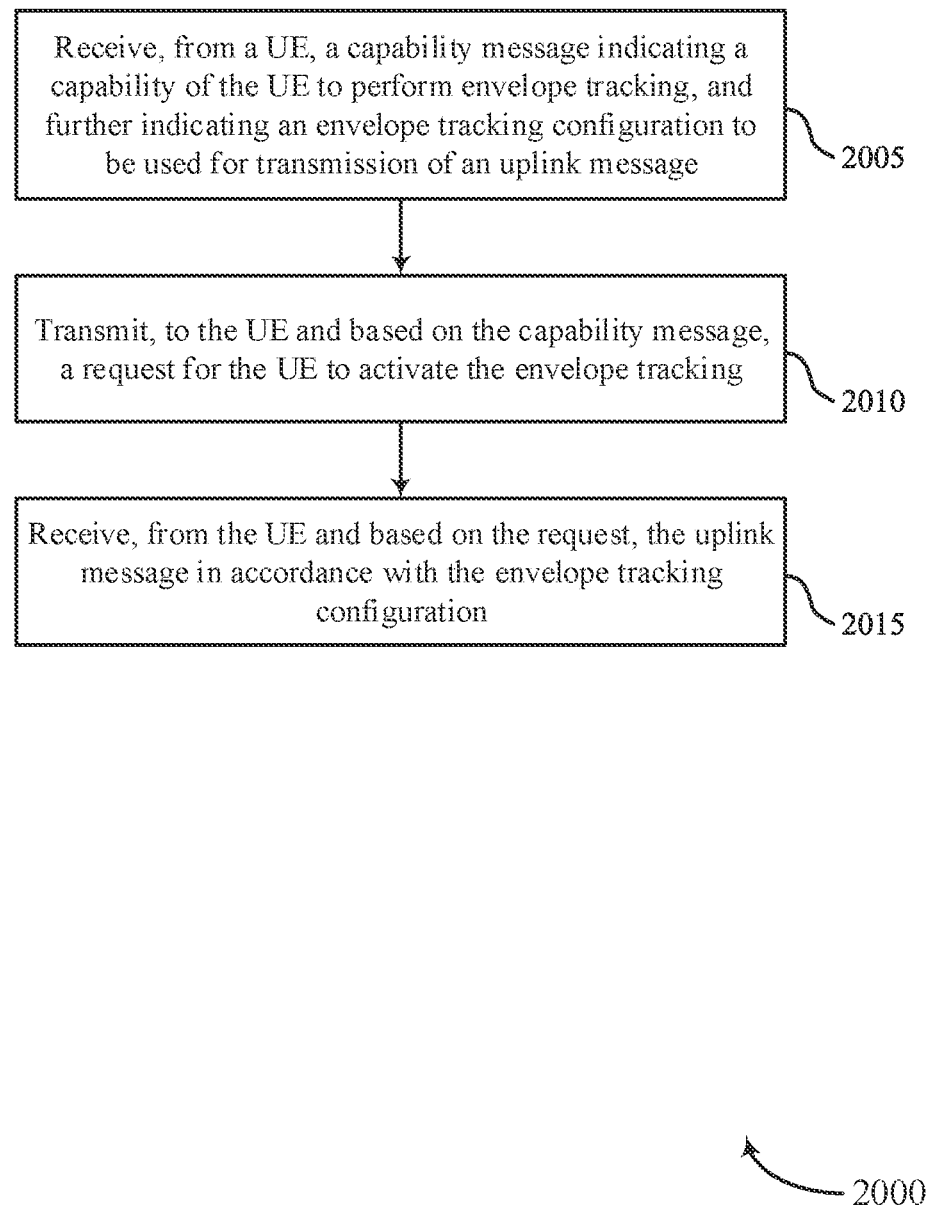

FIG. 20 shows a flowchart illustrating a method 2000 that supports techniques for bandwidth-limited envelope tracking using DPoD in accordance with aspects of the present disclosure. The operations of the method 2000 may be implemented by a base station or its components as described herein. For example, the operations of the method 2000 may be performed by a base station 105 as described with reference to FIGS. 1 through 10 and 15 through 18. In some examples, a base station may execute a set of instructions to control the functional elements of the base station to perform the described functions. Additionally or alternatively, the base station may perform aspects of the described functions using special-purpose hardware.

At 2005, the method may include receiving, from a UE, a capability message indicating a capability of the UE to perform envelope tracking, and further indicating an envelope tracking configuration to be used for transmission of an uplink message. The operations of 2005 may be performed in accordance with examples as disclosed herein. In some examples, aspects of the operations of 2005 may be performed by a capability message reception component 1725 as described with reference to FIG. 17.

At 2010, the method may include transmitting, to the UE and based on the capability message, a request for the UE to activate the envelope tracking. The operations of 2010 may be performed in accordance with examples as disclosed herein. In some examples, aspects of the operations of 2010 may be performed by a request transmission component 1730 as described with reference to FIG. 17.

At 2015, the method may include receiving, from the UE and based on the request, the uplink message in accordance with the envelope tracking configuration. The operations of 2015 may be performed in accordance with examples as disclosed herein. In some examples, aspects of the operations of 2015 may be performed by an uplink message reception component 1735 as described with reference to FIG. 17.

Figure 21:
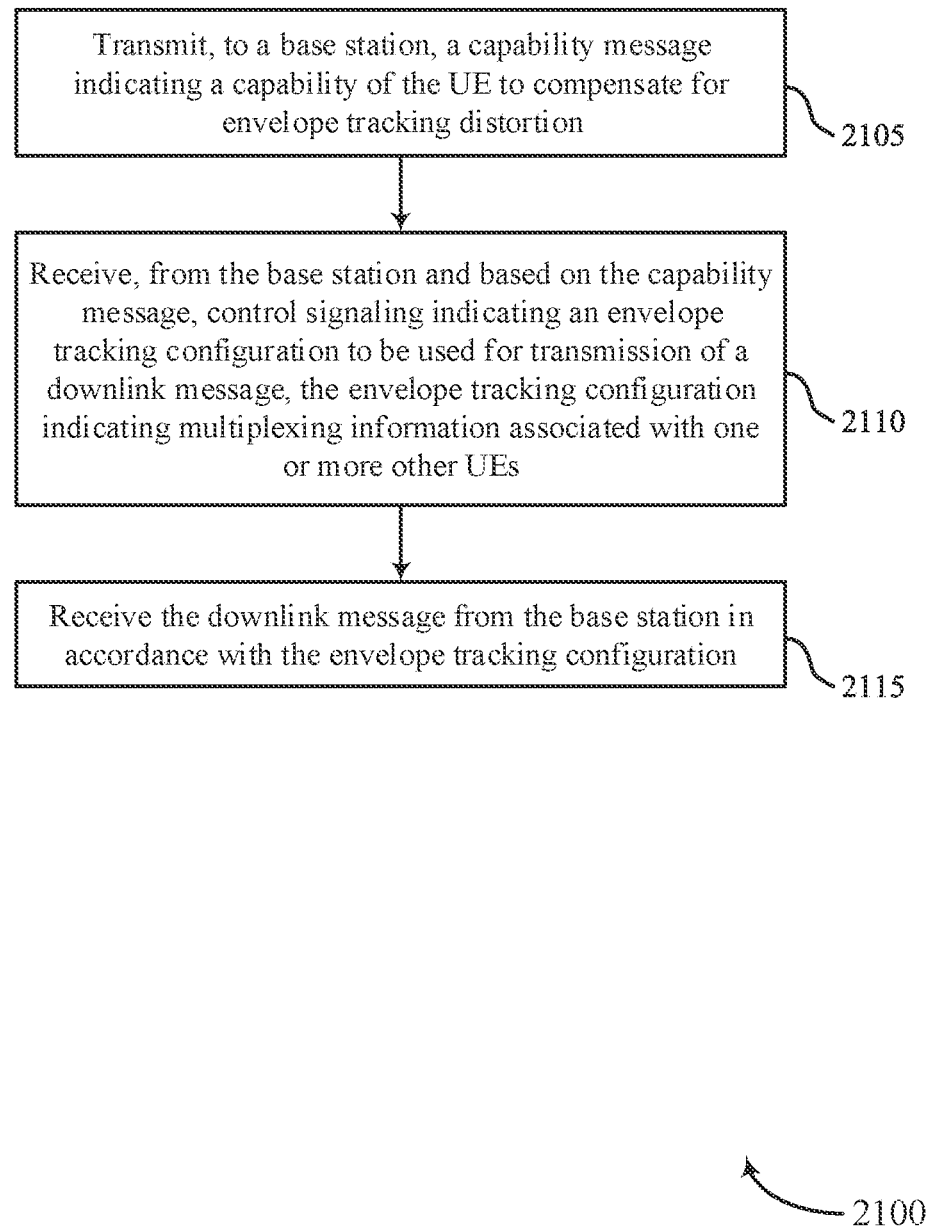

FIG. 21 shows a flowchart illustrating a method 2100 that supports techniques for bandwidth-limited envelope tracking using DPoD in accordance with aspects of the present disclosure. The operations of the method 2100 may be implemented by a UE or its components as described herein. For example, the operations of the method 2100 may be performed by a UE 115 as described with reference to FIGS. 1 through 14. In some examples, a UE may execute a set of instructions to control the functional elements of the UE to perform the described functions. Additionally or alternatively, the UE may perform aspects of the described functions using special-purpose hardware.

At 2105, the method may include transmitting, to a base station, a capability message indicating a capability of the UE to compensate for envelope tracking distortion. The operations of 2105 may be performed in accordance with examples as disclosed herein. In some examples, aspects of the operations of 2105 may be performed by a capability message transmitting component 1325 as described with reference to FIG. 13.

At 2110, the method may include receiving, from the base station and based on the capability message, control signaling indicating an envelope tracking configuration to be used for transmission of a downlink message, the envelope tracking configuration indicating multiplexing information associated with one or more other UEs. The operations of 2110 may be performed in accordance with examples as disclosed herein. In some examples, aspects of the operations of 2110 may be performed by a control signaling receiving component 1340 as described with reference to FIG. 13.

At 2115, the method may include receiving the downlink message from the base station in accordance with the envelope tracking configuration. The operations of 2115 may be performed in accordance with examples as disclosed herein. In some examples, aspects of the operations of 2115 may be performed by a downlink message receiving component 1345 as described with reference to FIG. 13.

Figure 22:
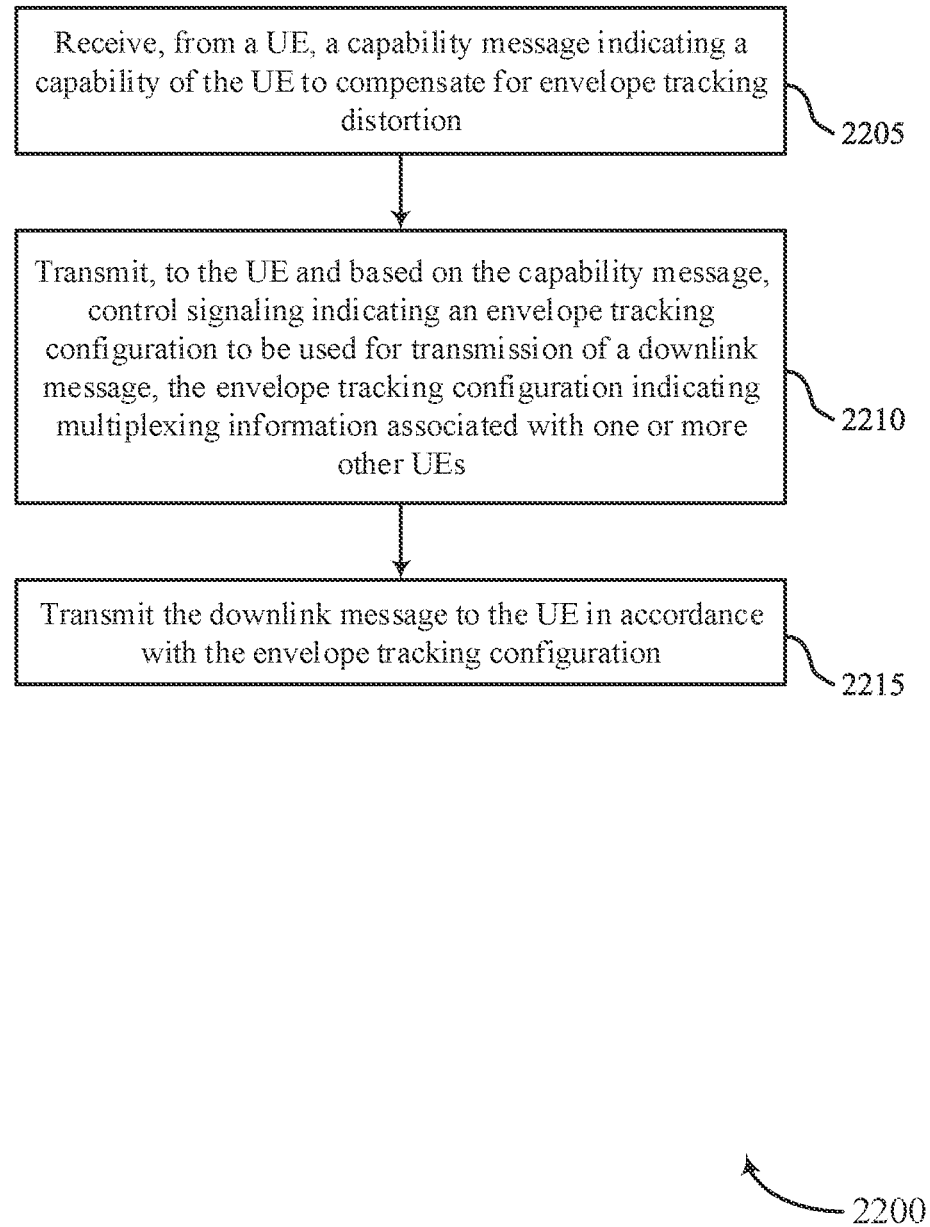

FIG. 22 shows a flowchart illustrating a method 2200 that supports techniques for bandwidth-limited envelope tracking using DPoD in accordance with aspects of the present disclosure. The operations of the method 2200 may be implemented by a base station or its components as described herein. For example, the operations of the method 2200 may be performed by a base station 105 as described with reference to FIGS. 1 through 10 and 15 through 18. In some examples, a base station may execute a set of instructions to control the functional elements of the base station to perform the described functions. Additionally or alternatively, the base station may perform aspects of the described functions using special-purpose hardware.

At 2205, the method may include receiving, from a UE, a capability message indicating a capability of the UE to compensate for envelope tracking distortion. The operations of 2205 may be performed in accordance with examples as disclosed herein. In some examples, aspects of the operations of 2205 may be performed by a capability message reception component 1725 as described with reference to FIG. 17.

At 2210, the method may include transmitting, to the UE and based on the capability message, control signaling indicating an envelope tracking configuration to be used for transmission of a downlink message, the envelope tracking configuration indicating multiplexing information associated with one or more other UEs. The operations of 2210 may be performed in accordance with examples as disclosed herein. In some examples, aspects of the operations of 2210 may be performed by a control signaling transmission component 1740 as described with reference to FIG. 17.

At 2215, the method may include transmitting the downlink message to the UE in accordance with the envelope tracking configuration. The operations of 2215 may be performed in accordance with examples as disclosed herein. In some examples, aspects of the operations of 2215 may be performed by a downlink message transmission component 1745 as described with reference to FIG. 17.

The following provides an overview of aspects of the present disclosure:

Aspect 1: A method for wireless communications at a UE, comprising: transmitting, to a base station, a capability message indicating a capability of the UE to perform envelope tracking, and further indicating an envelope tracking configuration to be used for transmission of an uplink message; receiving, from the base station and based at least in part on the capability message, a request for the UE to activate the envelope tracking; and transmitting, to the base station and based at least in part on the request, the uplink message in accordance with the envelope tracking configuration.

Aspect 2: The method of aspect 1, wherein transmitting the capability message comprises: transmitting the capability message indicating the capability of the UE to perform the envelope tracking that is bandwidth-limited envelope tracking, and further indicating a capability of the UE to use an extended bandwidth that is larger than a bandwidth supported for the bandwidth-limited envelope tracking.

Aspect 3: The method of any of aspects 1 through 2, wherein transmitting the capability message comprises: transmitting the capability message indicating the envelope tracking configuration that identifies a low pass filter response, a backoff parameter, a power amplifier response, or a combination thereof.

Aspect 4: The method of any of aspects 1 through 3, further comprising: transmitting the capability message indicating the envelope tracking configuration that identifies a set of low pass filter responses, wherein the set of low pass filter responses is preconfigured or associated with a plurality of bandwidths to be used for the envelope tracking; and receiving the request indicating a low pass filter response from the set of low pass filter responses to use for generation of the uplink message.

Aspect 5: The method of any of aspects 1 through 4, further comprising: receiving, from the base station, control signaling indicating an uplink resource allocation to be used for transmission of the uplink message, a modulation and coding scheme to be used for transmission of the uplink message, or both, wherein transmitting the uplink message to the base station is based at least in part on the control signaling.

Aspect 6: The method of any of aspects 1 through 5, further comprising: receiving control signaling indicating a backoff parameter per modulation and coding scheme; and transmitting, based at least in part on the control signaling, the uplink message in accordance with the backoff parameter per modulation and coding scheme.

Aspect 7: The method of any of aspects 1 through 6, wherein transmitting the capability message comprises: transmitting the capability message indicating the envelope tracking configuration that identifies a power amplifier response as a function of a low pass filter response and a backoff parameter.

Aspect 8: The method of any of aspects 1 through 7, further comprising: transmitting one or more reference signals to the base station in a same bandwidth as used for transmission of the uplink message.

Aspect 9: The method of any of aspects 1 through 8, further comprising: generating an input signal associated with the uplink message; filtering the input signal using a low pass filter; generating a filtered envelope response based at least in part on performing an envelope extraction procedure on the filtered input signal; and performing a power amplification procedure on a signal envelope of the input signal or on a combination of the filtered envelope response and a backoff parameter, wherein transmitting the uplink message is based at least in part on performing the power amplification procedure.

Aspect 10; A method for wireless communications at a base station, comprising: receiving, from a UE, a capability message indicating a capability of the UE to perform envelope tracking, and further indicating an envelope tracking configuration to be used for transmission of an uplink message; transmitting, to the UE and based at least in part on the capability message, a request for the UE to activate the envelope tracking; and receiving, from the UE and based at least in part on the request, the uplink message in accordance with the envelope tracking configuration.

Aspect 11: The method of aspect 10, further comprising: decoding the uplink message using a distortion correcting algorithm that is configured based at least in part on the envelope tracking configuration.

Aspect 12: The method of any of aspects 10 through 11, further comprising: receiving one or more reference signals from the UE; generating a power amplifier model based at least in part on the one or more reference signals; and decoding the uplink message using the power amplifier model.

Aspect 13: The method of aspect 12, further comprising: receiving an input signal that comprises the uplink message; performing one or more of a fast Fourier transform, a cyclic prefix removal procedure, a slicing procedure, an inverse fast Fourier transform, or a cyclic prefix addition procedure on the input signal; and generating a first distortion parameter and a second distortion parameter based at least in part on inputting the input signal to the power amplifier model, wherein decoding the uplink message is based at least in part on the first distortion parameter and the second distortion parameter.

Aspect 14: A method for wireless communications at a UE, comprising: transmitting, to a base station, a capability message indicating a capability of the UE to compensate for envelope tracking distortion; receiving, from the base station and based at least in part on the capability message, control signaling indicating an envelope tracking configuration to be used for transmission of a downlink message, the envelope tracking configuration indicating multiplexing information associated with one or more other UEs; and receiving the downlink message from the base station in accordance with the envelope tracking configuration.

Aspect 15: The method of aspect 14, further comprising: receiving, from the base station and based at least in part on the capability message, a request for the UE to compensate for bandwidth-limited envelope tracking distortion.

Aspect 16: The method of any of aspects 14 through 15, wherein receiving the control signaling comprises: receiving, from the base station, the control signaling indicating a downlink resource allocation to be used for transmission of the downlink message, a modulation and coding scheme to be used for transmission of the downlink message, a bandwidth to be used for transmission of the downlink message, or a combination thereof, wherein receiving the downlink message from the base station is based at least in part on the control signaling.

Aspect 17: The method of any of aspects 14 through 16, wherein receiving the control signaling comprises: receiving, from the base station, the control signaling indicating the envelope tracking configuration that identifies compensation to be applied for bandwidth-limited envelope tracking distortion for one or more modulation and coding schemes, for one or more bandwidths, for one or more resource allocations, or any combination thereof.

Aspect 18: The method of any of aspects 14 through 17, further comprising: decoding the downlink message using a distortion correcting algorithm that is configured based at least in part on the envelope tracking configuration.

Aspect 19: The method of any of aspects 14 through 18, further comprising: transmitting the capability message indicating the capability of the UE to compensate for the envelope tracking distortion using bandwidth-limited envelope tracking distortion resulting from transmission of the downlink message over an extended bandwidth, the capability message further indicating a set of backoff parameters; and receiving, from the base station, the control signaling indicating a first request for the UE to compensate for the bandwidth-limited envelope tracking distortion resulting from transmission of the downlink message over the extended bandwidth, and a second request for the UE to compensate for the bandwidth-limited envelope tracking distortion using a backoff parameter from the set of backoff parameters; and decoding the downlink message received over the extended bandwidth in accordance with the control signaling.

Aspect 20: The method of any of aspects 14 through 19, further comprising: transmitting the capability message indicating a set of low pass filter responses, wherein the set of low pass filter responses is preconfigured or associated with a plurality of bandwidths to be used for transmission of the downlink message; and receiving, from the base station, the control signaling indicating a low pass filter response from the set of low pass filter responses being used for generation of the downlink message.

Aspect 21: The method of any of aspects 14 through 20, wherein receiving the control signaling comprises: receiving the control signaling indicating the envelope tracking configuration that identifies a power amplifier response as a function of a low pass filter response and a backoff parameter.

Aspect 22: The method of any of aspects 14 through 21, further comprising: receiving one or more reference signals from the base station; generating a power amplifier model based at least in part on the one or more reference signals; and decoding the downlink message using the power amplifier model.

Aspect 23: The method of aspect 22, further comprising: receiving an input signal that comprises the downlink message; performing one or more of a fast Fourier transform, a cyclic prefix removal procedure, a slicing procedure for each UE of the one or more other UEs, an inverse fast Fourier transform, or a cyclic prefix addition procedure on the input signal; and generating a first distortion parameter and a second distortion parameter based at least in part on inputting the input signal to the power amplifier model, wherein decoding the downlink message is based at least in part on the first distortion parameter and the second distortion parameter.

Aspect 24: The method of any of aspects 14 through 23, further comprising: transmitting, to the base station and based at least in part on the capability of the UE to compensate for the envelope tracking distortion, a request that indicates a backoff parameter being used for transmission of the downlink message, a backoff parameter per modulation and coding scheme, or both, wherein receiving the downlink message is based at least in part on the request.

Aspect 25: A method for wireless communications at a base station, comprising: receiving, from a UE, a capability message indicating a capability of the UE to compensate for envelope tracking distortion; transmitting, to the UE and based at least in part on the capability message, control signaling indicating an envelope tracking configuration to be used for transmission of a downlink message, the envelope tracking configuration indicating multiplexing information associated with one or more other UEs; and transmitting the downlink message to the UE in accordance with the envelope tracking configuration.

Aspect 26: The method of aspect 25, wherein transmitting the control signaling comprises: transmitting the control signaling indicating the envelope tracking configuration that identifies frequency division multiplexing information associated with the one or more other UEs, a backoff parameter, a low pass filter response, a power amplifier response, or a combination thereof.

Aspect 27: The method of aspect 26, wherein the frequency division multiplexing information indicates a frequency allocation for each UE of the one or more other UEs, a modulation and coding scheme for each UE of the one or more other UEs, reference signal information for each UE of the one or more other UEs, or a combination thereof.

Aspect 28: The method of aspect 27, further comprising: transmitting one or more downlink messages to the one or more other UEs in accordance with the frequency division multiplexing information, wherein the one or more downlink messages are frequency division multiplexed with the downlink message.

Aspect 29: The method of aspect 28, further comprising: generating an input signal based at least in part on frequency division multiplexing the with the downlink message; filtering the input signal using a low pass filter; generating a filtered envelope response based at least in part on performing an envelope extraction procedure on the filtered input signal; performing a power amplification procedure on an instantaneous signal envelope of the input signal or on a combination of the filtered envelope response and a backoff parameter, wherein transmitting the one or more downlink messages and the downlink message is based at least in part on performing the power amplification procedure.

Aspect 30: The method of any of aspects 28 through 29, wherein transmitting the control signaling comprises: transmitting the control signaling indicating the envelope tracking configuration that identifies a backoff parameter corresponding to a modulation and coding scheme used for transmission of the one or more downlink messages or the downlink message, a weighted average backoff parameter corresponding to a bandwidth used for transmission of the one or more downlink messages or the downlink message, a backoff parameter that is specific to a modulation and coding scheme of the UE, or a combination thereof.

Aspect 31: An apparatus for wireless communications at a UE, comprising a processor; memory coupled with the processor; and instructions stored in the memory and executable by the processor to cause the apparatus to perform a method of any of aspects 1 through 9.

Aspect 32: An apparatus for wireless communications at a UE, comprising means for performing a method of any of aspects 1 through 9.

Aspect 33: A non-transitory computer-readable medium storing code for wireless communications at a UE, the code comprising instructions executable by a processor to perform a method of any of aspects 1 through 9.

Aspect 34: An apparatus for wireless communications at a base station, comprising a processor; memory coupled with the processor; and instructions stored in the memory and executable by the processor to cause the apparatus to perform a method of any of aspects 10 through 13.

Aspect 35: An apparatus for wireless communications at a base station, comprising means for performing a method of any of aspects 10 through 13.

Aspect 36: A non-transitory computer-readable medium storing code for wireless communications at a base station, the code comprising instructions executable by a processor to perform a method of any of aspects 10 through 13.

Aspect 37: An apparatus for wireless communications at a UE, comprising a processor; memory coupled with the processor; and instructions stored in the memory and executable by the processor to cause the apparatus to perform a method of any of aspects 14 through 24.

Aspect 38: An apparatus for wireless communications at a UE, comprising means for performing a method of any of aspects 14 through 24.

Aspect 39: A non-transitory computer-readable medium storing code for wireless communications at a UE, the code comprising instructions executable by a processor to perform a method of any of aspects 14 through 24.

Aspect 40: An apparatus for wireless communications at a base station, comprising a processor; memory coupled with the processor; and instructions stored in the memory and executable by the processor to cause the apparatus to perform a method of any of aspects 25 through 30.

Aspect 41: An apparatus for wireless communications at a base station, comprising means for performing a method of any of aspects 25 through 30.

Aspect 42: A non-transitory computer-readable medium storing code for wireless communications at a base station, the code comprising instructions executable by a processor to perform a method of any of aspects 25 through 30.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM. ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, 'determining' can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communications at a user equipment (UE), comprising:
    transmitting, to a base station, a capability message indicating a capability of the UE to perform envelope tracking using digital post distortion (DPoD), and further indicating an envelope tracking configuration to be used for transmission of an uplink message;
    receiving, from the base station and based at least in part on the capability message, a request for the UE to activate the envelope tracking; and
    transmitting, to the base station and based at least in part on the request, the uplink message in accordance with the envelope tracking configuration.

2. The method of claim 1, wherein transmitting the capability message comprises:
    transmitting the capability message indicating the capability of the UE to perform the envelope tracking that is bandwidth-limited envelope tracking, and further indicating a capability of the UE to use an extended bandwidth that is larger than a bandwidth supported for the bandwidth-limited envelope tracking.

3. The method of claim 1, wherein transmitting the capability message comprises:
    transmitting the capability message indicating the envelope tracking configuration that identifies a low pass filter response, a backoff parameter, a power amplifier response, or a combination thereof.

4. The method of claim 1, further comprising:
    transmitting the capability message indicating the envelope tracking configuration that identifies a set of low pass filter responses, wherein the set of low pass filter responses is preconfigured or associated with a plurality of bandwidths to be used for the envelope tracking; and receiving the request indicating a low pass filter response from the set of low pass filter responses to use for generation of the uplink message.

5. The method of claim 1, further comprising:
receiving, from the base station, control signaling indicating an uplink resource allocation to be used for transmission of the uplink message, a modulation and coding scheme to be used for transmission of the uplink message, or both, wherein transmitting the uplink message to the base station is based at least in part on the control signaling.

6. The method of claim 1, further comprising:
receiving control signaling indicating a backoff parameter per modulation and coding scheme; and
transmitting, based at least in part on the control signaling, the uplink message in accordance with the backoff parameter per modulation and coding scheme.

7. The method of claim 1, wherein transmitting the capability message comprises:
transmitting the capability message indicating the envelope tracking configuration that identifies a power amplifier response as a function of a low pass filter response and a backoff parameter.

8. The method of claim 1, further comprising:
transmitting one or more reference signals to the base station in a same bandwidth as used for transmission of the uplink message.

9. The method of claim 1, further comprising:
generating an input signal associated with the uplink message;
filtering the input signal using a low pass filter;
generating a filtered envelope response based at least in part on performing an envelope extraction procedure on the filtered input signal; and
performing a power amplification procedure on a signal envelope of the input signal or on a combination of the filtered envelope response and a backoff parameter, wherein transmitting the uplink message is based at least in part on performing the power amplification procedure.

10. A method for wireless communications at a base station, comprising:
receiving, from a user equipment (UE), a capability message indicating a capability of the UE to perform envelope tracking using digital post distortion (DPod), and further indicating an envelope tracking configuration to be used for transmission of an uplink message;
transmitting, to the UE and based at least in part on the capability message, a request for the UE to activate the envelope tracking; and
receiving, from the UE and based at least in part on the request, the uplink message in accordance with the envelope tracking configuration.

11. The method of claim 10, further comprising:
decoding the uplink message using a distortion correcting algorithm that is configured based at least in part on the envelope tracking configuration.

12. The method of claim 10, further comprising:
receiving one or more reference signals from the UE;
generating a power amplifier model based at least in part on the one or more reference signals; and
decoding the uplink message using the power amplifier model.

13. The method of claim 12, further comprising:
receiving an input signal that comprises the uplink message;

performing one or more of a fast Fourier transform, a cyclic prefix removal procedure, a slicing procedure, an inverse fast Fourier transform, or a cyclic prefix addition procedure on the input signal; and
generating a first distortion parameter and a second distortion parameter based at least in part on inputting the input signal to the power amplifier model, wherein decoding the uplink message is based at least in part on the first distortion parameter and the second distortion parameter.

14. A method for wireless communications at a user equipment (UE), comprising:
transmitting, to a base station, a capability message indicating a capability of the UE to compensate for envelope tracking distortion using digital post distortion (DPOD);
receiving, from the base station and based at least in part on the capability message, control signaling indicating an envelope tracking configuration to be used for transmission of a downlink message, the envelope tracking configuration indicating multiplexing information associated with one or more other UEs; and
receiving the downlink message from the base station in accordance with the envelope tracking configuration.

15. The method of claim 14, further comprising:
receiving, from the base station and based at least in part on the capability message, a request for the UE to compensate for bandwidth-limited envelope tracking distortion.

16. The method of claim 14, wherein receiving the control signaling comprises:
receiving, from the base station, the control signaling indicating a downlink resource allocation to be used for transmission of the downlink message, a modulation and coding scheme to be used for transmission of the downlink message, a bandwidth to be used for transmission of the downlink message, or a combination thereof, wherein receiving the downlink message from the base station is based at least in part on the control signaling.

17. The method of claim 14, wherein receiving the control signaling comprises:
receiving, from the base station, the control signaling indicating the envelope tracking configuration that identifies compensation to be applied for bandwidth-limited envelope tracking distortion for one or more modulation and coding schemes, for one or more bandwidths, for one or more resource allocations, or any combination thereof.

18. The method of claim 14, further comprising:
decoding the downlink message using a distortion correcting algorithm that is configured based at least in part on the envelope tracking configuration.

19. The method of claim 14, further comprising:
transmitting the capability message indicating the capability of the UE to compensate for the envelope tracking distortion using bandwidth-limited envelope tracking distortion resulting from transmission of the downlink message over an extended bandwidth, the capability message further indicating a set of backoff parameters; and
receiving, from the base station, the control signaling indicating a first request for the UE to compensate for the bandwidth-limited envelope tracking distortion resulting from transmission of the downlink message over the extended bandwidth, and a second request for the UE to compensate for the bandwidth-limited envelope tracking distortion using a backoff parameter from the set of backoff parameters; and decoding the downlink message received over the extended bandwidth in accordance with the control signaling.

20. The method of claim 14, further comprising:

transmitting the capability message indicating a set of low pass filter responses, wherein the set of low pass filter responses is preconfigured or associated with a plurality of bandwidths to be used for transmission of the downlink message; and receiving, from the base station, the control signaling indicating a low pass filter response from the set of low pass filter responses being used for generation of the downlink message.

21. The method of claim 14, wherein receiving the control signaling comprises:

receiving the control signaling indicating the envelope tracking configuration that identifies a power amplifier response as a function of a low pass filter response and a backoff parameter.

22. The method of claim 14, further comprising:

receiving one or more reference signals from the base station;

generating a power amplifier model based at least in part on the one or more reference signals; and decoding the downlink message using the power amplifier model.

23. The method of claim 22, further comprising:

receiving an input signal that comprises the downlink message;

performing one or more of a fast Fourier transform, a cyclic prefix removal procedure, a slicing procedure for each UE of the one or more other UEs, an inverse fast Fourier transform, or a cyclic prefix addition procedure on the input signal; and generating a first distortion parameter and a second distortion parameter based at least in part on inputting the input signal to the power amplifier model, wherein decoding the downlink message is based at least in part on the first distortion parameter and the second distortion parameter.

24. The method of claim 14, further comprising:

transmitting, to the base station and based at least in part on the capability of the UE to compensate for the envelope tracking distortion, a request that indicates a backoff parameter being used for transmission of the downlink message, a backoff parameter per modulation and coding scheme, or both, wherein receiving the downlink message is based at least in part on the request.

25. A method for wireless communications at a base station, comprising:

receiving, from a user equipment (UE), a capability message indicating a capability of the UE to compensate for envelope tracking distortion using digital post distortion (DPOD);

transmitting, to the UE and based at least in part on the capability message, control signaling indicating an envelope tracking configuration to be used for transmission of a downlink message, the envelope tracking configuration indicating multiplexing information associated with one or more other UEs; and transmitting the downlink message to the UE in accordance with the envelope tracking configuration.

26. The method of claim 25, wherein transmitting the control signaling comprises:

transmitting the control signaling indicating the envelope tracking configuration that identifies frequency division multiplexing information associated with the one or more other UEs, a backoff parameter, a low pass filter response, a power amplifier response, or a combination thereof.

27. The method of claim 26, wherein the frequency division multiplexing information indicates a frequency allocation for each UE of the one or more other UEs, a modulation and coding scheme for each UE of the one or more other UEs, reference signal information for each UE of the one or more other UEs, or a combination thereof.

28. The method of claim 27, further comprising:

transmitting one or more downlink messages to the one or more other UEs in accordance with the frequency division multiplexing information, wherein the one or more downlink messages are frequency division multiplexed with the downlink message.

29. The method of claim 28, further comprising:

generating an input signal based at least in part on frequency division multiplexing the one or more downlink messages with the downlink message;

filtering the input signal using a low pass filter;

generating a filtered envelope response based at least in part on performing an envelope extraction procedure on the filtered input signal;

performing a power amplification procedure on an instantaneous signal envelope of the input signal or on a combination of the filtered envelope response and a backoff parameter, wherein transmitting the one or more downlink messages and the downlink message is based at least in part on performing the power amplification procedure.

30. The method of claim 28, wherein transmitting the control signaling comprises:

transmitting the control signaling indicating the envelope tracking configuration that identifies a backoff parameter corresponding to a modulation and coding scheme used for transmission of the one or more downlink messages or the downlink message, a weighted average backoff parameter corresponding to a bandwidth used for transmission of the one or more downlink messages or the downlink message, a backoff parameter that is specific to a modulation and coding scheme of the UE, or a combination thereof.

* * * * *